(12) United States Patent
McManus et al.

(10) Patent No.: US 10,494,534 B2
(45) Date of Patent: Dec. 3, 2019

(54) INK FORMULATION

(71) Applicant: The University of Manchester, Manchester (GB)

(72) Inventors: Daryl McManus, Manchester (GB); Cinzia Casiraghi, Manchester (GB); Ania Jolly, Manchester (GB)

(73) Assignee: The University of Manchester, Manchester (GB)

( * ) Notice: Subject to any disclaimer, the term of this patent is extended or adjusted under 35 U.S.C. 154(b) by 4 days.

(21) Appl. No.: 15/746,775

(22) PCT Filed: Jul. 22, 2016

(86) PCT No.: PCT/GB2016/052230
§ 371 (c)(1),
(2) Date: Jan. 22, 2018

(87) PCT Pub. No.: WO2017/017420
PCT Pub. Date: Feb. 2, 2017

(65) Prior Publication Data
US 2018/0327618 A1  Nov. 15, 2018

(30) Foreign Application Priority Data

Jul. 24, 2015 (GB) .................................. 1513100.6
Feb. 23, 2016 (GB) .................................. 1603126.2

(51) Int. Cl.
C09D 11/30 (2014.01)
C01B 21/064 (2006.01)
(Continued)

(52) U.S. Cl.
CPC .......... C09D 11/30 (2013.01); C01B 21/0648 (2013.01); H01L 21/4763 (2013.01);
(Continued)

(58) Field of Classification Search
CPC . C09D 11/30; H01L 21/4763; H01L 51/0045; H01L 51/0005; H01L 51/441; C01B 21/0648; C01P 2004/24
See application file for complete search history.

(56) References Cited

U.S. PATENT DOCUMENTS

| 2012/0104329 A1 | 5/2012 | Meyer et al. |
| 2012/0326093 A1 | 12/2012 | Landorf |
| 2015/0337145 A1* | 11/2015 | Torrisi ................. C09D 11/037 428/207 |

FOREIGN PATENT DOCUMENTS

| WO | 2012/138632 A2 | 10/2012 |
| WO | 2014/064432 A1 | 5/2014 |
| WO | 2015/114354 A1 | 8/2015 |

OTHER PUBLICATIONS

Yang et al. ("A simple method for graphene production based on exfoliation of graphite in water using 1-pyrenesulfonic acid sodium salt", Carbon, vol. 531 Mar. 1, 2013 (Mar. 1, 2013), pp. 357-365, XP055157876, ISSN: 0008-6223, DOI: 10.1016/j.carbon.2012.11.022).*

(Continued)

Primary Examiner — Yaovi M Ameh
(74) Attorney, Agent, or Firm — Seed IP Law Group LLP

(57) ABSTRACT

The present invention relates to an ink formulation comprising two-dimensional inorganic layered particles. The ink formulations of the present invention are for inkjet printing. The present invention also relates to a process for the preparation of these ink formulations, to the use of these ink formulations for the production of printed films and tracks comprising the inorganic material, to the films or tracks produced by the inkjet printing of these ink formulations, to devices that comprise these films or tracks, and to systems comprising an array of these devices.

41 Claims, 55 Drawing Sheets

(51) Int. Cl.
    *H01L 51/00*      (2006.01)
    *H01L 21/4763*    (2006.01)
    *H01L 51/44*      (2006.01)
(52) U.S. Cl.
    CPC ...... *H01L 51/0005* (2013.01); *H01L 51/0045* (2013.01); *C01P 2004/24* (2013.01); *H01L 51/441* (2013.01)

(56) References Cited

OTHER PUBLICATIONS

An et al., "Stable Aqueous Dispersions of Noncovalently Functionalized Graphene from Graphite and their Multifunctional High-Performance Applications," *Nano Lett.* 10(11):4295-4301, 2010.
Parviz et al., "Dispersions of Non-Covalently Functionalized Graphene with Minimal Stabilizer," *ACS Nano* 6(10):8857-8867, 2012.
Withers et al., "Supplementary Materials for Heterostructures produced from nanosheet-based inks," URL: http://pubs.acs.org/doi/suppl/10.1021/nl501355j/suppl_file/nl501355j_si_001.pdf, May 28, 2014, 14 pages.
Yang et al., "A simple method for graphene production based on exfoliation of graphite in water using 1-pyrenesulfonic acid sodium salt," *Carbon* 53:357-365, 2013.

\* cited by examiner

INK FORMULATION

INTRODUCTION

The present invention relates to an ink formulation and, more specifically, to an ink formulation that comprises nanosheets of an inorganic material and which is suitable for inkjet printing. The present invention also relates to a process for the preparation of these ink formulations, to the use of these ink formulations for the production of printed films and tracks comprising the inorganic material, to the films or tracks produced by the inkjet printing of these ink formulations, to devices that comprise these films or tracks, and to systems comprising an array of these devices.

BACKGROUND OF THE INVENTION

The advent of graphene (K. S. Novoselov, A. K. Geim, S. V. Morozov, D. Jiang, Y. Zhang, S. V. Dubonos, I. V. Grigorieva and A. A. Firsov, "Electric field Effect in Atomically Thin Carbon Films" *Science*, Vol. 306, No. 5696, pp. 666-669, 2004) and subsequent discovery of its multitude of superior properties, has led to the identification of many other two-dimensional inorganic crystals through the exfoliation of other layered inorganic compounds. Other materials which have been isolated as single or few layer platelets include hexagonal boron nitride, $NbSe_2$, bismuth strontium calcium copper oxide (BSCCO) and $MoS_2$. The nanosheets formed comprise a single or few layers (or sheets) that are stable and can exhibit complementary electronic properties to graphene, such as being insulators, semiconductors and superconductors.

The large variety of two-dimensional atomic crystals isolated in recent years offers a rich platform for the creation of heterostructures which combine several of these materials in one stack. Since, collectively, this class of materials covers a very broad range of properties, the obtained heterostructures can be tuned to focus on particular phenomena, or be used for specific applications (or even to perform multiple functions).

Thus, nanosheets of inorganic two-dimensional materials can be used either alone or in combination with other such materials to form ultrathin electronic devices with astonishing properties. For example, BN and $MoS_2$ have been used in conjunction with graphene to form quantum tunneling transistor heterostructures (WO2012/127245) while $MoS_2$ and $WS_2$ have been used in conjunction with graphene to form photovoltaic heterostructures (WO2013/140181).

To date, heterostructures have generally been produced by micromechanical cleavage of bulk ("three-dimensional") layered crystals with subsequent dry transfer of each crystal layer. While this technique enables the production of extremely high quality heterostructures, it cannot be applied to the production of such heterostructures on a large scale. Consequently, an alternative method, suitable for mass-production, should be utilised to bring the attractive qualities of such systems to real-life applications.

Liquid-phase exfoliation is a scalable approach for production of nanosheets or flakes of two-dimensional crystals, based on exfoliation of their bulk counterparts via chemical wet dispersion followed by ultra-sonication. This technique offers many advantages in terms of cost reduction, scalability and compatibility with any substrate, including cheap and flexible substrates. Currently this is mostly based on the use of organic solvents such as N-Methylpyrrolidone (NMP) and N,N-dimethylformamide (DMF), which are toxic, expensive and characterized by high boiling points.

The preparation of inkjet printable formulations containing nanosheets of exfoliated inorganic materials (such as graphene, hexagonal boron nitride, $NbSe_2$, bismuth strontium calcium copper oxide (BSCCO), $WS_2$ and/or $MoS_2$) is of particular interest.

Inkjet printing can be used for a wide variety of applications, including the preparation of printed coatings and printed electronic devices. Printed electronic devices are increasingly used in a wide range of commercial applications such as, for example, portable electronic devices, signage, lighting, product identification, flexible electronics, photovoltaic systems, medical equipment, antennas (such as RFID antennas), displays, sensors, thin film batteries, electrodes and many others.

Printed electronics are typically made by printing inks onto a substrate to form the electronic device.

The use of printed electronics has a number of advantages over conventional fabrication processes. In particular, printed conductive and insulative patterns are typically: faster to produce than subtractive processes (such as etching); less wasteful; less hazardous (i.e. use less hazardous chemicals); less expensive than conventional techniques; compatible with a wide range of substrates; simple to implement; and enable the possibility of further post-fabrication processing.

Computer-controlled printer technology also allows for precision printing on a wide variety of substrates, including glass, plastic, or ceramics for electronics or display applications. Inkjet printing involves the placement of small drops of ink onto a substrate surface in response to a digital signal. Typically, the ink is transferred or jetted onto the surface without physical contact between the printing device and the surface. Within this general technique, the specific method by which the inkjet ink is deposited onto the substrate surface varies from system to system, and includes continuous ink deposition and drop-on-demand ink deposition. Ink droplets are ejected by the print head nozzle and are directed to the substrate surface.

In order to be suitable for inkjet printing, the ink needs to meet a number of performance criteria, such as a viscosity within the range 2 to 30 cPs; a surface tension within the range 20 to 50 mN/m (and preferably 28 to 35 mN/m) and a low rate of evaporation at ambient temperatures (to prevent clogging of the printer head). Despite a number of inkjet-printable inks being available, there remains a need for new and improved ink formulations. In particular, there is a need for new and improved aqueous formulations comprising nanosheets of inorganic materials, such as high-quality graphene.

For effective inkjet printing, it is also necessary to have a stable dispersion of the nanosheets of inorganic material within the formulation. To maintain the dispersibility of nanosheet materials such as pristine graphene, it is necessary to use a stabiliser molecule. Examples of stabiliser molecules include certain surfactant, polymers and aromatic "π-π stacking" molecules (e.g. pyrene). However, the presence of excess stabiliser can be undesirable as it may affect the mechanical and electrical properties of the printed ink. There is therefore a need for aqueous ink formulations comprising nanosheets of inorganic materials which comprise minimal quantities of stabiliser.

It is therefore an object of the present invention to provide an ink formulation comprising nanosheets of inorganic materials that is suitable for inkjet printing and the preparation of printed electronics.

The present invention was devised with the foregoing in mind.

SUMMARY OF THE INVENTION

According to a first aspect of the present invention, there is provided an ink formulation suitable for inkjet printing, the ink formulation comprising a plurality of nanosheets of an inorganic material in an aqueous vehicle, wherein the nanosheets are associated with a stabiliser that renders the nanosheets dispersible within the aqueous vehicle and the aqueous vehicle further comprises at least one surface tension modifier and at least one viscosity modifier;

and wherein the mass ratio of inorganic material to stabiliser present in the formulation is greater than 3:1.

According to a further aspect of the present invention, there is provided a process for the preparation of an ink formulation comprising a plurality of nanosheets of an inorganic material dispersed in an aqueous vehicle, the process comprising:
  a) providing a source of the inorganic material (e.g. one or more multi-layered bulk particles of the inorganic material) in a first aqueous medium comprising a stabiliser;
  b) subjecting the source of the inorganic material in the first aqueous medium to energy (e.g. sonic energy) to break up or exfoliate the source of the inorganic material to obtain an aqueous dispersion of nanosheets of the inorganic material in the first aqueous medium;
  c) if the aqueous dispersion obtained in step b) above comprises some remaining source material that has not been converted into dispersed nanosheets, the method optionally further comprises the step of separating any residual source material from the dispersion;
  d) optionally separating the dispersed nanosheets from the aqueous medium following step b) or step c) above and then redispersing the nanosheets in a further aqueous medium;
  e) optionally separating the dispersed nanosheets from the aqueous medium following step d) above and then redispersing the nanosheets in a further aqueous medium one or more times;
  f) separating the nanosheets from the aqueous medium in the dispersion formed in any one of steps (b), (c) (d) and (e) above; and
  g) re-dispersing the nanosheets collected in step (f) in an aqueous vehicle comprising a surface tension modifier and a viscosity modifier to form the ink formulation.

In a further aspect, the present invention provides an ink formulation obtainable by, obtained by, or directly obtained by the process of the present invention.

According to a further aspect of the present invention, there is provided the use of an ink formulation as defined herein for the production of printed films and/or tracks.

According to a further aspect of the present invention, there is provided a film and/or track prepared by the inkjet printing of an ink formulation as defined herein onto a substrate.

According to a further aspect of the present invention, there is provided an electronic device or component comprising a film or track according to the fifth aspect of the present invention. In an embodiment, the electronic device is prepared by inkjet printing all of the constituent parts.

According to yet another aspect of the present invention, there is provided an electronic system comprising one or more electronic devices, as defined herein, connected together either in series or in parallel. In an embodiment, the electronic system is prepared by inkjet printing all of the constituent parts.

DETAILED DESCRIPTION OF THE INVENTION

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

Unless otherwise specified, where the quantity or concentration of a particular component of a given formulation is specified as a weight percentage (wt. % or % w/w), said weight percentage refers to the percentage of said component by weight relative to the total weight of the formulation as a whole. It will be understood by those skilled in the art that the sum of weight percentages of all components of a formulation will total 100 wt. %. However, where not all components are listed (e.g. where formulations are said to "comprise" one or more particular components), the weight percentage balance may optionally be made up to 100 wt % by unspecified ingredients (e.g. a diluent, such as water, or other non-essential but suitable additives).

Ink Formulations of the Present Invention

The present invention provides an ink formulation suitable for inkjet printing, the ink formulation comprising a plurality of nanosheets of an inorganic material in an aqueous vehicle, wherein the nanosheets are associated with a stabiliser that renders the nanosheets dispersible within the aqueous vehicle and the aqueous vehicle further comprises at least one surface tension modifier and at least one viscosity modifier;

and wherein the mass ratio of inorganic material to stabiliser present in the formulation is greater than 3:1.

The present invention also provides an ink formulation obtainable by, obtained by, or directly obtained by the process of the present invention defined herein.

The ink formulations of the present invention advantageously possess low levels of stabiliser in the aqueous vehicle. As previously indicated, excess stabiliser (e.g. in the aqueous vehicle of the ink formulation) may be detrimental because it could affect the mechanical and/or the electrical properties of the printed ink. It is therefore desirable to have ink formulations in which the amount of excess stabiliser is as low as possible.

The nanosheets of the inorganic material are formed in situ within an aqueous vehicle comprising a stabiliser. During this process, a proportion of the stabiliser associates with nanosheets that are formed and prevent them from re-aggregating. The stabiliser also assists with the dispersion of the nanosheets in the aqueous vehicle. Excess stabiliser that is not associated with the nanosheets is removed in the subsequent processing steps. Thus, the resultant ink formulation comprises a lower amount of stabiliser, the vast bulk of which is associated with the nanosheets so as to render them dispersible with the aqueous vehicle.

In addition, the process of the present invention defined herein enables ink formulations having relatively high loadings of the nanosheets of inorganic material in the aqueous vehicle to be prepared.

In order to be suitable for inkjet printing, the ink formulations of the present invention suitably have a viscosity within the range of 2 to 30 cPs.

In a particular embodiment, the viscosity is within the range of 10 to 12 cPs.

Suitably, the formulations of the present invention have a surface tension within the range 20 to 50 mN/m. More suitably, the formulations of the present invention have a surface tension within the range 28 to 45 mN/m. In an embodiment, the formulations of the present invention have a surface tension within the range 28 to 35 mN/m.

Suitably, the ink formulations of the present invention do not evaporate readily, i.e. they are non-volatile at normal inkjet printing temperatures (e.g. at a standard room temperature of 20 to 25° C.). This prevents the clogging of the printer nozzle.

In a particular aspect, the ink formulation is an inkjet formulation.

Nanosheets of Inorganic Material

The term 'inorganic material' refers to any inorganic material made up of one or more elements (including carbon) which form layered structures in which the bonding between atoms within the same layer is covalent and the layers are held together by Van der Waals forces. Suitably, the inorganic material is crystalline or at least partially crystalline.

Many inorganic compounds exist in a number of allotropic forms, some of which are layered and some of which are not. For example boron nitride can exist in a layered graphite-like structure or as a diamond-like structure in which the boron and nitrogen atoms are tetrahedrally orientated.

Any suitable inorganic layered material may be used to form the nanosheets in the ink formulations of the present invention.

Particular examples of layered inorganic compounds to which the present invention can be applied include: graphene, hexagonal boron nitride, bismuth strontium calcium copper oxide (BSCCO), transition metal dichalcogenides (TMDCs), $Sb_2Te_3$, $Bi_2Te_3$ and $MnO_2$. The list of exemplary layered inorganic compounds may also include $Bi_2S_3$ and SnS.

TMDCs are structured such that each layer of the material consists of three atomic planes: a layer of transition metal atoms (for example Mo, Ta, W) sandwiched between two layers of chalcogen atoms (for example S, Se or Te). Thus in one embodiment, the TMDC is a compound of one or more of Mo, Ta and W with one or more of S, Se and Te. There is strong covalent bonding between the atoms within each layer of the transition metal chalcogenide and predominantly weak Van der Waals bonding between adjacent layers. Exemplary TMDCs include $NbSe_2$, $WS_2$, $MoS_2$, $TaS_2$, $PtTe_2$, and $VTe_2$.

In an embodiment, the inorganic layered material is selected from graphene, hexagonal boron nitride, $WS_2$ and/or $MoS_2$.

In another embodiment, the inorganic layered material is selected from graphene, hexagonal boron nitride, $Bi_2S_3$, SnS, $WS_2$ and/or $MoS_2$.

In a particular embodiment, the inorganic material is graphene. Graphene is the name given to a particular crystalline allotrope of carbon in which each carbon atom is bound to three adjacent carbon atoms (in a $sp^2$ hybridised manner) so as to define a one atom thick planar sheet of carbon. The carbon atoms in graphene are arranged in the planar sheet in a honeycomb-like network of tessellated hexagons. Graphene is often referred to as a 2-dimensional crystal because it represents a single nanosheet or layer of carbon of nominal (one atom) thickness. Graphene can be considered to be a single sheet of graphite.

In the present invention, the nanosheets may comprise single layers of graphene or thin stacks of two or more graphene layers. The thin stacks of graphene can be distinguished from graphite by their thinness and a difference in physical properties. In this regard, it is generally acknowledged that crystals of graphene which have more than 10 molecular layers (i.e. 10 atomic layers which equates to a thickness of approximately 3.5 nm) generally exhibit properties more similar to graphite than to graphene. In the present invention, nanosheets of graphene are formed by exfoliation of graphite.

For the avoidance of doubt, the term graphene used herein does not encompass graphene oxide or any other form of covalently modified graphene.

In another embodiment, the inorganic layered material is selected from hexagonal boron nitride, $WS_2$, $MoS_2$, $Bi_2S$ and/or SnS.

In another embodiment, the inorganic layered material is selected from hexagonal boron nitride, $WS_2$ and/or $MoS_2$.

In certain embodiments, the inorganic material may be h-BN. Single layer h-BN is structurally similar to graphene, but unlike its carbon analogue, it is an insulator with a large band gap (~6 eV). This, added to unique features such as excellent chemical, mechanical properties, and thermal stability, allows using h-BN nanosheets (BNNS) in a variety of applications, such as components in nanodevices, solid lubricant, UV-light emitter and as insulating thermo-conductive filler in composites.

The inorganic material may also be a transition metal dichalcogen (e.g. $MoS_2$, $WS_2$, $MoTe_2$, $MoSe_2$ etc.).

The nanosheets present in the formulation of the present invention are suitably prepared by breaking up or "exfoliating" larger particles of the multi-layered inorganic material (as defined in step b) of the process of the present invention). The nanosheets formed by the exfoliation process may consist of a single layer or two or more layers of the inorganic material.

Suitably, the majority (greater than 50%) of the nanosheets of inorganic material present in the ink formulations of the present invention comprise less than ten layers of the inorganic material.

In an embodiment, greater than 60% of the nanosheets of inorganic material present in the ink formulations of the present invention comprise less than ten layers of the inorganic material. In a further embodiment, greater than 75% of the nanosheets of inorganic material present in the ink formulations of the present invention comprise less than ten layers of the inorganic material. In another embodiment, greater than 80% of the nanosheets of inorganic material present in the ink formulations of the present invention comprise less than ten layers of the inorganic material. In a further embodiment, greater than 90% of the nanosheets of inorganic material present in the ink formulations of the present invention comprise less than ten layers (or sheets) of the inorganic material.

Suitably, the proportion of nanosheets having less than 10 layers is as high as possible. More suitably, the proportion of nanosheets having less than 8 layers is a high as possible.

The proportion of single layer nanosheets is also suitably as high as possible, e.g. greater than 15%, or more preferably greater 20%, of the nanosheets present in the formulation. The amount of single layered material present will depend in part of the conditions (energy input and time) used to prepare the nanosheets.

In certain embodiments, it may be that greater than 40% (e.g. greater than 50%, or greater than 75%, greater than 80% or greater than 90%) of the nanosheets of an inorganic layered material have a thickness of from 1 to 10 molecular layers. It may be that greater than 40% (e.g. greater than 50%, or greater than 75%, greater than 80% or greater than 90%) of the nanosheets have a thickness of from 1 to 7 molecular layers. Thus, it may be that greater than 20% of the nanosheets have a thickness of 1 molecular layer. These statements apply particularly to nanosheets of graphene.

In certain embodiments, it may be that greater than 40% (e.g. greater than 50%, or greater than 75%, greater than 80% or greater than 90%) of the nanosheets have a thickness of from 1 to 6 molecular layers. Thus, it may be that greater than 40% (e.g. greater than 50%, or greater than 75%, greater than 80% or greater than 90%) of the nanosheets have a thickness of from 4 to 6 molecular layers. These statements apply particularly to nanosheets of transition metal dichalcogenides.

In certain embodiments, it may be that greater than 50% by weight (e.g. greater than 75% by weight, greater than 90% or greater than 98%) of the nanosheets have a thickness of from 1 to 8 molecular layers. Accordingly, it may be that greater than 50% by weight (e.g. greater than 75% by weight, greater than 90% or greater than 98%) of the nanosheets have a thickness of from 3 to 8 molecular layers. Thus, it may be that greater than 50% by weight (e.g. greater than 75% by weight, greater than 90% or greater than 98%) of the nanosheets have a thickness of from 4 to 6 molecular layers. These statements apply particularly to nanosheets of transition metal dichalcogenides.

In certain embodiments, it may be that greater than 50% by weight (e.g. greater than 75% by weight, greater than 90% or greater than 98%) of the nanosheets have a thickness of from 1 to 10 molecular layers. It may be that greater than 50% by weight (e.g. greater than 75% by weight, greater than 90% or greater than 98%) of the nanosheets have a thickness of from 1 to 5 molecular layers. Thus, it may be that greater than 50% by weight (e.g. greater than 75% by weight, greater than 90% or greater than 98%) of the nanosheets have a thickness of from 1 to 3 molecular layers. These statements apply particularly to nanosheets of h-BN.

Each nanosheet has a length and a width dimension to define the size of the plane of the nanosheet. Suitably, the length and width of the nanosheets are within the range of 10 nm to 2 microns. More suitably, the length and width of the nanosheets are within the range of 10 nm to 500 nm.

For example, it may be that greater than 75% (e.g. greater than 90% or greater than 98%) of the nanosheets of an inorganic layered material have a length or width dimension of between 10 nm and 2 microns. It may be that greater than 75% (e.g. greater than 90% or greater than 98%) of the nanosheets have a length or width dimension of less than 1 micron. Thus, it may be that greater than 75% (e.g. greater than 90% or greater than 98%) of the nanosheets have a length or width dimension of between 10 and 500 nm.

It may be that greater than 50% by weight (e.g. greater than 75% by weight, greater than 90% or greater than 98%) of the nanosheets have a diameter between 50 and 750 nm. It may be that greater than 50% by weight (e.g. greater than 75% by weight, greater than 90% or greater than 98%) of the nanosheets have a diameter of less than 500 nm. Thus, it may be that greater than 50% by weight (e.g. greater than 75% by weight, greater than 90% or greater than 98%) of the nanosheets have a diameter between 100 and 500 nm.

Typically, the concentration of the nanosheets in the aqueous vehicle of the ink formulation is 1 to 10 g/L. More typically, the concentration of the nanosheets in the aqueous vehicle is 2 to 6 g/L. Even more typically, the concentration of the nanosheets in the aqueous vehicle is 2.5 to 4.0 g/L.

In a further embodiment, the concentration of nanosheets in the aqueous vehicle is within the range of 0.01 to 15 mg/ml, suitably within the range of 0.01 to 10 mg/ml, and more suitably within the range of 0.01 to 5 mg/ml.

Stabiliser

The nanosheets are associated with a stabiliser that renders the nanosheets dispersible in the aqueous medium in the ink formulations of the present invention.

Suitable stabilisers are known in the art.

In a particular embodiment, the stabiliser is a water soluble polyaromatic compound.

The stabilisers used in the compositions of the present invention are suitably efficient dispersants for the nanosheets (i.e. they help form and maintain the dispersion of the nanosheets in the aqueous vehicle). The preferred way to prepare the formulations of the present invention is to form the nanosheets in situ within the stabiliser defined herein by exfoliating larger particles of the bulk multi-layered inorganic material. The stabilisers of the present invention are particularly efficient at effecting the exfoliation of bulk inorganic layered materials to form the required nanosheets. The use of these stabilisers also has a beneficial effect on the loading of nanosheets that can be achieved in the ink formulation.

The presence of hydrophilic groups allows the stabiliser to interact with the water as well as the nanosheets of the inorganic layered material. The stabiliser acts as a dispersant, thereby giving greater stability to the resultant dispersion of the nanosheets formed in the aqueous vehicle. Without wishing to be bound by any particular theory, it is believed that as the nanosheets are formed, for example by the application of energy (e.g. sonic energy) to exfoliate the bulk material, the stabiliser molecules penetrate between the layers of the inorganic material and non-covalently interact with the surfaces of the layers. It is believed that the stabiliser (e.g. pyrene) therefore aids the detachment of the nanosheets and then prevents them re-aggregating.

If the hydrophilic group of the stabiliser is too large, (e.g. over 20 atoms in size) it is believed that the exfoliation yield will be reduced because of the smaller probability of intercalating between the layers.

The stabiliser may have a ring system which comprises from 2 to 10 fused benzene rings, the ring system being substituted with from 1 to 4 independently selected hydrophillic groups, each hydrophilic group consisting of less than 20 atoms. In an embodiment, the ring system may have from 2 to 8 or, more typically, 3 to 6 fused benzene rings. In a particular embodiment, the ring system has four fused benzene rings. Where the ring system contains three or more benzene rings (e.g. four benzene rings), it may be that the rings are not arranged linearly. Thus, the ring system may have at least one ring which is ortho- and peri-fused to two further rings respectively. In other words, it may be that at least one ring contains two atoms in common with each of two or more other rings.

The independently selected hydrophilic groups may consist of less than 10 atoms or they may consist of less than 6 atoms. The atoms in question may be independently selected from S, O, P, H, C, N, B and I. Exemplary hydrophilic groups include $SO_3H$, $SO_2H$, $B(OH)_2$, $CO_2H$, OH and $PO_3H$. Suitably, when the stabiliser comprises four substituent groups, preferably, they are not all the same.

The stabiliser may be a salt and may therefore be a base addition salt. The above mentioned hydrophilic groups may therefore be $SO_3M$, $SO_2M$, $CO_2M$ and $PO_3M$, where M is a cation, e.g. a cation selected from $N^+$, $K^+$, $Li^+$ and $NH_3^+$.

In a particular embodiment, the stabiliser may be a pyrene substituted with from 1 to 4 hydrophilic groups. It may be that the hydrophilic groups are selected from $SO_3M$ and OH. Specific examples include:

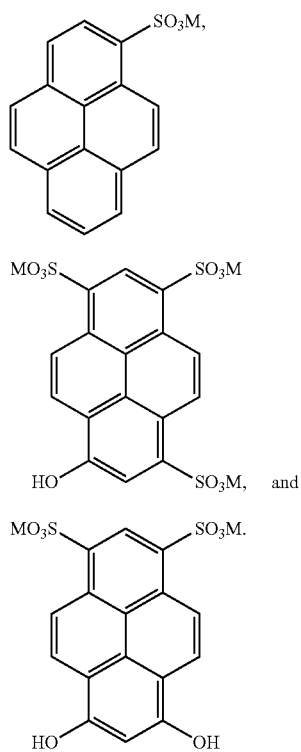

(PS1)

(PS3)

(PS2)

These exemplary pyrene sulfonic acid salts are dyes. They are thus readily available.

In a particular embodiment, the stabliser is 1-pyrenesulfonic acid sodium salt.

Suitably, the mass ratio of inorganic material to stabiliser present in the formulation is greater than 5:1. More suitably, the mass ratio of inorganic material to stabiliser present in the formulation is greater than 10:1. Even more suitably, the mass ratio of inorganic material to stabiliser present in the formulation is greater than 15:1. Most suitably, the mass ratio of inorganic material to stabiliser present in the formulation is greater than 17:1.

In an embodiment, the mass ratio of inorganic material to stabiliser present in the formulation is between 5:1 and 50:1. Suitably, the mass ratio of inorganic material to stabiliser present in the formulation is between 7:1 and 40:1. More suitably, the mass ratio of inorganic material to stabiliser present in the formulation is between 8:1 and 30:1. Most suitably, the mass ratio of inorganic material to stabiliser present in the formulation is between 10:1 and 20:1.

In an embodiment, the mass ratio of inorganic material to stabiliser present in the formulation is between 5:1 and 20:1. Suitably, the mass ratio of inorganic material to stabiliser present in the formulation is between 10:1 and 19:1. More suitably, the mass ratio of inorganic material to stabiliser present in the formulation is between 15:1 and 19:1. Most suitably, the mass ratio of inorganic material to stabiliser present in the formulation is between 17:1 and 19:1.

In a further embodiment, the amount of free stabliser (e.g. pyrene) in the ink formulation is less than 25 wt. %. Suitably, the amount of free stabliser (e.g. pyrene) in the ink formulation is less than 20 wt. %. More suitably, the amount of free stabliser (e.g. pyrene) in the ink formulation is less than 15 wt. %. Yet more suitably, the amount of free stabliser (e.g. pyrene) in the ink formulation is less than 10 wt. %. Most suitably, the amount of free stabliser (e.g. pyrene) in the ink formulation is less than 8 wt. %.

The Aqueous Vehicle

The nanosheets of the present invention are dispersed in the aqueous vehicle. The term 'aqueous vehicle' can be understood to mean a liquid vehicle which contains water.

The aqueous vehicle may comprise greater than about 20% by volume of water. For example, the aqueous medium may contain more than 50% by volume water, e.g. more than 75% by volume water or more than 95% by volume water. Typically the aqueous vehicle will comprise 50 to 100% by volume of water and more typically 50 to 99.97%.

The water content of the formulation as a whole will typically be greater than 20 wt. % relative to the total weight of the formulation. In an embodiment, the water content of the formulation is greater than or equal to 50 wt. % relative to the total weight of the formulation.

Typically, the water content will be within the range of greater than or equal to 20 wt. % to less than or equal to 99.97 wt. % relative to the total weight of the formulation. In an embodiment, the water content will be within the range of greater than 50 wt. % to less than or equal to 99.97 wt. % relative to the total weight of the formulation. In another embodiment, the water content is within the range of greater than or equal to 80 wt. % to less than or equal to 99.97 wt. % relative to the total weight of the formulation. In another embodiment, the water content is within the range of greater than or equal to 90 wt. % to less than or equal to 99.97 wt. % relative to the total weight of the formulation. In another embodiment, the water content is within the range of greater than or equal to 99 wt. % or 99.9 wt. %, to less than or equal to 99.97 wt. %, or to less than or equal to 95 wt. % relative to the total weight of the formulation.

The 'aqueous vehicle' may also comprise other solvents. It may therefore comprise organic solvents which may or may not be miscible with water. Where the aqueous medium comprises organic solvents, those solvents may be immiscible or sparingly miscible and the aqueous medium may be an emulsion. The aqueous medium may comprise solvents which are miscible with water, for example alcohols (e.g.

methanol and ethanol). The aqueous medium may comprise one or more additives which may be ionic, organic or amphiphilic. Examples of possible additives include surfactants, viscosity modifiers, pH modifiers, tonicity modifiers, and dispersants.

In addition to the nanosheets, the aqueous vehicle may have other particulate components dispersed within it, such as, for example, metallic particles and/or carbon nanotubes.

The aqueous medium may have any pH. The aqueous medium may have a pH in the range from 1 to 13. The aqueous medium may have a pH in the range from 1 to 7, e.g. in the range from 2 to 7 depending on the inorganic material.

Viscosity Modifier

In order to render the formulation suitable for inkjet printing, the viscosity of the aqueous vehicle needs to be within the range of 2 to 30 cPs, more preferably within the range of 5 to 20 cPS, and yet more preferably within the range of 10 to 12 cPs. Accordingly, as the viscosity of water is 1 cPs, the formulation of the present invention suitably comprises a viscosity modifier as a component of the aqueous vehicle.

Any suitable viscosity modifier may be used in the formulations of the present invention. The viscosity modifier is suitably a water miscible co-solvent. Examples of suitable viscosity modifiers include (and are not limited to) glycols (e.g. ethylene glycol, propylene glycol), ethers (e.g. ethylene glycol methyl ether), alcohols (e.g. 1-propanol), esters (ethyl lactate), ketones (e.g. methyl ethyl ketone (MEK)) and organo-sulphur compounds (e.g. sulfolane).

In a particular embodiment, the viscosity modifier is selected from ethylene glycol, propylene glycol and/or ethylene glycol methyl ether.

Suitably the viscosity modifier is a material which, when combined with water, forms an aqueous vehicle with a boiling point of below 200° C. More suitably, the viscosity modifier is a material which, when combined with water, forms an aqueous vehicle with a boiling point of below 180° C. or below 150° C. Suitably, the boiling point is not too low that the co-solvent readily evaporates at normal inkjet printing temperatures. In an embodiment, the viscosity modifier is a material which, when combined with water, forms an aqueous vehicle with a boiling point within the range of 80 to 200° C., more suitably 90 to 150° C.

The amount of viscosity modifier added is suitably sufficient to provide the final formulation with a viscosity of 1 to 30 cPs, preferably 2 to 30 cPs, more preferably 5 to 20 cPs, and yet more preferably 10 to 12 cPs. Typically, the viscosity modifier is present in the formulations of the present invention at an amount of from 0.01 to 60 wt. %, and suitably 0.01 to 50 wt. %. Suitably, the viscosity modifier is present in the formulations of the present invention at an amount of from 0.03 to 50 wt. %. In an embodiment, the viscosity modifier is present in the formulations of the present invention at an amount of from 0.03 to 30 wt. %. In another embodiment, the viscosity modifier is present in the formulations of the present invention at an amount of from 0.03 to 10 wt. %. In a further embodiment, the viscosity modifier is present in the formulations of the present invention at an amount of from 0.03 to 5 wt. %. In yet another embodiment, the viscosity modifier is present in the formulations of the present invention at an amount of from 0.03 to 0.1 wt. %.

Surface Tension Modifier

In order to render the formulation suitable for inkjet printing, the surface tension of the formulation needs to be adjusted to be within the range 20 to 50 mN/m and preferably within the range 28 to 45 mN/m and more preferably 28 to 35 mN/m. Accordingly, the formulation of the present invention suitably comprises a surface tension modifier as a component of the aqueous vehicle.

Water has a surface tension of 72 mN/m, so the surface tension modifier needs to reduce the surface tension of the formulation.

Any suitable surface tension modifier may be used in the formulations of the present invention. The surface tension modifier is suitably a water soluble surface active material. Examples of suitable materials include surfactants. Non-ionic surfactants are generally preferred. Any suitable non-ionic surfactant may be used. Typical examples include Triton, Tween, poloxamers, cetomacrogol 1000, cetostearyl alcohol, cetyl alcohol, cocamide DEA, monolaurin, nonidet P-40, nonoxynols, decyl glucoside, pentaethylene glycol monododecyl ether, lauryl glucoside, oleyl alcohol, and polysorbate.

In a particular embodiment, the surface tension modifier is Triton.

The amount of surface tension modifier present in the formulation is an amount sufficient to provide the final formulation with a surface tension of 20 to 50 mN/m, preferably 28 to 45 mN/m, and more preferably between 28 and 35 mN/m.

Typically, the surface tension modifier is present in the formulations of the present invention at an amount of from 0.01 to 0.5 g/L. Suitably, the surface tension modifier is present in the formulations of the present invention at an amount of 0.04 to 0.2 g/L. In an embodiment, the surface tension modifier is present in the formulations of the present invention at an amount of 0.04 to 0.1 g/L. In a further embodiment, the surface tension modifier is present in the formulations of the present invention at an amount of from 0.04 to 0.08 g/L.

Binder

In addition to the viscosity modifier and the surface tension modifier, the ink formulation may also comprise a binder. The binder may be used to reduce re-dispersion of flakes in printed materials and to avoid re-dispersion of materials at the interface of the printed ink. The binder may also have a viscosity modifying effect (in addition to the viscosity modifiers discussed hereinbefore) and/or improve the stability of the ink. The binder, when present, is distinct from the active stabilizing agents discussed hereinbefore.

Any suitable binder may be used in the formulations of the invention. The binder is suitably a water-soluble polymer. The binder does not, however, need to be soluble in the viscosity modifier.

In a particular embodiment, the binder is selected from a polysaccharide (e.g. xanthan gum), polyvinylpyrrolidone and polyethylene glycol. Suitably, the binder is xanthan gum or carboxymethylcellulose, more suitably xanthan gum, which allows the preparation of inks with non-Newtonian viscosity (i.e. an ink with shear-thinning properties).

A binder (e.g. xanthan gum) is particularly advantageous when the ink is intended for use in the printing of heterostructures. The printing of vertical heterostructures in particular requires two or more 'layers' of ink to be printed on top of one another (in a stacked arrangement). This stacked (or vertical) printing is generally considered to be very challenging to achieve, especially since the printing of a subsequent layer (film) of ink onto a preceding printed layer (film) of ink results in a high degree of dispersion between the two layers at the interface. This re-dispersion of the preceding layer of printed ink makes it difficult to print discrete layers (films) of inks directly on top of one another.

To their surprise, the inventors have discovered that this problem may be addressed by including a suitable binder in the inkjet formulation.

Typically, the binder is present in the formulations of the present invention at an amount of from 0.01 to 2.0 g/L. Suitably, the binder is present in the formulations of the present invention at an amount of 0.05 to 1.0 g/L. In an embodiment, the binder is present in the formulations of the present invention at an amount of 0.1 to 0.8 g/L. In a further embodiment, binder is present in the formulations of the present invention at an amount of from 0.15 to 0.5 g/L.

Additional Materials

In certain embodiments of the present invention it may be preferable to include one or more additional materials to improve the properties of the ink formulation (e.g. the electrical and/or thermal conductivity).

In an embodiment, the ink formulations of the present invention may comprise an additional electrically conductive material. For example, the ink formulations of the present invention may comprise an electrically conductive material selected from the group consisting of carbon nanotubes, electronically conductive metal nanoparticles (e.g. silver nanoparticles) or an electronically conductive polymer (e.g. PEDOT:PSS). Most suitably, the ink formulations of the present invention may comprise an electrically conductive material selected from the group consisting of silver nanoparticles, poly(3,4-ethylenedioxythiophene) polystyrene sulfonate (PEDOT:PSS) or carbon nanotubes.

In another embodiment, the ink formulations of the present invention may comprises an additional material that has insulative properties.

It will be appreciated that any suitable amount of this additional material may be present in the ink formulations of the present invention. The amount of additional material added will also be understood to be dependent on the end use of the ink formulation concerned. Suitably, the ratio of additional material to inorganic layered material is from 0.5:99.5 to 15:85. More suitably, the ratio of additional material to inorganic layered material is from 1:99 to 10:90. Most suitably, the ratio of additional material to inorganic layered material is from 1:99 to 5:95.

Process of the Invention

The present invention provides a method of preparing an ink formulation as defined herein.

Thus, the present invention provides a process for the preparation of an ink formulation comprising a plurality of nanosheets of an inorganic material immersed in an aqueous vehicle; the process comprising:

a) providing a source of the inorganic material (e.g. one or more multi-layered bulk particles of the inorganic material) in a first aqueous medium comprising a stabiliser;

b) subjecting the source of the inorganic material in the first aqueous medium to energy (e.g. sonic energy) to break up or exfoliate the source of the inorganic material to obtain an aqueous dispersion of nanosheets of the inorganic material in the first aqueous medium;

c) if the aqueous dispersion obtained in step b) above comprises some remaining source material that has not been converted into dispersed nanosheets, the method optionally further comprises the step of separating any residual source material from the dispersion;

d) optionally separating the dispersed nanosheets from the aqueous medium following step b) or step c) above and then redispersing the nanosheets in a further aqueous medium;

e) optionally separating the dispersed nanosheets from the aqueous medium following step d) above and then redispersing the nanosheets in a further aqueous medium one or more times;

f) separating the nanosheets from the aqueous medium in the dispersion formed in any one of steps (b), (c) (d) and (e) above; and g) re-dispersing the nanosheets collected in step (f) in an aqueous vehicle comprising a surface tension modifier and a viscosity modifier to form the ink formulation.

The process of the present invention provides a refined ink formulation comprising dispersible nanosheets of a layered inorganic material dispersed within an aqueous vehicle which comprises a surface tension modifier and a viscosity modifier. As previously indicated, the surface tension modifier and viscosity modifier adjust the surface tension and viscosity of the ink formulation respectively to render it suitable for inkjet printing.

The nanosheets of inorganic material are formed within a first aqueous medium comprising a stabiliser (see step b). The stabiliser associates with the nanosheets during this process and aids their dispersibility within the aqueous medium. This also enhances the efficiency with which the nanosheets are formed. The dispersion of nanosheets formed in step b) may then be subjected to an optional process step, step c), in which any residual source material that has not been fully broken up or exfoliated in step b) to form the nanosheets is removed from the dispersion. Either following step b) or optional step c) the stabilized nanosheets formed in the first aqueous medium may optionally be washed one or more times. This involves separating the nanosheets from the aqueous medium following either step b) or step c) and then redispersing the nanosheets in a further aqueous medium, as described in optional step d) of the process. The re-dispersed nanosheets formed in optional step d) may then be separated from the aqueous medium and redispersed in a further aqueous medium one or more times, as described in optional step e) of the process.

Either following step b) or optional steps c), d) and e) of the process, the process involves forming the ink formulation by separating the nanosheets from the aqueous medium (step f) and redispersing the collected nanosheets in an aqueous vehicle (step g) as defined herein.

The aqueous vehicle used in step g suitably comprises little or no additional stabiliser, so that the final formulation comprises the stabilised nanosheets formed in step b) dispersed within an aqueous vehicle which comprises a surface tension modifier and a viscosity modifier.

Step a)

The process of the present invention comprises, in step a), the provision of a source of the inorganic material in a first aqueous medium comprising a stabiliser. The source will typically be one or more bulk particles of a multi-layered inorganic material. For example, in embodiments where the inorganic material is graphene, then the source will be one or more bulk graphite particles.

The aqueous medium comprises a stabiliser that will associate with the nanosheets of inorganic material formed in the subsequent process step b). The stabiliser will assist in the effective formation and dispersion of the nanosheets that are formed in step b).

Suitable stabilisers are known in the art.

In a particular embodiment, the stabiliser present in the first aqueous medium is a water soluble polyaromatic compound as defined hereinbefore. The amount of stabiliser present in the first aqueous medium needs to be sufficient to stabilise the nanosheets that are formed in step b) of the process. In part, this will depend on the amount of inorganic material that is present.

Typically, the first aqueous medium will comprise 0.05 to 2 g/L of stabiliser. Suitably, the first aqueous medium will comprise 0.1 to 1.5 g/L of stabiliser. More suitably, the first aqueous medium will comprise 0.1 to 1.0 g/L of stabiliser. Yet more suitably, the first aqueous medium will comprise 0.2 to 0.7 g/L of stabiliser.

The first aqueous medium may further comprise a surface tension modifier as previously defined herein in reference to the aqueous vehicle of the ink formulation. The amount of surface tension modifier present may be the same as the amounts quoted herein for the aqueous vehicle of the ink formulation.

The first aqueous medium may further comprise a viscosity modifier as previously defined herein in reference to the aqueous vehicle of the ink formulation. The amount of the viscosity modifier present may be the same as the amounts quoted herein for the aqueous vehicle of the ink formulation.

The first aqueous medium may have any suitable pH.

Particularly (but not exclusively) where the stabiliser is a polycyclic aromatic compound such as pyrenesulphonic acid (Py-2SO$_3$), high concentrations of nanosheets can in some cases be obtained at acidic pHs (e.g. from 1 to 7 or from 1 to 3 or about 2). Acidic pHs are particularly preferred where the two dimensional inorganic compound is h-BN.

The aqueous medium may have a pH in the range 5 to 9, e.g. from 6 to 8. Neutral pHs are particularly preferred where the two dimensional inorganic compound is a transition metal dichalcogenide.

Suitably, the first aqueous medium is prepared by dissolving the stabiliser and any other components in the water. The source of inorganic material is then immersed in the prepared first aqueous medium in preparation for the exfoliation in step b).

Step b)

In step b), the source of the inorganic material present in the first aqueous medium is exposed to energy (e.g. sonic energy) to break up or exfoliate the source of the inorganic material in order to obtain an aqueous dispersion of nanosheets of the inorganic material in the first aqueous medium.

The inventors have found that enhanced loadings of nanosheets in the ink formulation can be obtained by forming the nanosheets in situ within the first aqueous medium in the presence of a stabiliser. The nanosheets can be formed by exfoliating the source of the bulk multi-layered inorganic material (typically in the form of one or more large particles of the bulk material) in the pre-formed aqueous vehicle.

In this regard, the water soluble polycyclic aromatic compounds that represent the preferred stabilisers for the first aqueous medium have been found to be particularly efficient at effecting the exfoliation of bulk inorganic layered materials to form thin (two-dimensional) nanosheets as defined herein. The presence of hydrophilic groups allows the polyaromatic compound to interact with the water and thus also act as a dispersant, thereby stabilising the resultant nanosheet suspension. It is believed that as the nanosheets form, polycyclic aromatic compounds intercalate and adsorb to the surface plane of the layers, thereby stabilising the nanosheets that are formed and preventing their re-aggregation.

The energy applied to convert the multi-layered particles into a dispersion of nanosheets in step (b) may be sonic energy. In an embodiment, the sonic energy is ultrasonic energy. Sonic energy may be delivered by using a bath sonicator or a tip sonicator. Alternatively, the energy may be a mechanical energy, e.g. shear force energy or grinding. The particles may be subjected to energy (e.g. sonic energy) for a length of time from 15 min to up to 1 week, depending on the properties and proportions (nanosheet diameter and thickness) desired. The particles may be subjected to energy (e.g. sonic energy) for a length of time from 1 to 4 days (in particular for inkjet printing where the size of the flakes must be smaller than the size of the printer nozzles). In an embodiment, the energy is sonic energy provided by immersing the formulation into a sonicator in step (b) which has a frequency of between 10 and 100 kHz (e.g. 35 kHz) and a power of 100 to 1000 Watts (e.g. 120 to 400 Watts).

Step c)

Step c) is an optional step in which any remaining source of inorganic material is separated from the first aqueous medium. In many cases, this step will be required as the exfoliation of bulk inorganic material performed in step b) rarely proceeds to 100% completion.

The separation of the remaining source material from the dispersion can be facilitated by any suitable separation technique known in the art. For example, suitable centrifugation, filtration or dialysis techniques may be used. In an embodiment, any larger particulates of the residual source material are separated from the dispersed nanosheets and the first aqueous medium by centrifugation. A person skilled in the art will know how to select suitable centrifugation speeds and times to effect the deposition of any larger particulate material present following step b) of the process.

In an embodiment, remaining bulk source material is removed by centrifuging the dispersion prepared in step b) of the process at a centrifugation speed of 100 to 2000 rpm. In a further embodiment, remaining bulk source material is removed by centrifuging the dispersion prepared in step b) of the process at a centrifugation speed of 200 to 1800 rpm. In yet another embodiment, remaining bulk source material is removed by centrifuging the dispersion prepared in step b) of the process at a centrifugation speed of 500 to 1500 rpm. In each of these embodiments, the dispersion may be subjected to a second centrifugation at a speed of either 2000 to 6000 rpm, 3000 to 5000 rpm, or 3000 to 4000 rpm.

In another embodiment, remaining bulk source material is removed by centrifuging the dispersion prepared in step b) of the process at a centrifugation speed of 500 to 1500 rpm. In a further embodiment, remaining bulk source material is removed by centrifuging the dispersion prepared in step b) of the process at a centrifugation speed of 700 to 1300 rpm. In yet another embodiment, remaining bulk source material is removed by centrifuging the dispersion prepared in step b) of the process at a centrifugation speed of 900 to 1100 rpm. In each of these embodiments, the dispersion may be subjected to a second centrifugation at a speed of either 3000 to 4000 rpm, 3200 to 3800 rpm, or 3400 to 3600 rpm. In addition, in each of these embodiments, the duration of the centrifugation may be from 5 minutes to 4 hours, with a time of 15 minutes to 1 hour (e.g. approximately 20 minutes) being preferred.

The resultant dispersion will therefore comprise the nanosheets dispersed in the first aqueous medium and little or no remaining bulk source material.

Step d)

Following the formation of the nanosheets in the first aqueous medium in step b), and optionally the removal of any larger particles of residual source material in step c), it is necessary to separate the nanosheets from the first aqueous medium (and any excess stabiliser that it may comprise) and re-disperse the nanosheets in an aqueous vehicle.

In an embodiment, you may proceed directly to steps f) and g) after step b) or step c).

It may, however, be desirable to subject the nanosheets to some additional washes prior to step f) and step g) of the process.

In optional step d), the dispersed nanosheets are separated from the aqueous medium following either step b) or step c) of the process and then re-dispersed in a further aqueous medium.

The further aqueous medium may be the same as the aqueous vehicle of the ink formulation that is defined hereinbefore. Alternatively, it may just be water or water comprising a surface tension modifier as defined herein.

The separation of the nanosheets from the aqueous medium can be facilitated by any suitable separation technique known in the art. For example, suitable microfiltration, nanofiltration or dialysis techniques may be used. In an embodiment, the nanosheets are separated from the aqueous medium by centrifugation. Selecting appropriate centrifuge conditions enables the deposition of the nanosheets present in the dispersion generated following step b) or step c). Following centrifugation, the aqueous medium can be removed and optionally recycled for use again in steps a) and b) of the process. The nanosheets are then re-dispersed in a further aqueous medium.

In an embodiment, nanosheets are separated from the aqueous medium by centrifuging the dispersion prepared in step b) or step c) of the process at a centrifugation speed of 14000 to 16000 rpm. In a further embodiment, nanosheets are separated from the aqueous medium by centrifuging the dispersion prepared in step b) or step c) of the process at a centrifugation speed of 14500 to 16000 rpm. In yet another embodiment, nanosheets are separated from the aqueous medium by centrifuging the dispersion prepared in step b) or step c) of the process at a centrifugation speed of 14500 to 15500 rpm. In each of these embodiments, the duration of the centrifugation may be from 5 minutes to 4 hours, with a time periods of 40 to 120 minutes, or 50 to 100 minutes, or 55 to 75 minutes being generally preferred.

Step e)

Step e) is a further optional step in which the nanosheets dispersed in the aqueous medium prepared in step d) is then subject to one or more additional washes in which the nanosheets are separated from the aqueous medium and the redispersed in a new aqueous medium. This separation and re-dispersion process may be repeated multiple times if necessary.

As with step d) above, the further aqueous medium may be the same as the aqueous vehicle of the ink formulation defined hereinbefore. Alternatively, it may be just be water or water comprising a surface tension modifier as defined herein.

The separation from the aqueous medium and re-dispersion in a new aqueous medium can be facilitated in an identical manner to that described above in relation to step d).

Step f)

In step f), the dispersed nanosheets are separated from the aqueous medium following any one of steps b), c), d) and e) of the process.

The separation on nanosheets from the aqueous medium is performed in an identical manner to that described above in relation to step d).

Step g)

In step g), the nanosheets collected in step f) are re-dispersed in an aqueous vehicle comprising at least one surfactant and at least one viscosity modifier to form an ink formulation of the present invention.

In an embodiment of step g) of the present invention, the nanosheets collected in step f) are re-dispersed in an aqueous vehicle comprising at least one surfactant, at least one viscosity modifier and at least one binder to form an ink formulation of the present invention.

In a further embodiment of step g) of the present invention, the nanosheets collected in step f) are re-dispersed in an aqueous vehicle comprising a surfactant, a viscosity modifier and a binder to form an ink formulation of the present invention.

As any excess stabiliser is removed by optional steps d) and e) and/or the mandatory step f) of the process, and the aqueous vehicle will have a low concentration of stabiliser and may even be free of additional stabiliser altogether. There will be some stabiliser still present as it associates with the nanosheets during step b) of the process, but the amount of excess stabiliser in the aqueous vehicle will be minimised.

Applications

As hereinbefore discussed, the ink formulations of the present invention are useful for the inkjet printing of films or tracks as coatings or in the formation of printed electronics.

Thus, in another aspect, the present invention provides the use of an ink formulation as defined herein for the production of inkjet printed films and/or tracks.

Thus, if the inorganic material is graphene, then the film or track will be an electrically conductive film or track.

According to a further aspect, the present invention provides a film and/or track prepared by the inkjet printing of an ink formulation as defined herein onto a substrate.

The film and/or track is formed by the inkjet printing of the ink onto a substrate, followed by removing (preferably evaporation) of the liquid components.

Any suitable substrate may be used. Particular examples of suitable substrates include glass, plastic or ceramics. Exemplary substrates include silicon (optionally containing a thin $SiO_2$ surface layer), quartz and polyimide.

According to a further aspect of the present invention, there is provided an electronic device or component comprising a film or track according to the fourth aspect of the present invention.

Examples of devices or components include antenna elements (such as RFID or devices), sensor elements, light emitting diodes, photovoltaic cells, tactile screens (touch panels) or thin film transistors (TFTs).

In an embodiment, the devices are obtainable by, obtained by or directly obtained by inkjet printing of said films and/or tracks, as defined herein.

In particular, the electronic device may be, or may comprise, a photovoltaic cell in which the light harvesting portion is a two-dimensional heterostructure comprising at least the following layers:

a first electrode layer which comprises graphene or modified graphene (e.g. doped graphene);

a thin film comprising a plurality of single layer or few-layered particles of a transition metal dichalcogenide; and a second electrode layer;

wherein the layers are stacked sequentially to form a laminate structure and the or each thin film of transition metal dichalcogenide is situated between the first and the second electrode layer and the or each thin film of transition metal dichalcogenide layer is in electrical contact with both electrodes.

The second electrode layer may also comprise graphene. The transition metal dichalcogenide may be $MoS_2$ or $WS_2$.

The device may be, or comprise, a photodetector, the photodetector comprising:
a gate electrode;
a layer of graphene connected to a source electrode and a drain electrode; and
a thin film comprising a plurality of single layer or few-layered particles of an inorganic layered material in contact with and situated between both the graphene layer and electrode and the gate electrode.

The inorganic layered material may be h-BN.

The electronic device may be a transistor comprising:
a source electrode;
a drain electrode; and
a thin film comprising a plurality of single layer or few-layered particles of an inorganic layered material in contact with, and situated between, both the source electrode and the drain electrode
wherein at least one of the source electrode and drain electrode comprises graphene and the other electrode comprises a layer of a conductive material.

It may be that both the source electrode and the drain electrode comprise graphene.

The thin film may comprise a plurality of single layer or few layer particles of h-BN. Alternatively, it may comprise a plurality of single layer or few layer particles of a transition metal dichalcogenide (e.g. $MoS_2$).

Where the device comprises a layer of graphene, that graphene layer may independently comprise a thin film of graphene flakes. Alternatively, that graphene layer may comprise a single crystal of graphene. Thus, the graphene may have been produced by mechanical exfoliation or by chemical vapour deposition.

The thin film may in fact comprise a plurality of thin films arising respectively from a plurality of individual deposition steps.

It may be that the or each thin film (e.g. of an inorganic material or of graphene) contains at least one polycyclic aromatic compound; wherein the or each polycyclic aromatic compound independently has a ring system which comprises from 2 to 6 fused benzene rings, the ring system being substituted with from 1 to 4 hydrophillic groups each independently consisting of less than 20 atoms. The polycyclic aromatic compound may not be a significant component of the thin film but it will still be present in a detectable amount.

The methodology described herein may further comprise one or more post-processing steps applied to the thin film or track. For example, the methodology described herein may comprise the step of washing the thin film or track (e.g. with water or an aqueous solution) to reduce the amount of the polycyclic aromatic compound present in the device. This step may remove all of the polycyclic aromatic compound but more typically small amounts of the polycyclic aromatic compound will remain in the thin film or track. Alternatively, or in addition, the thin film or track may be annealed by heating the film/track to an elevated temperature for a specified period of time.

The graphene-containing inks defined herein, and/or the resultant tracks formed by these inks, possess high thermal conductivities, which means that they could be used in thermal management applications. Suitably, the graphene inks, and/or the tracks derived therefrom, possess thermal conductivities within the range 30-100 W/mK, e.g. within the range 50-80 W/mK. Certain other inks of the present invention, such as, for example, inks comprising hBN may also possess good thermal conductivity properties.

In another aspect of the present invention, there is provided an electronic system comprising one or more electronic devices, as defined herein, connected together either in series or in parallel. Suitably, the present invention further provides an electronic system comprising an array of electronic devices, as defined here.

In an embodiment, the system comprises one or more electronic devices, as defined herein, printed on top of one another (i.e. vertically). Such layered electronic devices are difficult to achieve, particularly through inkjet printing. Thus, the present invention provides a novel solution to this problem.

The ink formulations of the present invention have also been found to be biocompatible. That is, the inkjet formulations of the present invention have been demonstrated to exhibit no significant cytotoxicity in certain model cell lines (see FIGS. 54 and 55). As a consequence, the inkjet formulations of the present invention are suitable for use in biomedical applications (e.g. use in biological media, biological environments and/or in contact with a human or animal body).

In an embodiment, the present invention provides the use of an ink formulation as defined herein for the production of films and/or tracks and/or coatings for biomedical applications. Suitably, the present invention provides the use of an ink formulation as defined herein for the production of films and/or tracks and/or coatings for use in a biological media and/or a biological environment.

EXAMPLES

Embodiments of the invention will be described, by way of example only, with reference to the accompanying drawings, in which.

Figure 35:
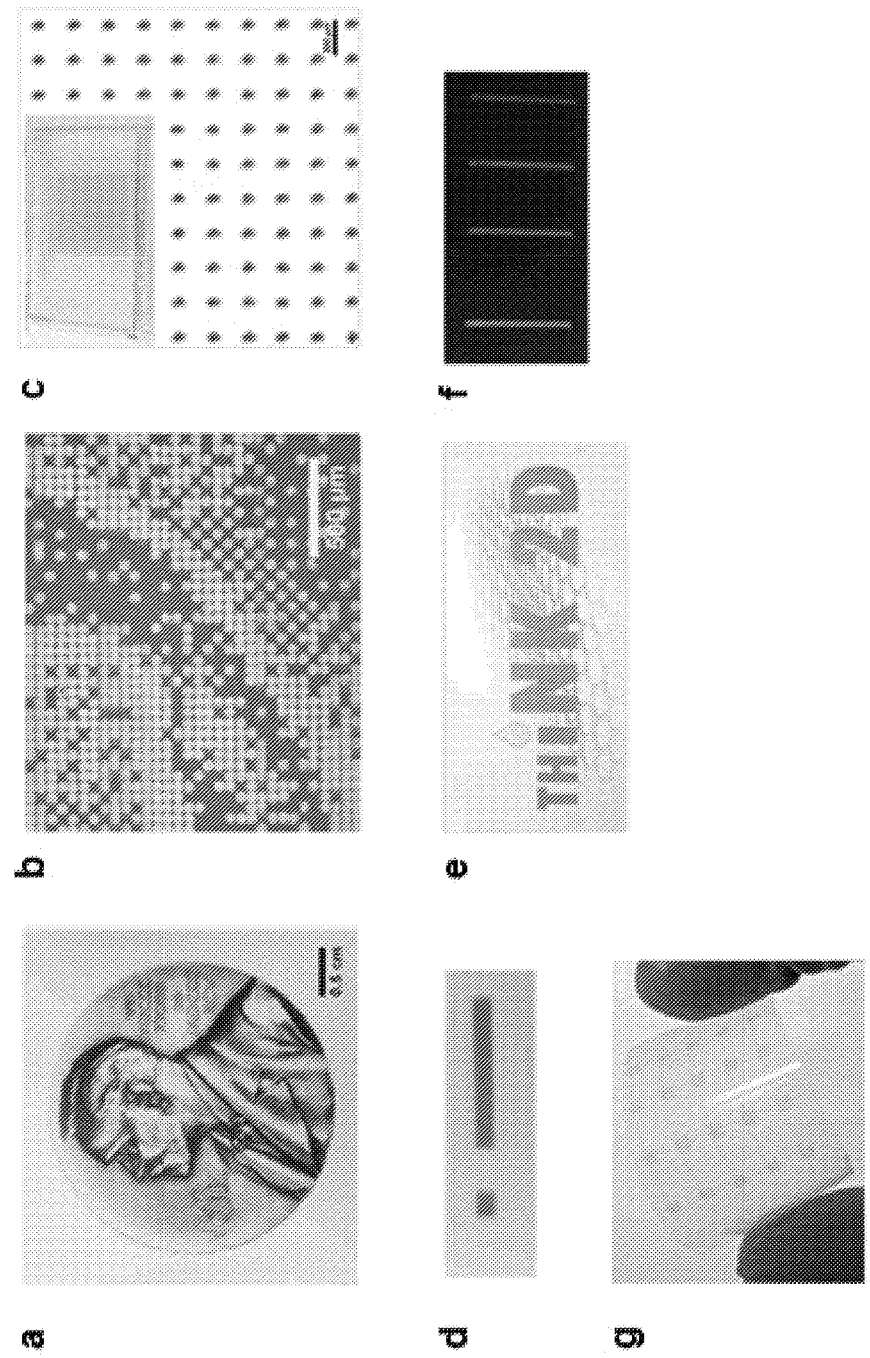

FIG. 35 shows a) Nobel prize medal printed with a graphene ink on PEL60 paper. b) Zoom of the ear lobe from the Nobel medal in a). c) Graphene dots of ≈50 µm in size, printed on an area of 1 cm×1 cm on glass (inset: optical picture of the glass slide with the dots array). d) printed line of $Bi_2S_3$ (≈1 cm in length) on PEL60 paper. e) thINK2D logo (≈3 cm×5 cm) made with graphene and $WS_2$ (used for the drop on top of the e) inks on PEL60 paper. f) Printed lines (≈2 cm in length) obtained with BN inks with 20-40 printing passes on silicon. g) Optical picture of an array of all-printed Gr/WS/Gr heterostructures on plastic.

Figure 36:
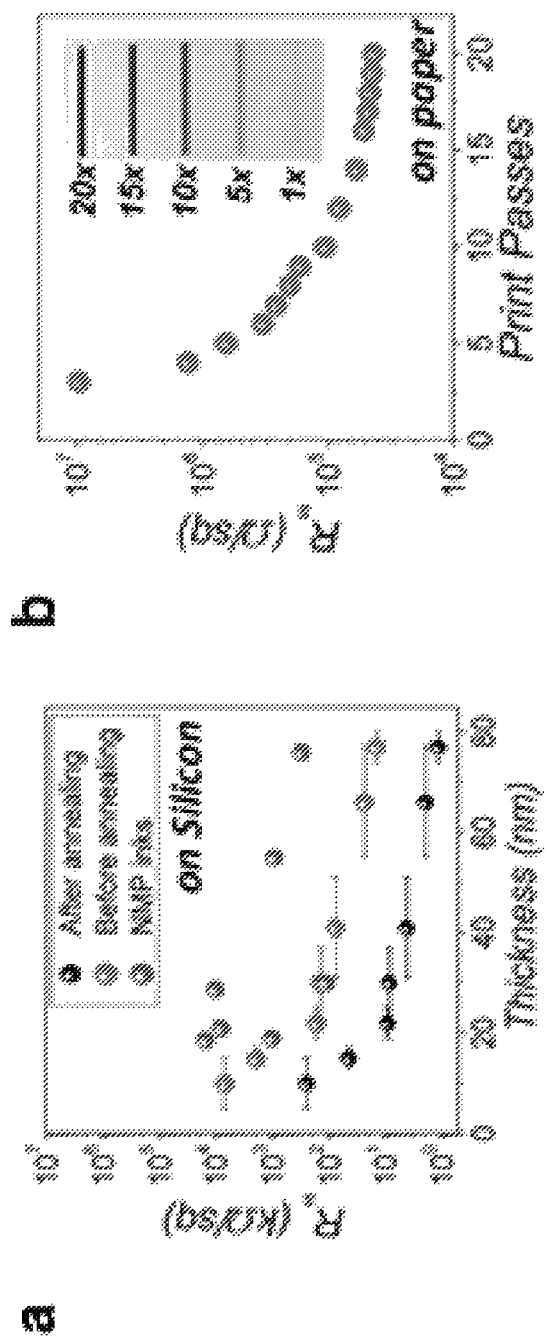

FIG. 36 shows a) Sheet resistance as a function of the thickness of graphene lines (1 cm length) printed on silicon, before and after annealing. The data is compared with the sheet resistance reported for NMP-based graphene inks from Blake et al, Nano Letters 8, 1704-1708. b) Sheet resistance for increasing number of printed passes for graphene lines (2 cm length) printed on paper PEL 60 (inset shows the optical pictures of the printed lines made with 1, 5, 10, 15 and 20 printed passes, from bottom to top).

Figure 37:
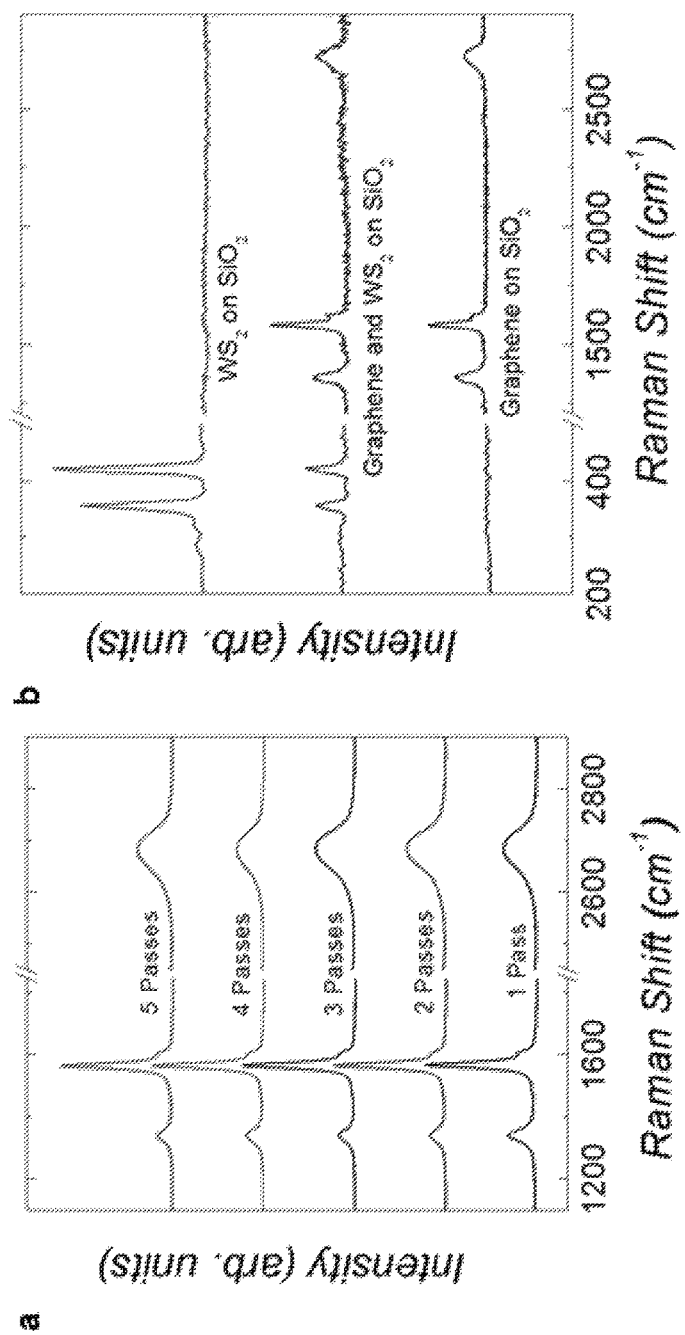

FIG. 37 shows a) Raman spectra of graphene lines printed onto $SiO_2$ with increasing numbers of passes. b) Raman spectra taken of different regions of a $Gr_B/WS_2/Gr_T$ heterostructure printed onto $SiO_2$.

Figure 38:
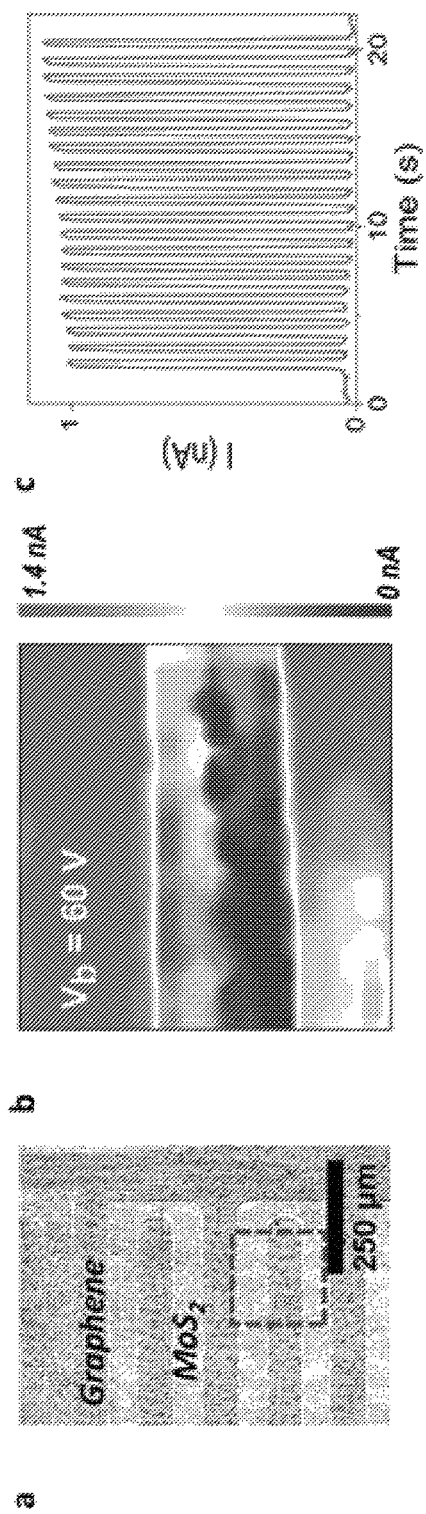

FIG. 38 shows a) Optical picture of a fully printed in-plane photodetector that consists of a graphene interdigitated electrodes array with $MoS_2$ used as photo-active material. b) Photocurrent map measured on an area of ≈200 µm×200 µm (red dotted square in a) collected at λ=514.5 nm and power density=0.2 mW/µm² with a bias voltage of 60V using a WiTEC Alpha 300 confocal microscope. c) Photocurrent I generated by switching on and off the laser for 20 times in 20 seconds.

Figure 39:
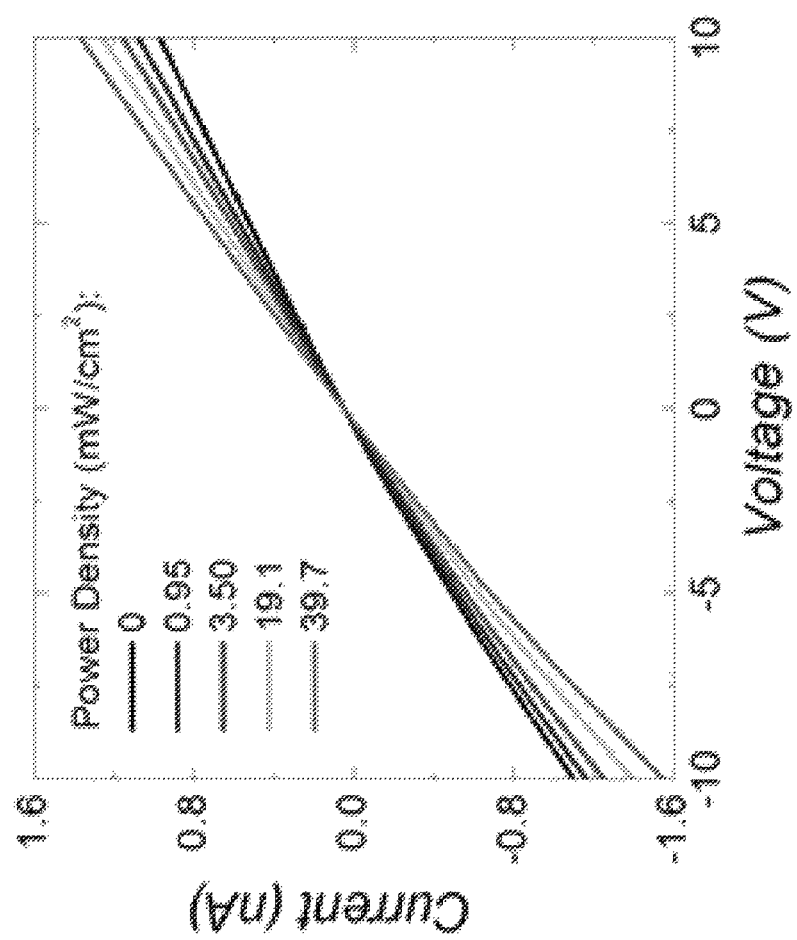

FIG. 39 shows I-V curve of a $MoS_2$/Gr in-plane photodetector with varying laser power density. (λ=488 nm)

Figure 40:
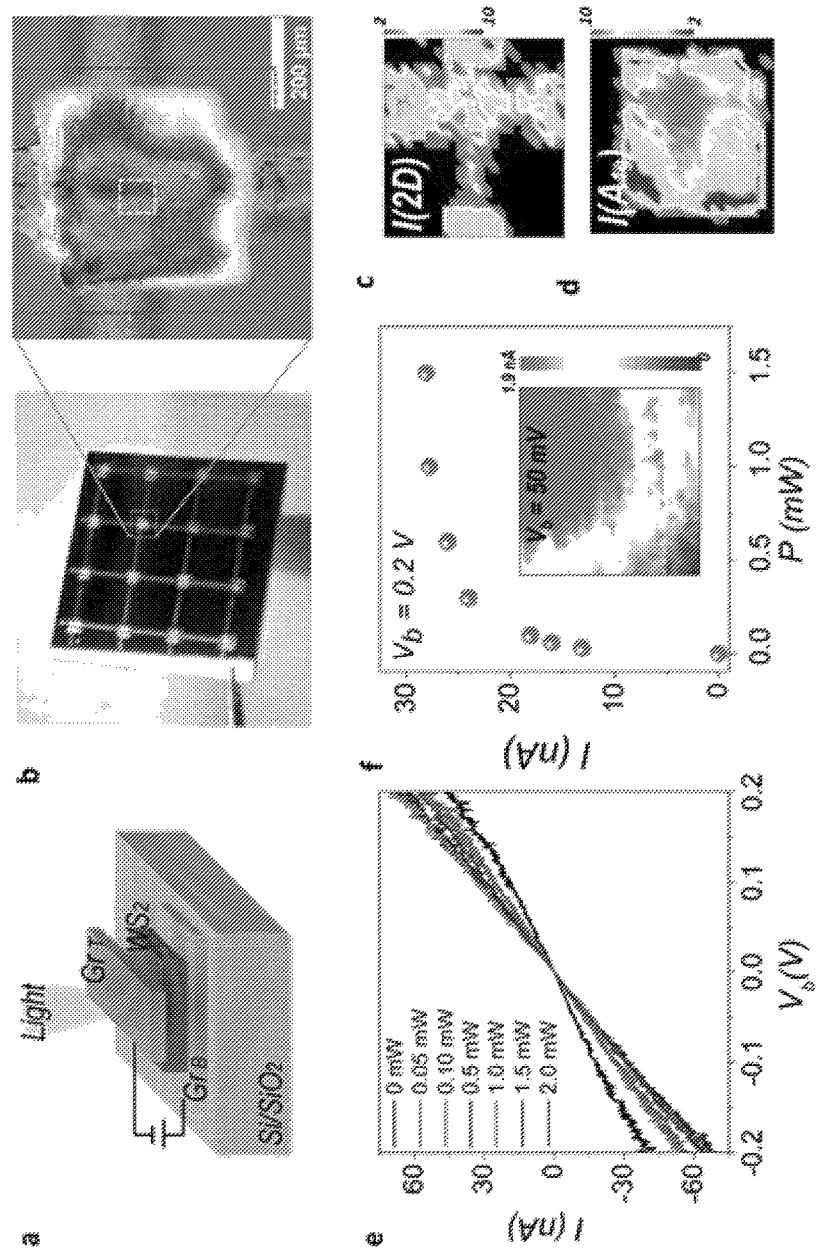

FIG. 40 shows fully inkjet printed heterostructures. a) Schematic of an all-printed $Gr_B/WS_2/Gr_T$ heterostructures on silicon substrate. b) (left panel) Optical picture of an array of 4×4 $Gr_B/WS_2/Gr_T$ heterostructures printed on silicon; (right panel) Optical picture of one of the heterostructures, showing the two graphene electrodes and the square of photo-active material; c) Raman map measured on the red dotted square in b) (right panel) showing the intensity of the 2D peak and the $A_{1g}$ peak (d). e) I-$V_b$ curves measured under different laser power (at 488 nm); f, photo-current measured at $V_b$=200 meV as a function of the laser power; inset, photo-current map measured on the white dotted square in b), right panel.

Figure 41:
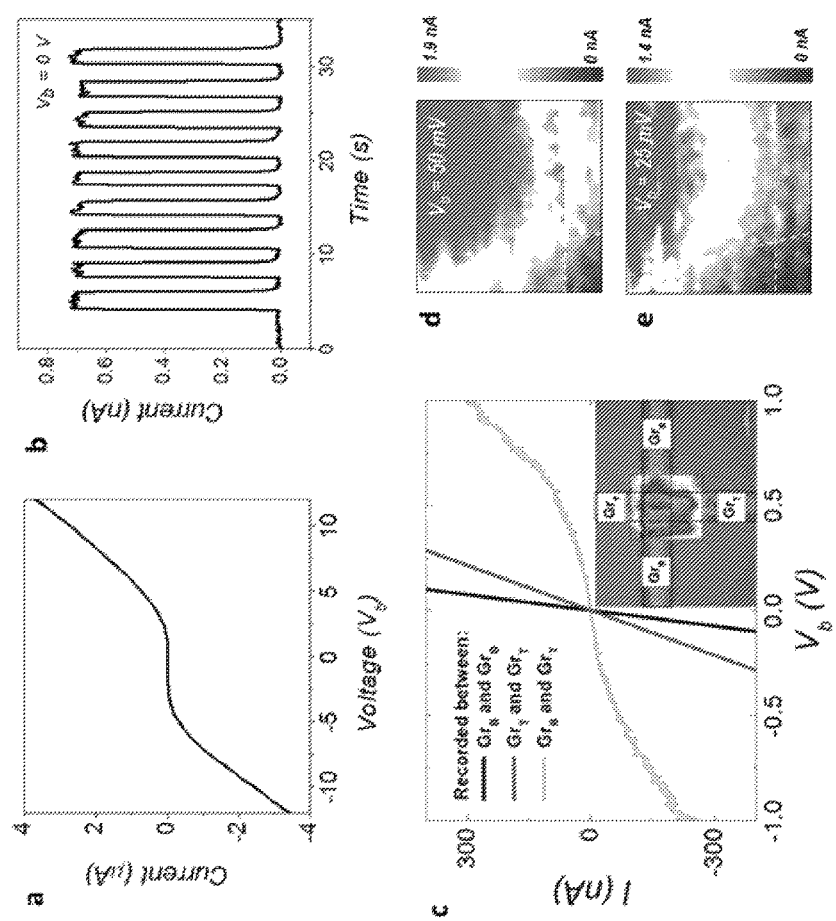

FIG. 41 shows photo-current measurements on a $Gr_B/WS_2/Gr_T$ heterostructure printed onto $SiO_2$. a) I-V curve in the range from −10V to 10V without photo-excitation. b) Photo-current measured in the same device undergoing periodic illumination with $V_b=0$ ($\lambda=488$ nm and 0.5 mW laser power. c) I-V curves measured recorded across the same and/or different graphene lines. d) and e) Photocurrent maps measured at $V_b=50$ mV and e, $V_b=25$ mV respectively. The map is measured in the white dotted square in FIG. 44b.

Figure 42:
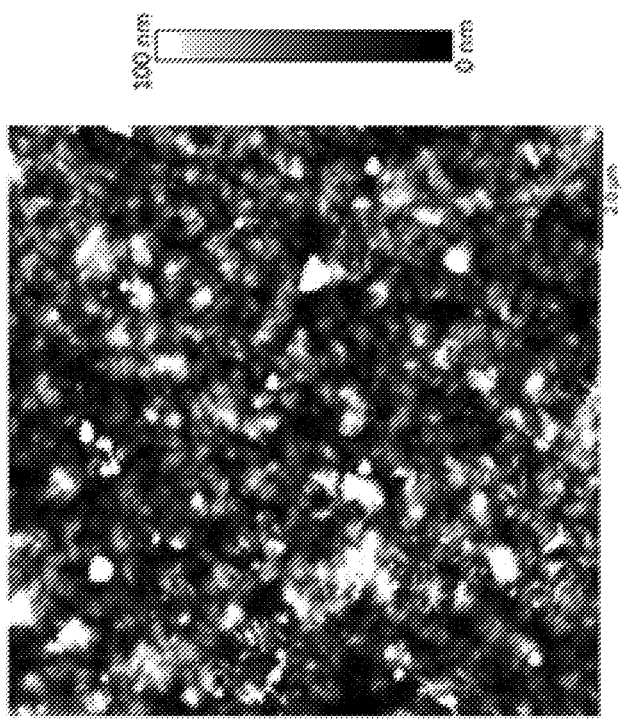

FIG. 42 shows AFM height scan of a 10×10 µm area at the centre of a $Gr_B/WS_2/Gr_T$ device.

Figure 43:
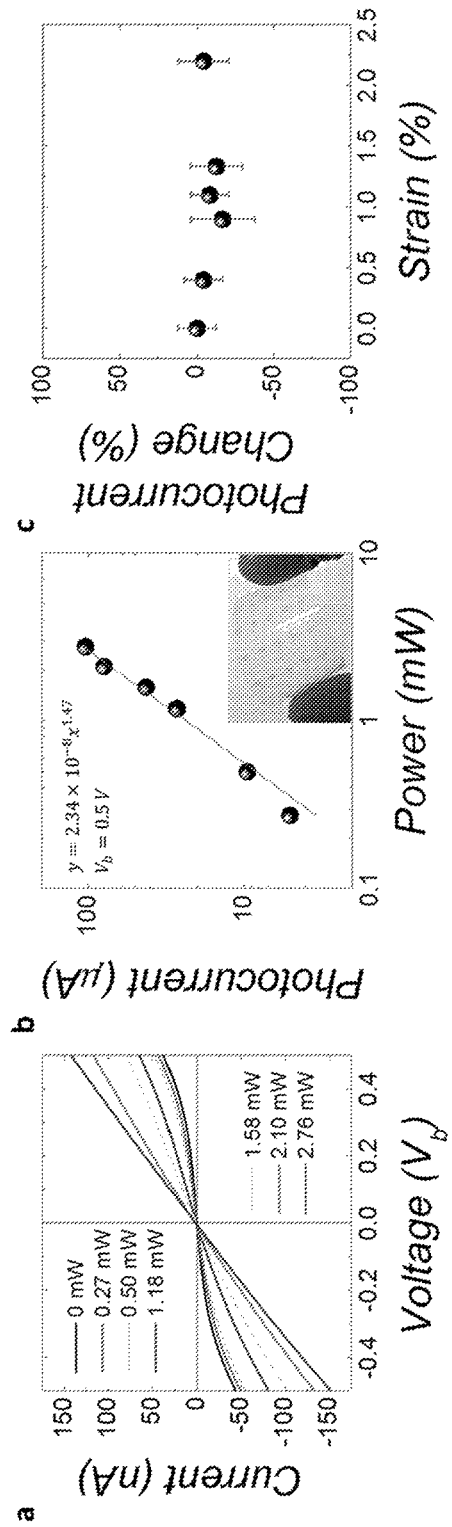

FIG. 43 shows flexible heterostructures printed onto plastic. a) I-$V_b$ curves of an all-printed $Gr_B/WS_2/Gr_T$ heterostructures on PET plastic as a function of increasing laser power. b) photo-current measured at $V_b=0.5$ V as a function of increasing laser power. The inset shows the optical picture of an array of 20 heterostructures printed on PET plastic. c) Bending test shows that the photo-current of an all-printed $Gr_B/WS_2/Gr_T$ heterostructures on PET plastic is stable up to ≈2.3% strain.

Figure 44:
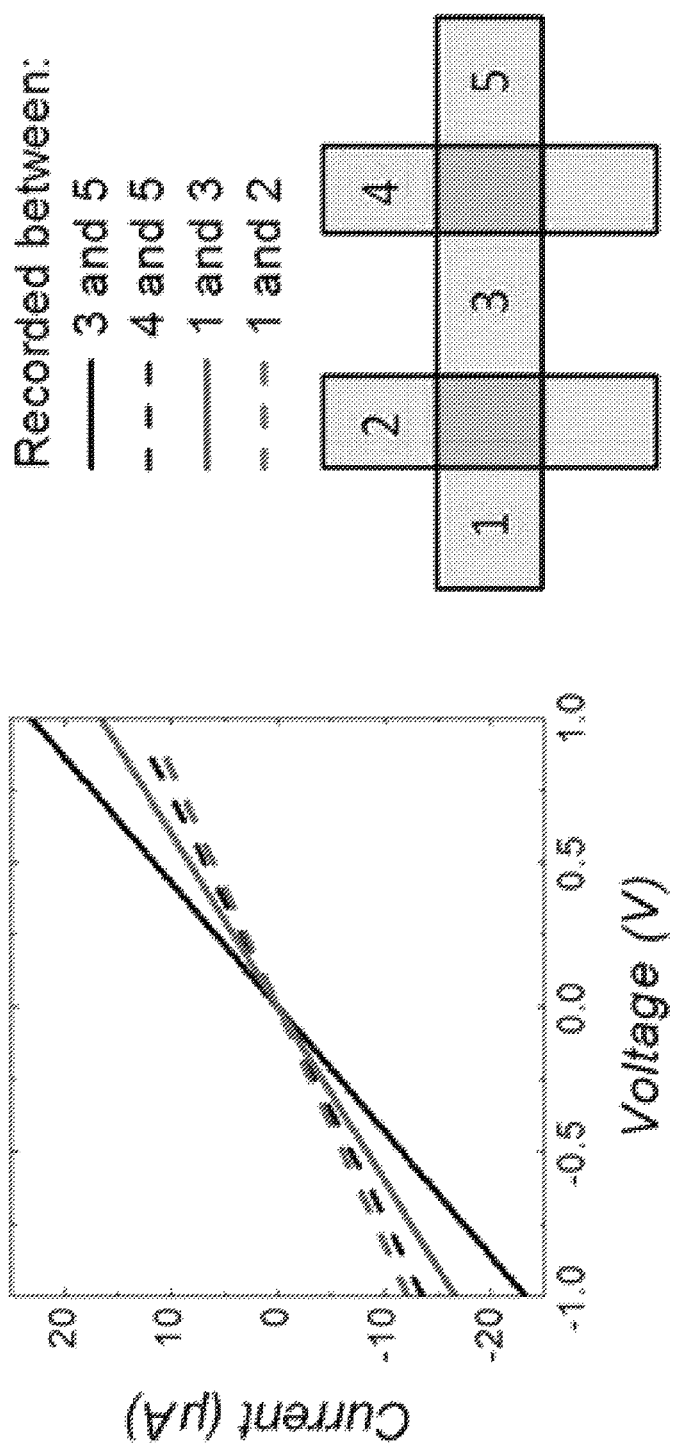

FIG. 44 shows three Graphene lines (one horizontal, used as bottom electrode and two vertical, used as top electrodes) printed on silicon without a $WS_2$ spacer showing the formation of ohmic contacts.

Figure 45:
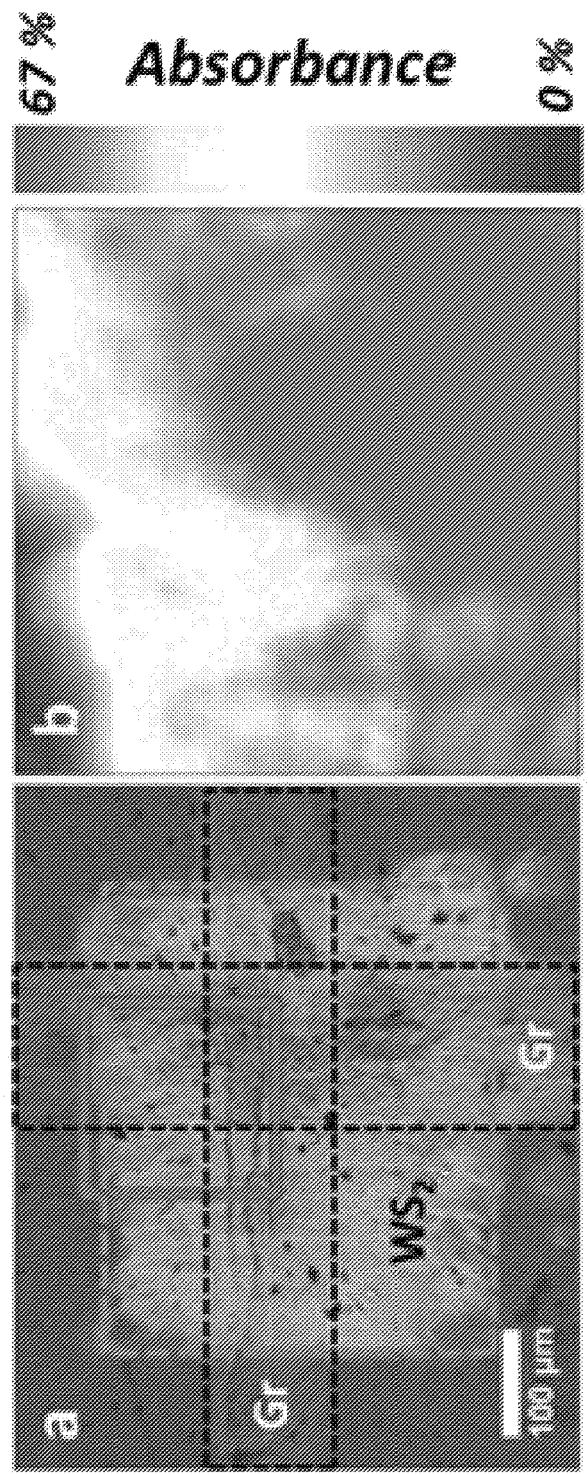

FIG. 45 shows absorption measurements of a $Gr_B/WS_2/Gr_T$ heterostructure printed onto PI. a) Optical image of the heterostructure. The red square indicates the area where the measurement was performed. b) absorbance map.

Figure 46:
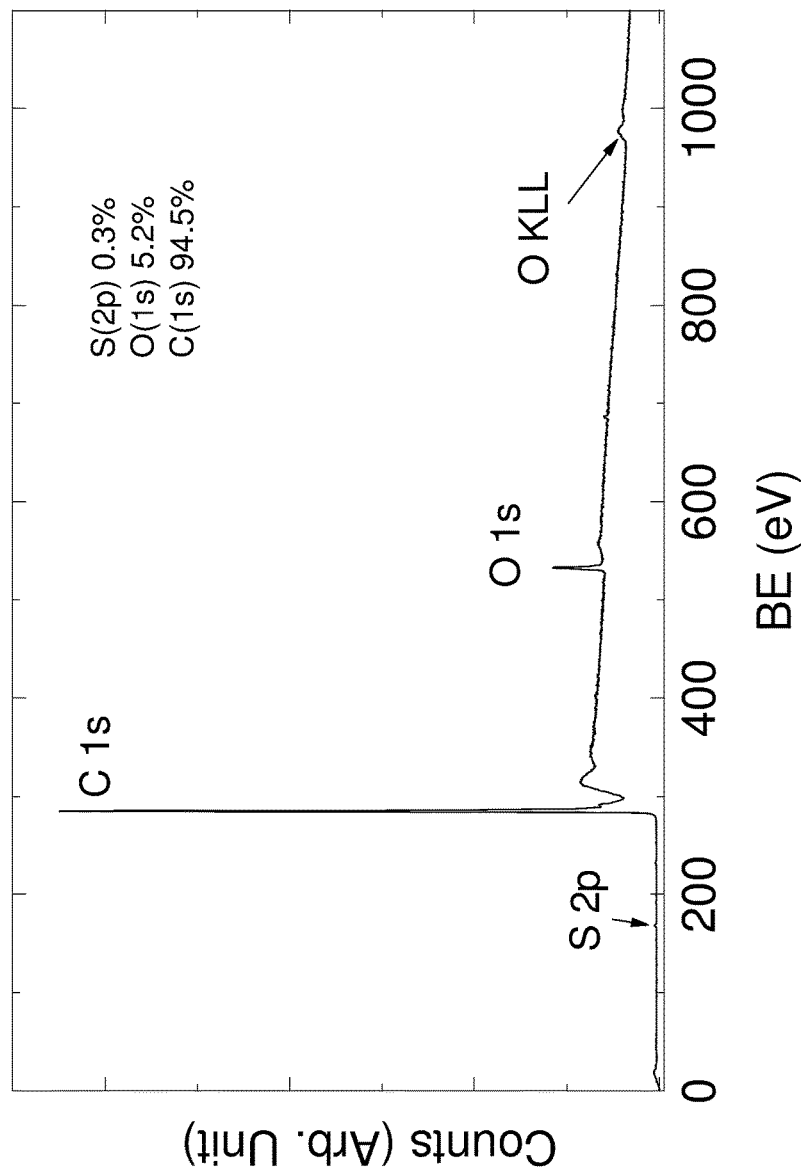

FIG. 46 shows XPS spectra of dried graphene ink giving residual PS1 concentration of 9.13 WT %. The inset shows the percentage of elements observed.

Figure 47:
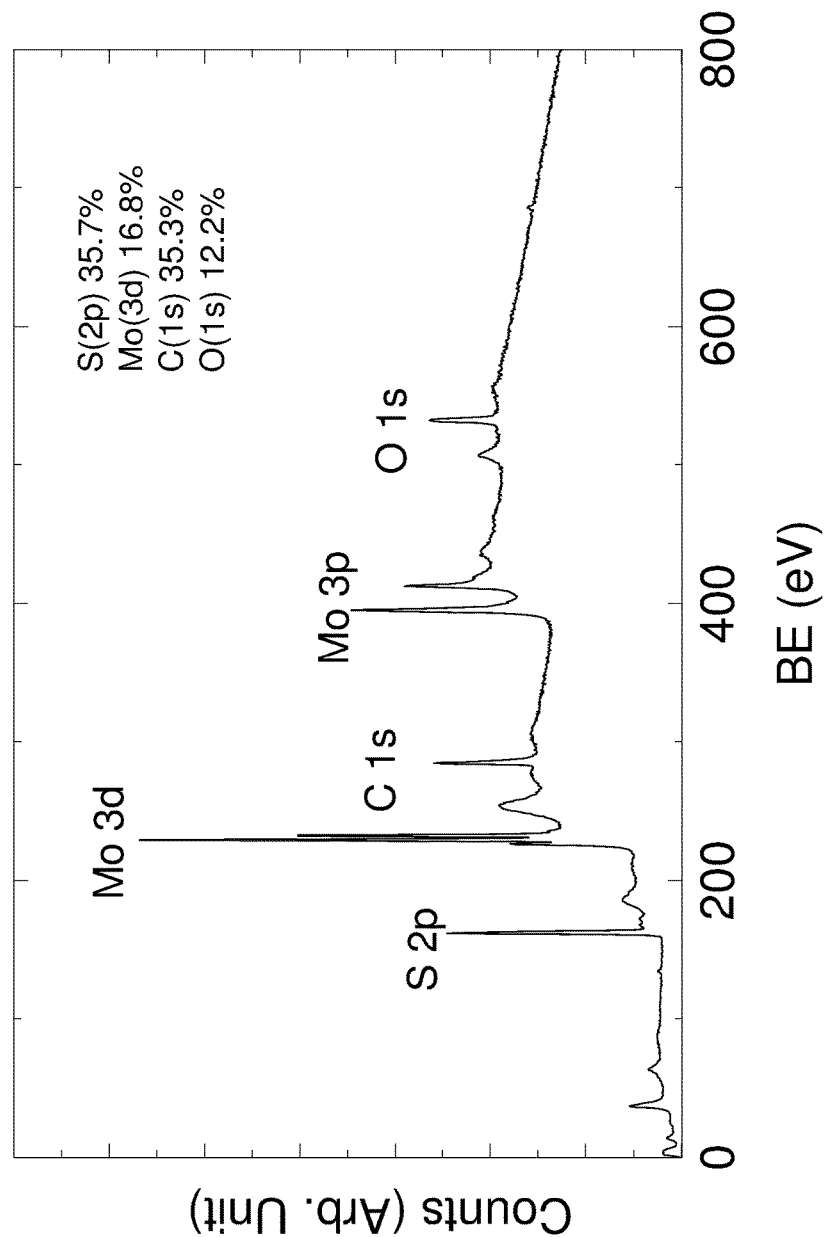

FIG. 47 shows XPS spectra of dried $MoS_2$ ink giving residual PS1 concentration of 8.37 WT %. The inset shows the percentage of elements observed.

Figure 48:
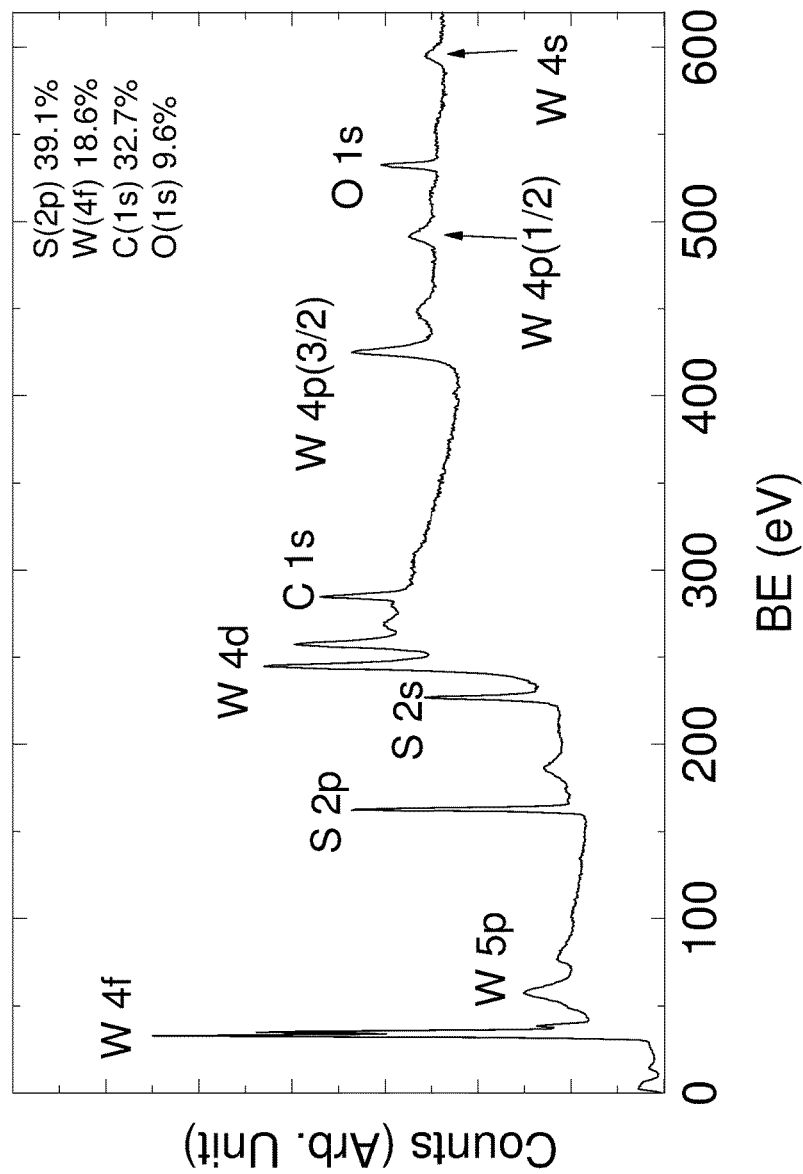

FIG. 48 shows XPS spectra of dried $WS_2$ ink giving residual PS1 concentration of 3.14 WT %. The inset shows the percentage of elements observed.

Figure 49:
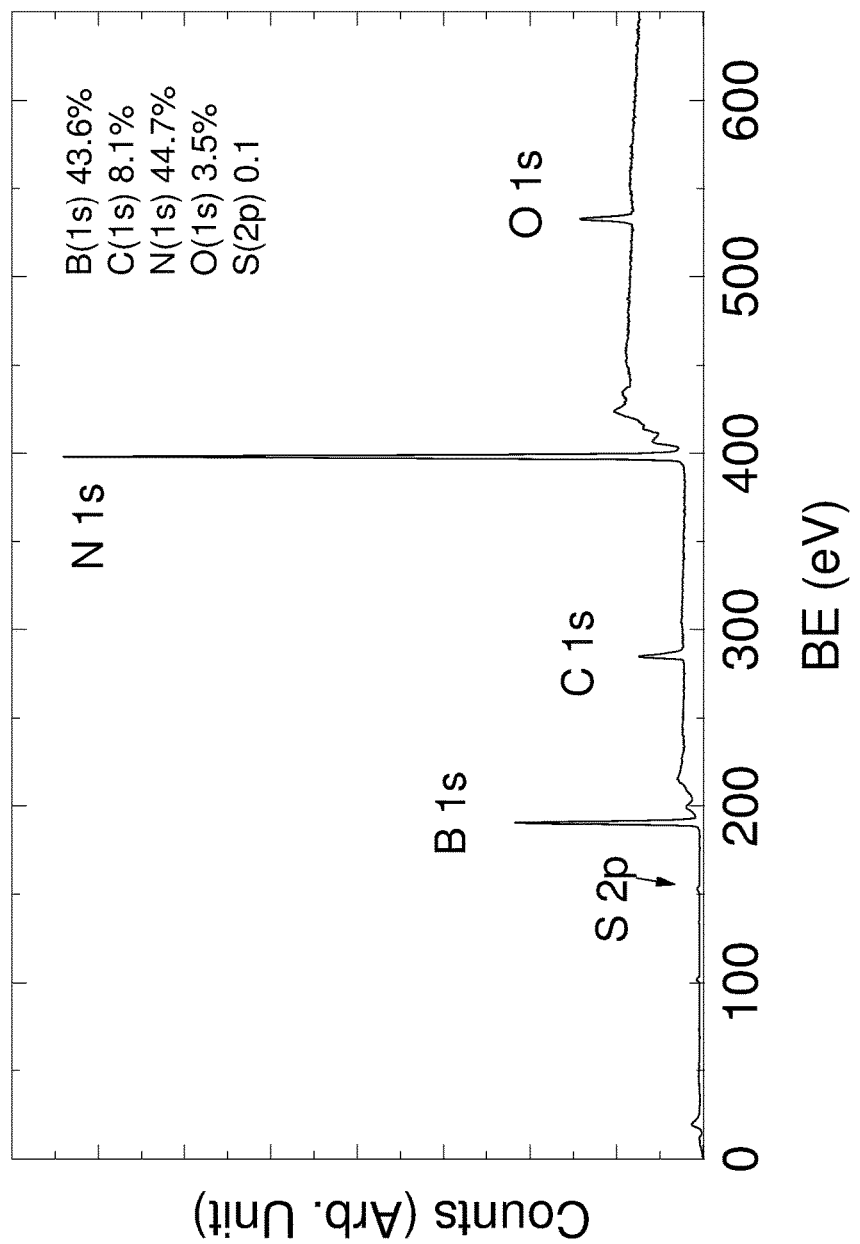

FIG. 49 shows XPS spectra of dried h-BN ink giving residual PS1 concentration of 2.34 WT %. The inset shows the percentage of elements observed.

Figure 50:
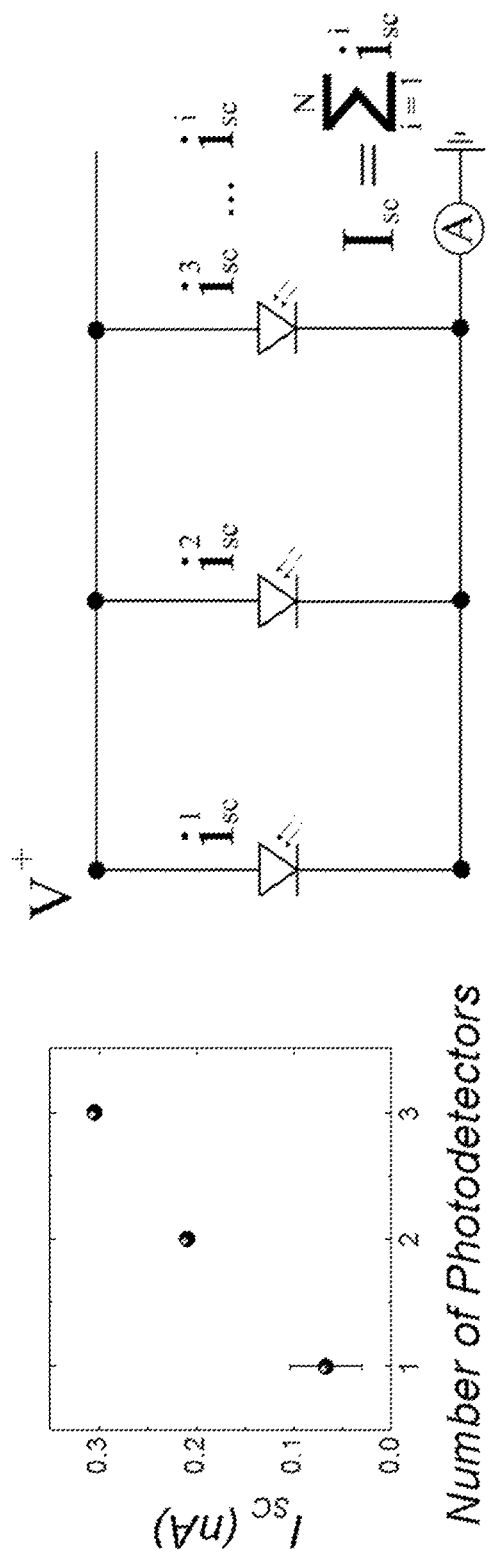

FIG. 50 shows the increase in short circuit current ($I_{SC}$) observed upon illumination of multiple heterostructure photodetectors printed onto glass and connected in parallel. The circuit diagram of the heterostructures is also depicted.

Figure 51:
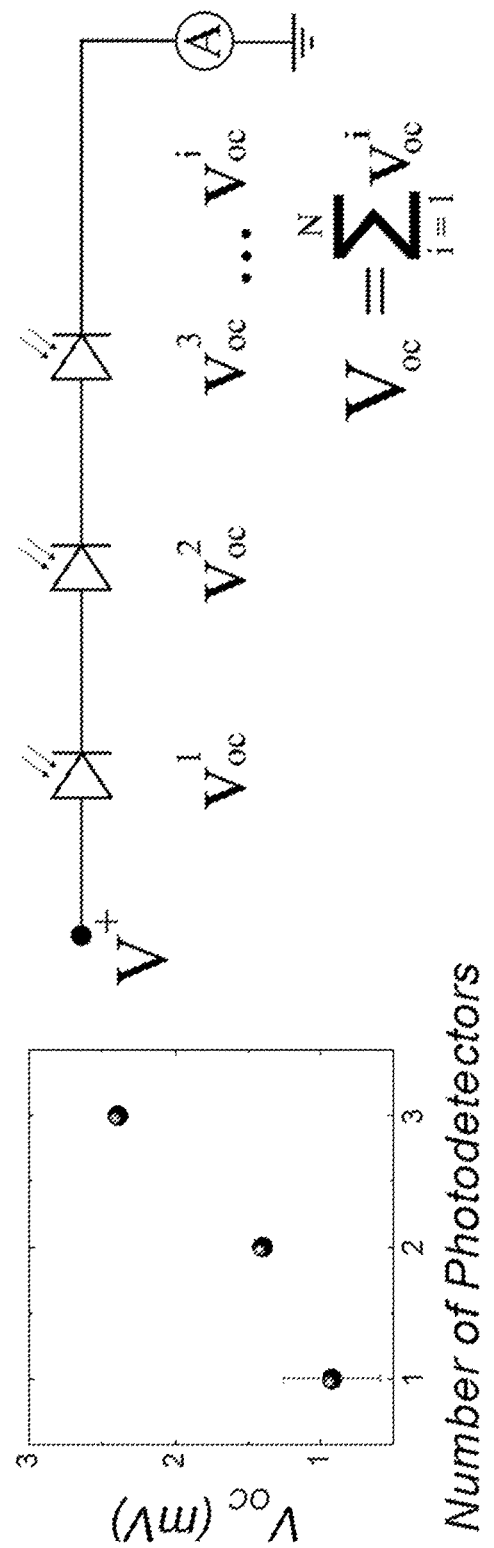

FIG. 51 shows the increase in open circuit voltage ($V_{OC}$) observed upon illumination of multiple heterostructure photodetectors printed onto glass and connected in series. The circuit diagram of the heterostructures is also depicted.

Figure 52:
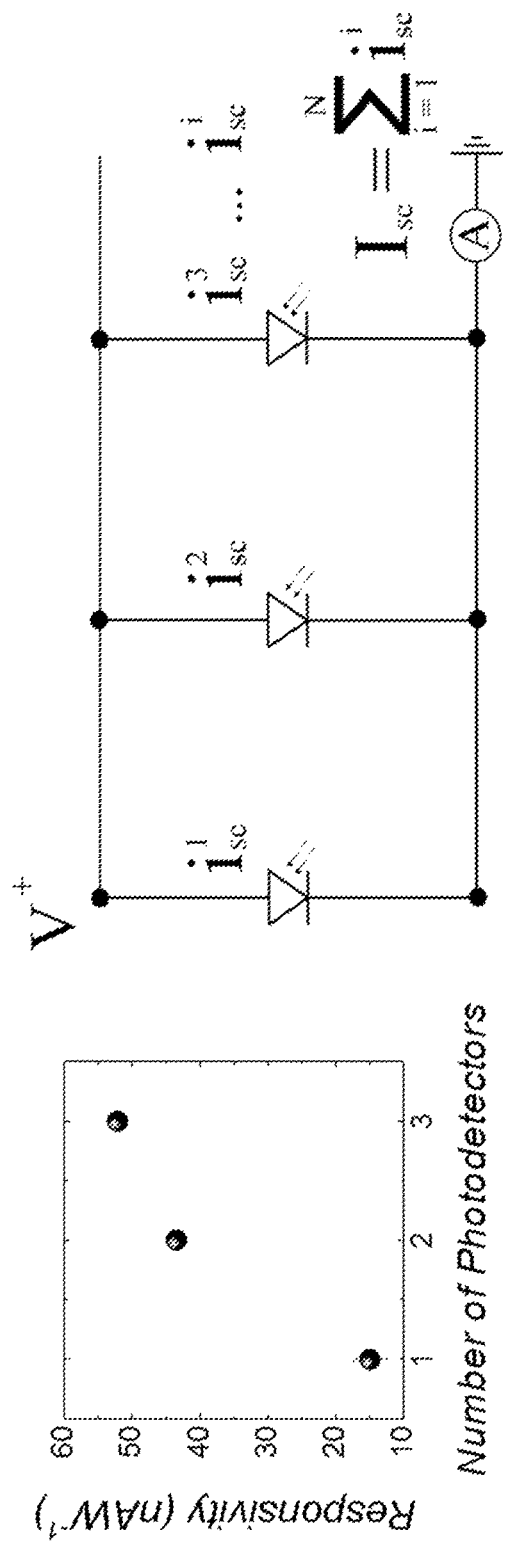

FIG. 52 shows the increase in responsivity observed upon illumination of multiple heterostructure photodetectors printed onto glass and connected in parallel. The circuit diagram of the heterostructures is also depicted.

Figure 53:
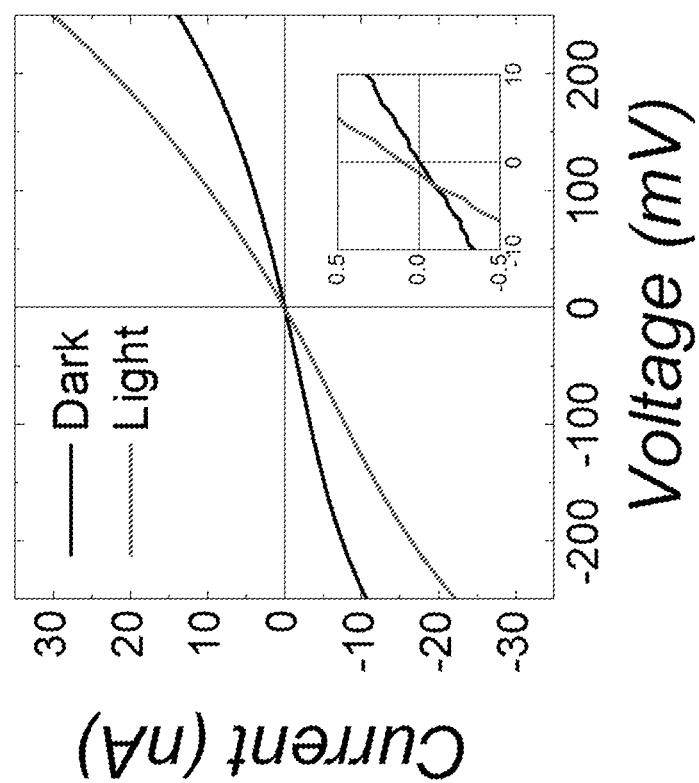

FIG. 53 shows the I-V characteristics of a photodetector heterostructure printed onto glass in dark and under illumination from a white light source with a power density of 395 mW cm$^{-2}$. Inset shows zoomed in region depicting $V_{OC}$ and $I_{SC}$.

Figure 54:
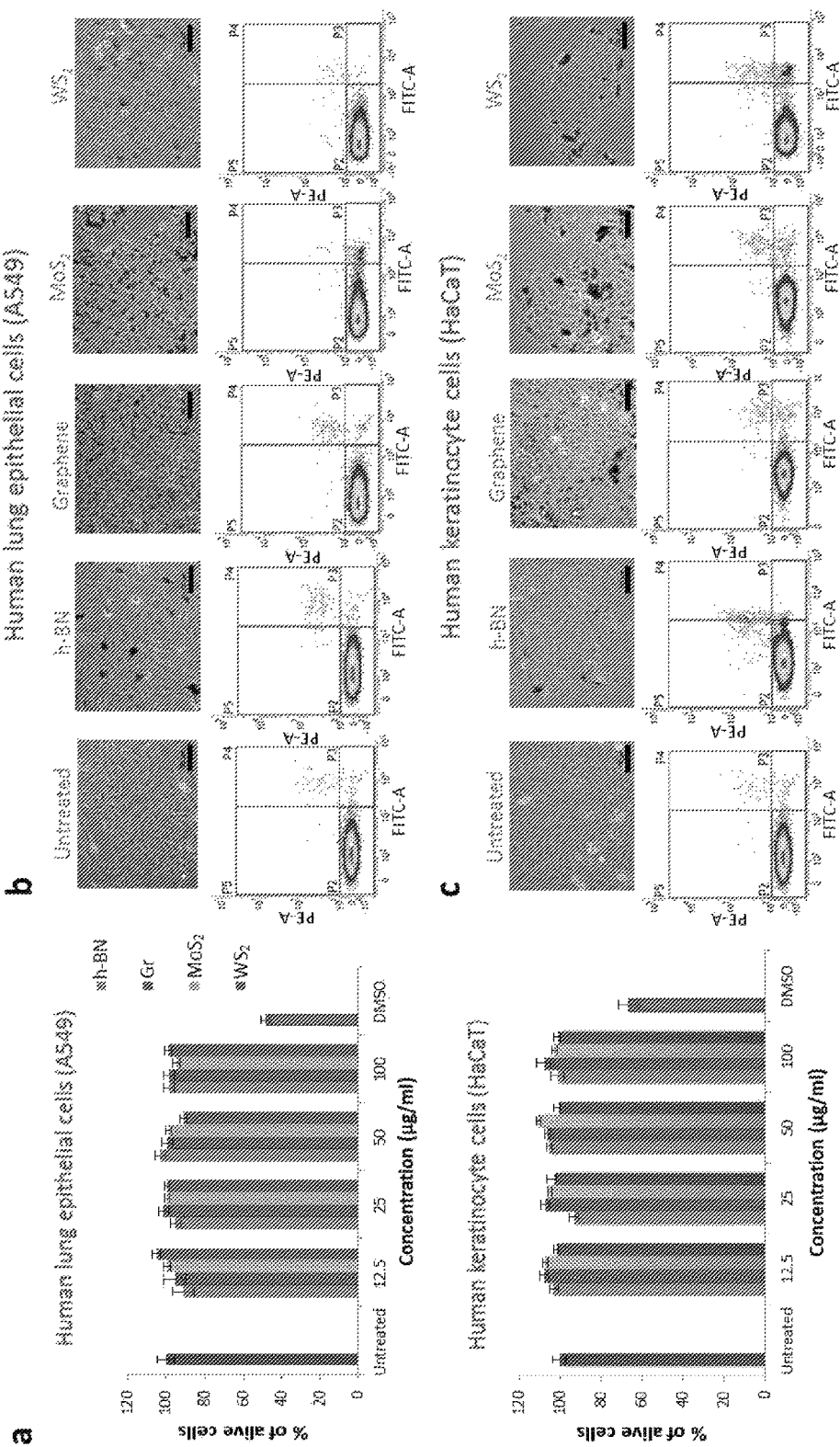

FIG. 54 shows cytotoxic responses of human lung (A549) and keratinocyte (HaCaT) cells to 2D crystals ink exposure. a, Assessment of the toxicity of the material using modified LDH assay in A549 and HaCaT cells. Cells were treated at escalating doses of the material for 24 h, lysed and centrifuged before the supernatant was carefully collected and incubated with the substrate for 15 min. Data are represented as mean±SD (n=6). b, and c, Top row: optical microscopy images of untreated and cells treated with 50 µg/ml boron nitride, graphene, molybdenum sulphide, tungsten sulphide inks for 24 h. Scale bars on the images are 100 µm. Bottom row: assessment of the toxicity of the material by flow cytometry using PI/Annexin V staining. After incubation with the material for 24 h, cells were harvested and labelled with Annexin V fluorochrome for 20 minutes. PI was added shortly before the analysis by flow cytometry to determine the % of unstained cells (alive cells, represented in the P2 region on the plots), Annexin V+/PI− cells (early apoptotic, represented in the P3 region), Annexin V−/PI+ cells (necrotic cells, represented in the P5 region) and Annexin V+/PI+ cells (late apoptotic and/or necrotic cells, shown in the P4 region). Data represented as mean±SD (n=3).

Figure 55:
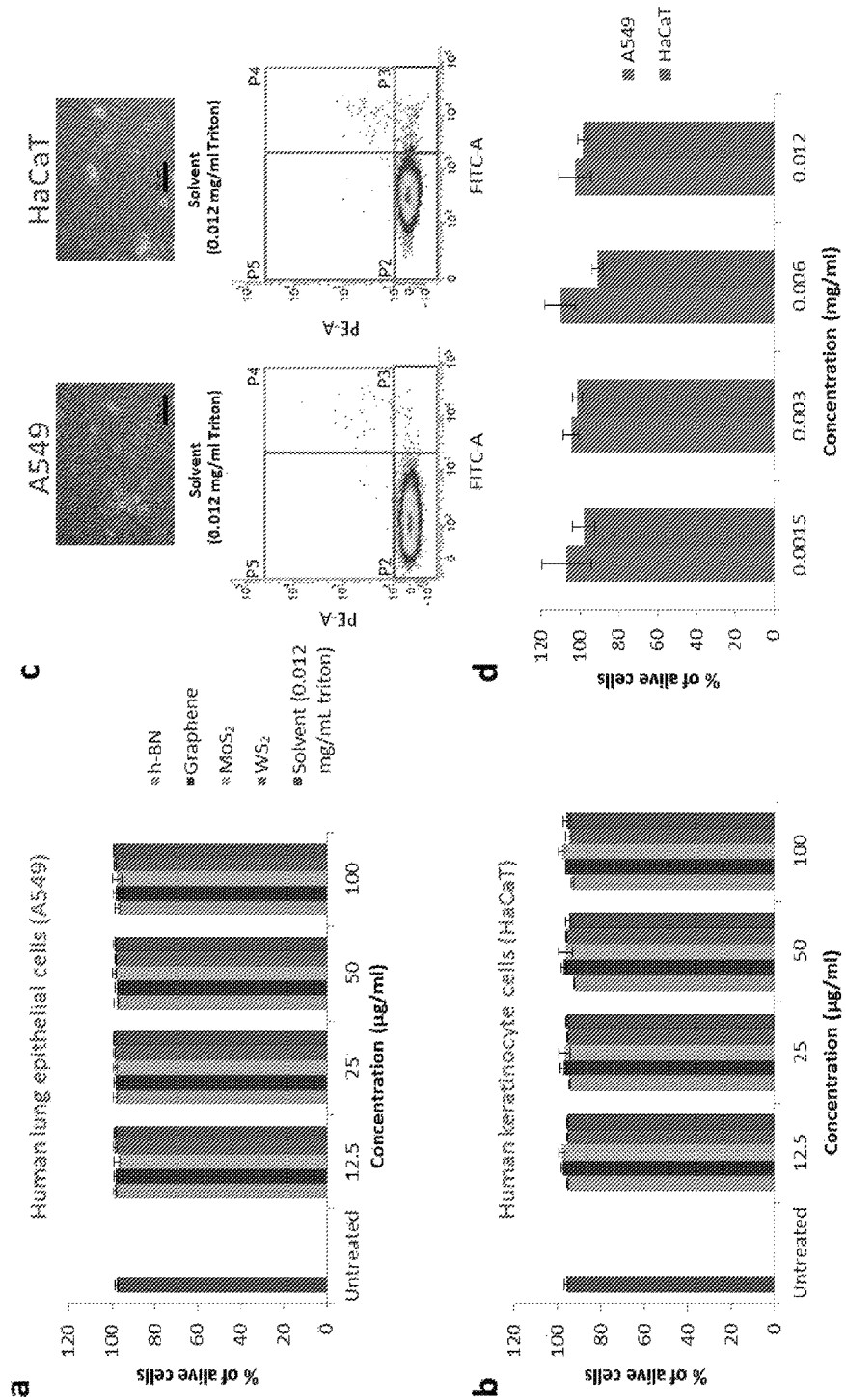

FIG. 55 shows the toxicity of the material and solvent. Cell death assessed in A549 (a) and HaCaT (b) cells using PI/Annexin V staining by flow cytometry. Data are represented as mean±SD (n=6); c and d. show toxicity of the material and solvent c) Top row: optical microscopy images of the cells treated with solvent containing 0.012 mg/ml Triton X-100 for 24 h. Bottom row: assessment of the toxicity of the material by flow cytometry using PI/Annexin V staining after incubation with the material for 24 h. Alive cells are represented in the P2 region, early apoptotic in the P3 region, late apoptotic and/or necrotic cells are shown in P4 region and necrotic cells are found in the P5 region. Data are represented as mean±SD (n=3). d) Assessment of the toxicity of the solvent using modified LDH assay in A549 and HaCaT cells. Cells were treated at escalating doses of the solvent for 24 h. Data are represented as mean±SD (n=6).

MATERIALS 1-pyrenesulfonic acid sodium salt (1-PSA; Py-1SO$_3$; PS1, >97.0% (HPLC)), propylene glycol, bulk MoS$_2$ (<2 µm, 99%), bulk h-BN (~1 µm) and Triton x-100 were all purchased from Sigma-Aldrich.

Graphite flakes were purchased from Bran Well UK, Grade: 99.5.

Unless otherwise stated, other reagents were of analytical grade and were used as received. All aqueous solutions were prepared with ultra-pure water (18.2 MΩ) from a Milli-Q Plus system (Millipore).

Preparation of Inkjet Printable Formulations

Example 1—Graphene Dispersions

The following quantities of reagents were added to a 12 mL glass vial:
H$_2$O—9.0 g;
Propylene glycol—1.0 g;
Triton-x100—0.6 mg;
Graphite (flakes>100 µm)—30 mg; and
1-pyrenesulfonic acid sodium salt (PS1)—10 mg.

The inkjet formulation was prepared using the quantities of reagents detailed above, by means of the following steps:
1) The glass vial was stoppered and placed into a 600 W bath sonicator for 48 hours.
2) The solution was then centrifuged at 3500 rpm (903 g) for 20 mins and the top ⅔ collected.
3) The collected solution was then centrifuged at 15000 rpm (16602 g) for 20 mins and the supernatant collected and combined before UV-Vis was conducted using a Cary 5000 UV-Vis-Near IR spectrometer to determine the concentration of PS1 in the supernatant.
4) The sediment was gently re-dispersed via shaking in a solvent comprising of H$_2$O (90% by weight), propylene glycol (10% by weight) and Triton-x100 (6×10$^{-3}$% by weight).

5) Steps 3 and 4 were repeated until less than 0.05 mg/mL PS1 was present in the supernatant. When the supernatant was recovered which contained less than 0.05 mg/mL PS1, the sediment was re-dispersed as in step 4 with a minimal quantity of solvent and collected.

6) UV/Vis was then conducted from 800-200 nm using a Cary 5000 UV-Vis-Near IR spectrometer with the absorption coefficient $\alpha_{660}$=2460 L g$^{-1}$ m$^{-1}$ to determine graphene concentration.

Figure 1:
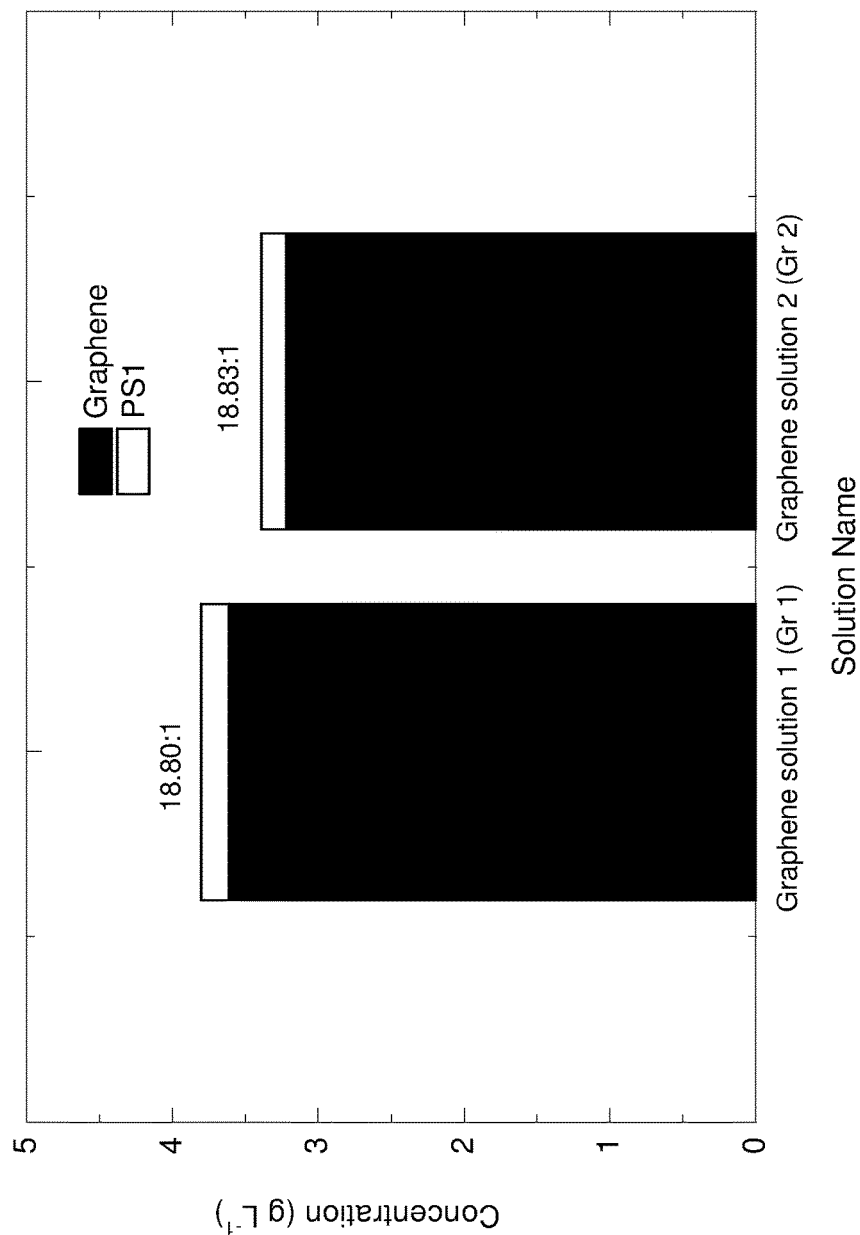
FIG. 1 shows the respective concentrations of graphene and 1-pyrenesulfonic acid sodium salt (PS1) for two formulations (Gr 1 and Gr 2) prepared according the method of the present invention in Example 1.
Figure 2:
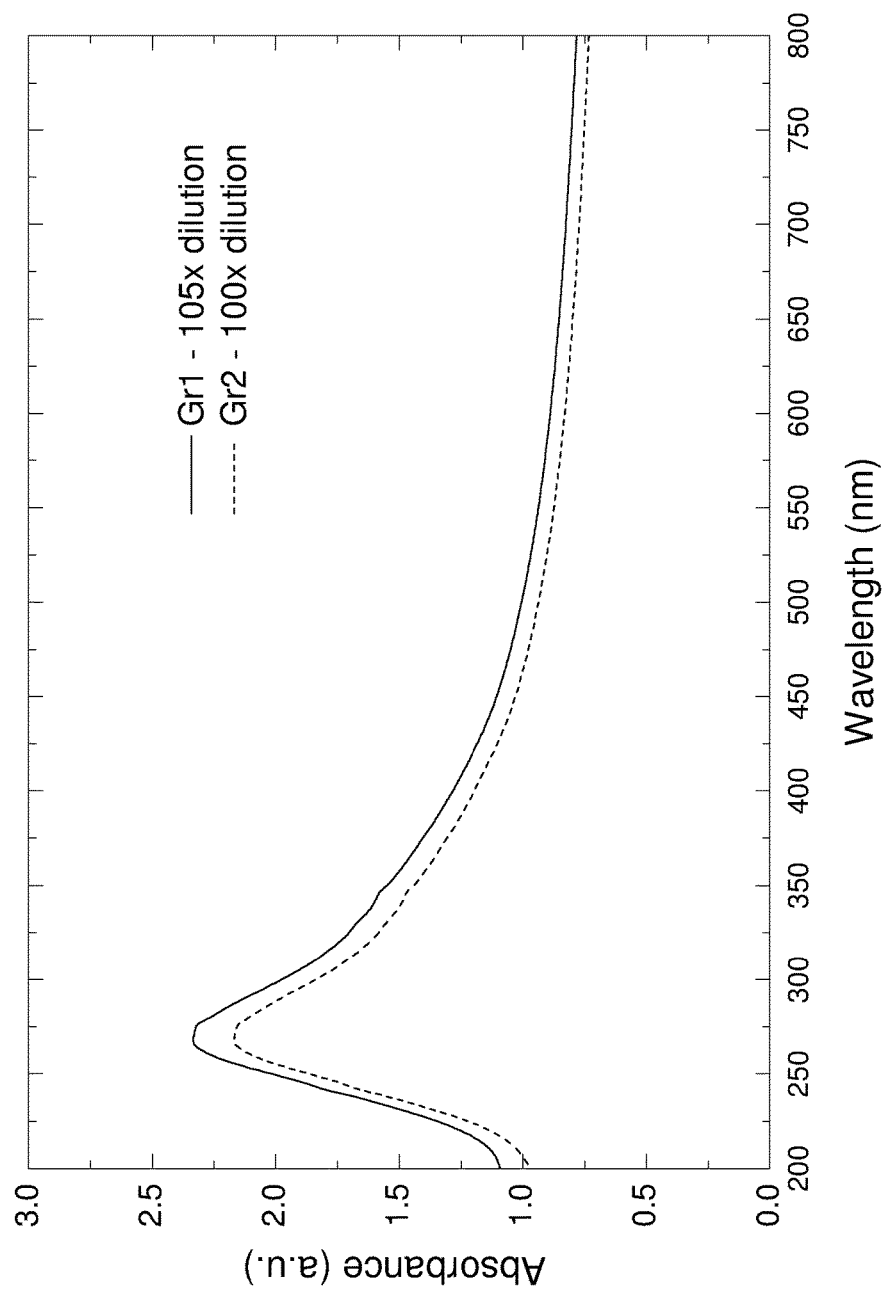
FIG. 2 shows the UV-Vis spectra for two formulations (Gr 1 and Gr 2) prepared according to the method of the present invention in Example 1. The concentrations are 3.61 g/L and 3.22 g/L respectively.
Figure 3:
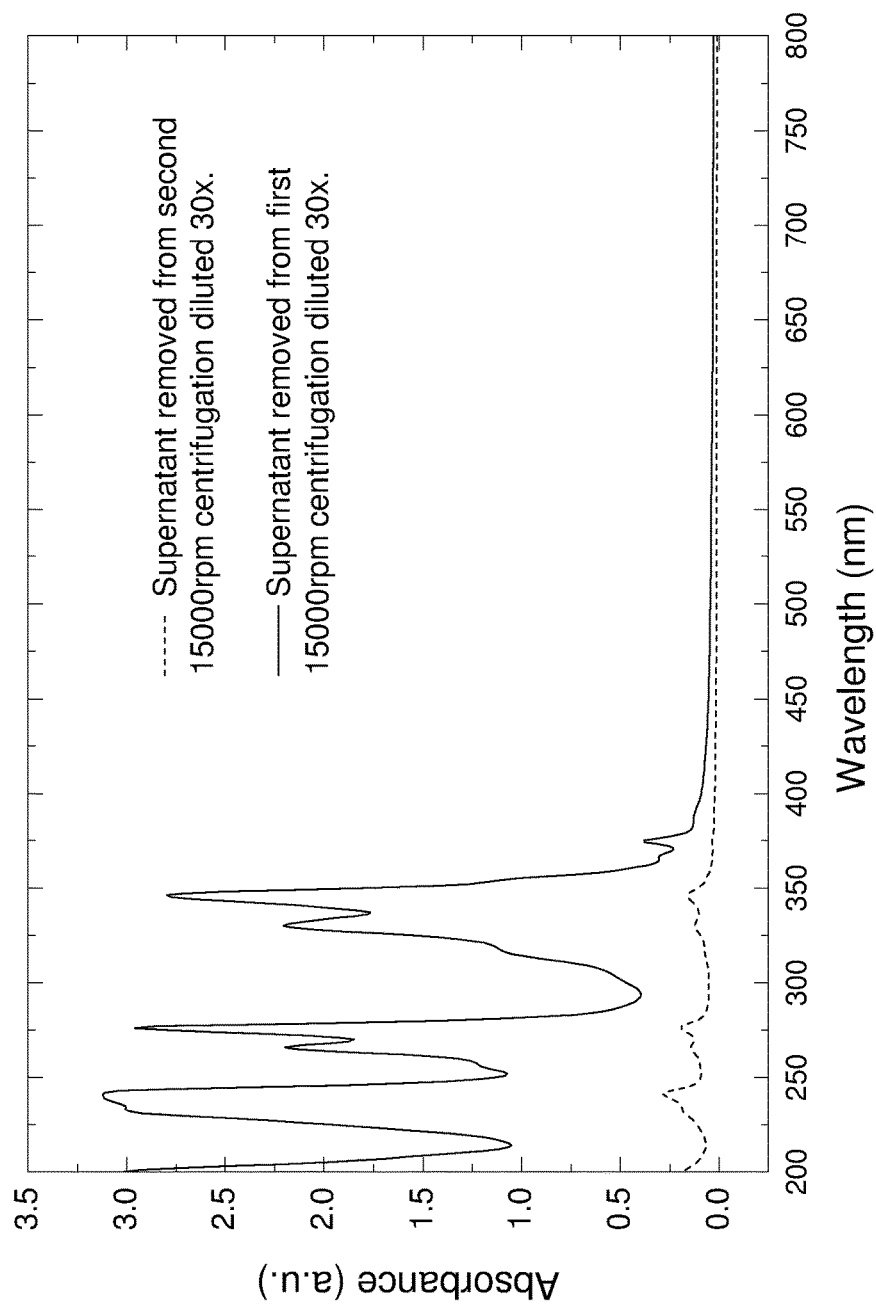
FIG. 3 shows the UV-Vis spectra of the supernatant removed during preparation of a graphene dispersion (Gr 2) described in Example 1. The reduction in excess PS1 is clearly visible in the reduction in the peak at 346 nm.

Using this technique, two formulations containing greater than 3.0 mg/mL of graphene nanoparticles were prepared (Graphene dispersion 1 (Gr 1) and Graphene dispersion 2 (Gr 2), see FIG. 1).

The prepared formulations was measured to have densities (p) of 1.0204 g/cm³ for Gr 1 and 1.0199 g/cm³ for Gr 2.

The prepared formulations contained greater than 18:1 ratio of graphene:PS1 by weight (see FIG. 1).

TABLE 1 the concentrations of graphene and PS1 before and after removal in ink formulations Gr 1 and Gr 2.

| Graphene ink name | Graphene concentration (g L$^{-1}$) | PS1 concentration before removal (g L$^{-1}$) | PS1 concentration after removal (g L$^{-1}$) |
|---|---|---|---|
| Gr1 | 3.61 | 1.008 | 0.192 |
| Gr2 | 3.22 | 0.986 | 0.171 |

The surface tension of the formulations were both measured to be <40 mN/m using a KRUSS DSA-100 recording the pendant drop profile.

Figure 31:
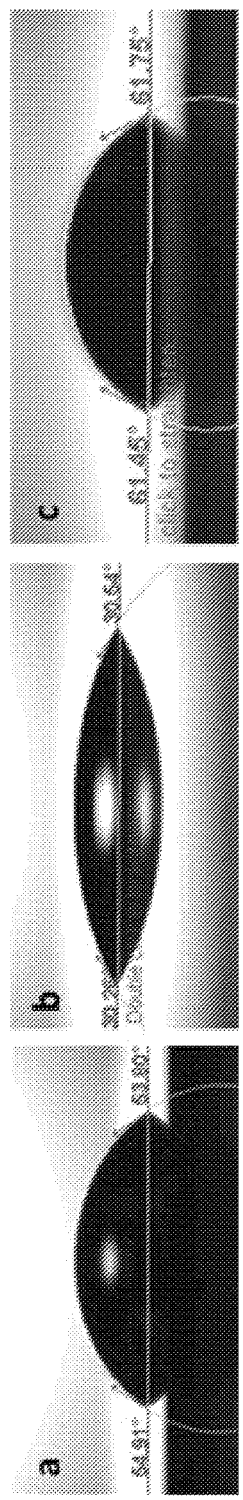
FIG. 31 shows contact angle measurements of the graphene ink deposited on silicon covered with a thin oxide layer (a), quartz (b) and PI film (c).

The contact angles of the inks were measured on SiO$_2$, glass and PET (FIG. 31).

TABLE 2 the contact angles of inks Gr 1 and Gr 2 on SiO$_2$, glass and PET.

| Substrate | Contact angle |
|---|---|
| SiO$_2$ | 34.35° ± 0.56° |
| Polyimide | 61.60° ± 0.15° |
| Glass | 30.40° ± 0.14° |

The combined supernatant collected in step 3 was reused to generate more ink formulations with same quantities of regents as detailed above used (albeit PS1). The mass of PS1 required to obtain the initial dispersion concentration was added before the new dispersion with re-used PS1 was used in step 1 above.

A Fujifilm Dimatix DMP-2800 printer was used to print the ink on SiO$_2$ to form lines. Annealing was performed at 300° C. for 1 hour under Argon atmosphere. Electrical measurements were conducted using a Keithley 2400 sourcemeter before and after annealing.

Figure 4:
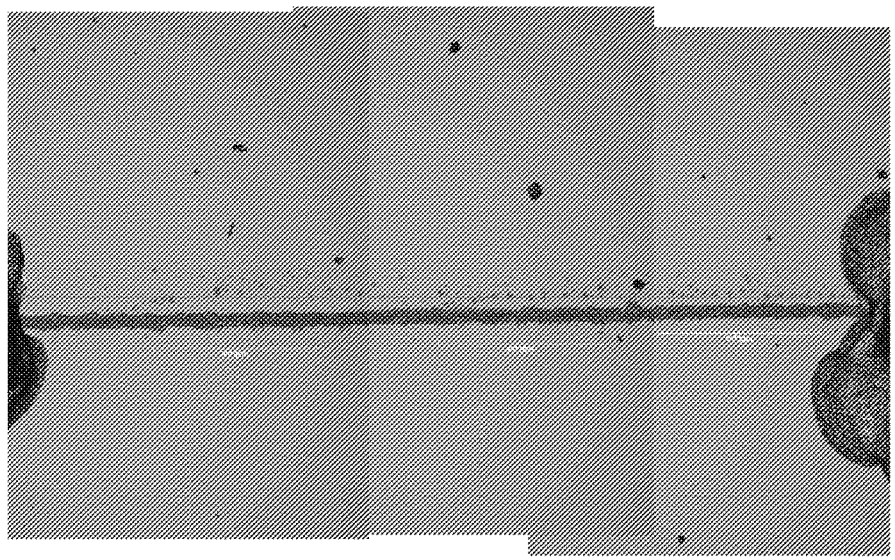
FIG. 4 shows the printed conductive lines printed on $SiO_2$ using the graphene ink formulation prepared in Example 1 herein, after 50 passes and annealing at 300° C. under Ar for 1 hour.

FIG. 4 shows the printed conductive lines printed on SiO$_2$ using the graphene ink formulation prepared in Example 1 herein, after 50 passes and annealing at 300° C. under Ar for 1 hour. The following properties of the printed conductive lines were determined:
  Sheet resistance=3.2 kΩ
  Concentration=0.3 mg/mL
  Surface tension=36.4 mN/m The ink prepared in Example 1 was diluted to 0.3 mg/mL and a line 10 drops in width was printed onto SiO$_2$ before drying at room temperature. A coffee ring was observed on the edges of the printed line.

Figure 5:
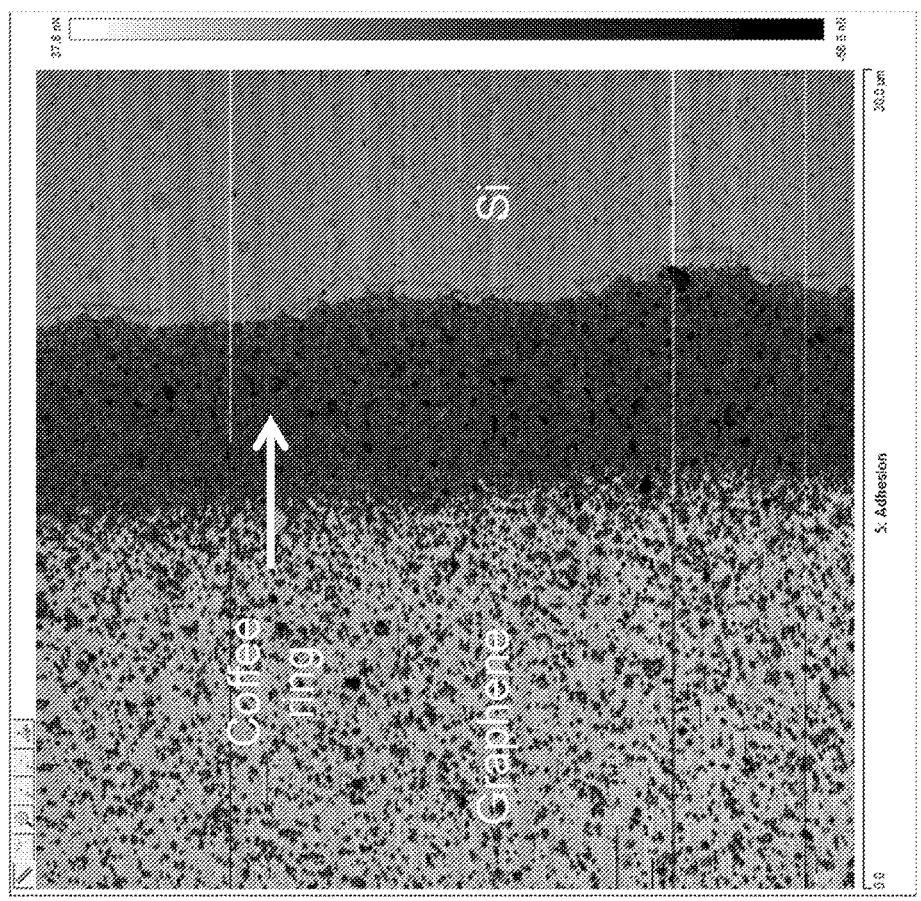
FIG. 5 shows the atomic force microscope (AFM) images for a line (coffee ring) formed by the inkjet printing of the graphene ink formulation prepared in Example 1 herein onto $SiO_2$, after 1 pass (layer) with enhanced coffee ring.
Figure 6:
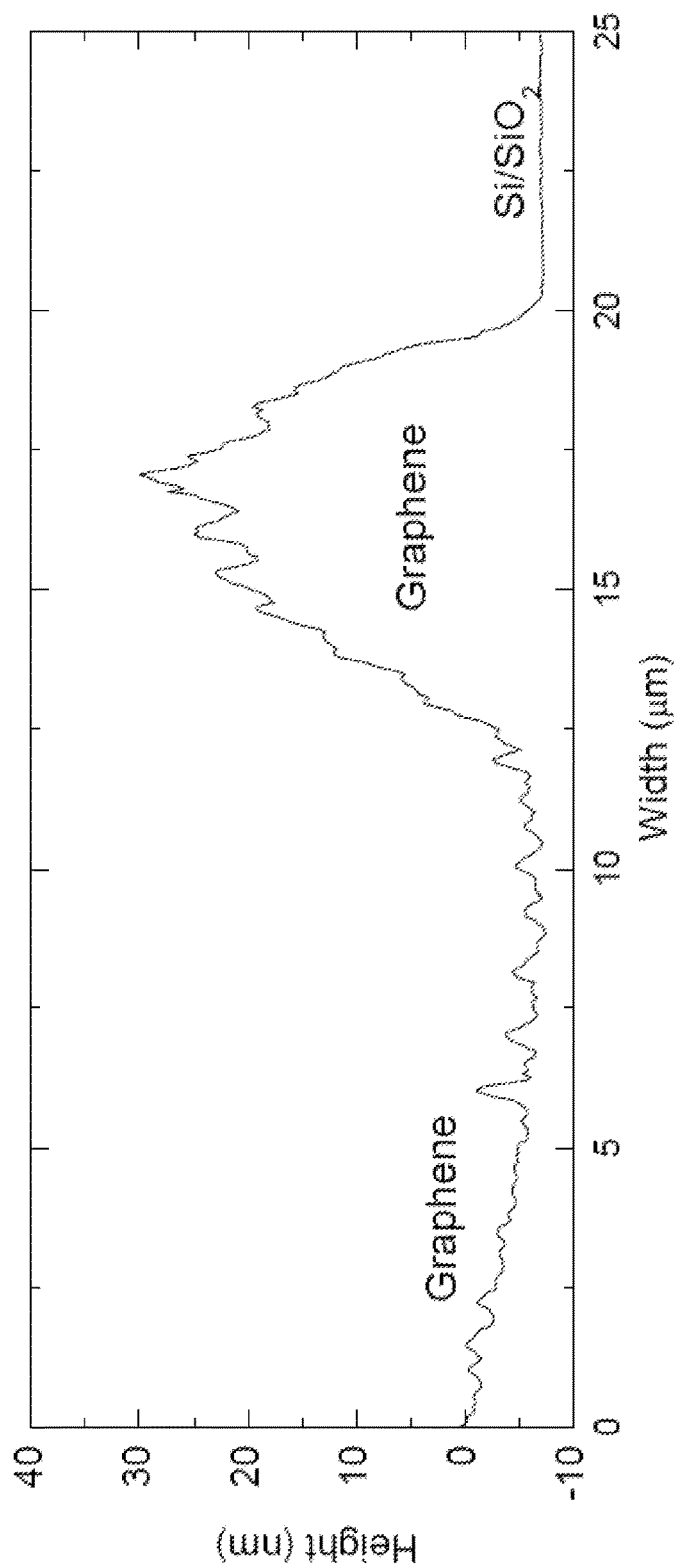
FIG. 6 shows the atomic force microscope trace for a line (and corresponding coffee ring) printed on $SiO_2$, after 1 pass (layer). It shows the coffee ring having a width of ~17 μm and a height of ~20 nm.
Figure 7:
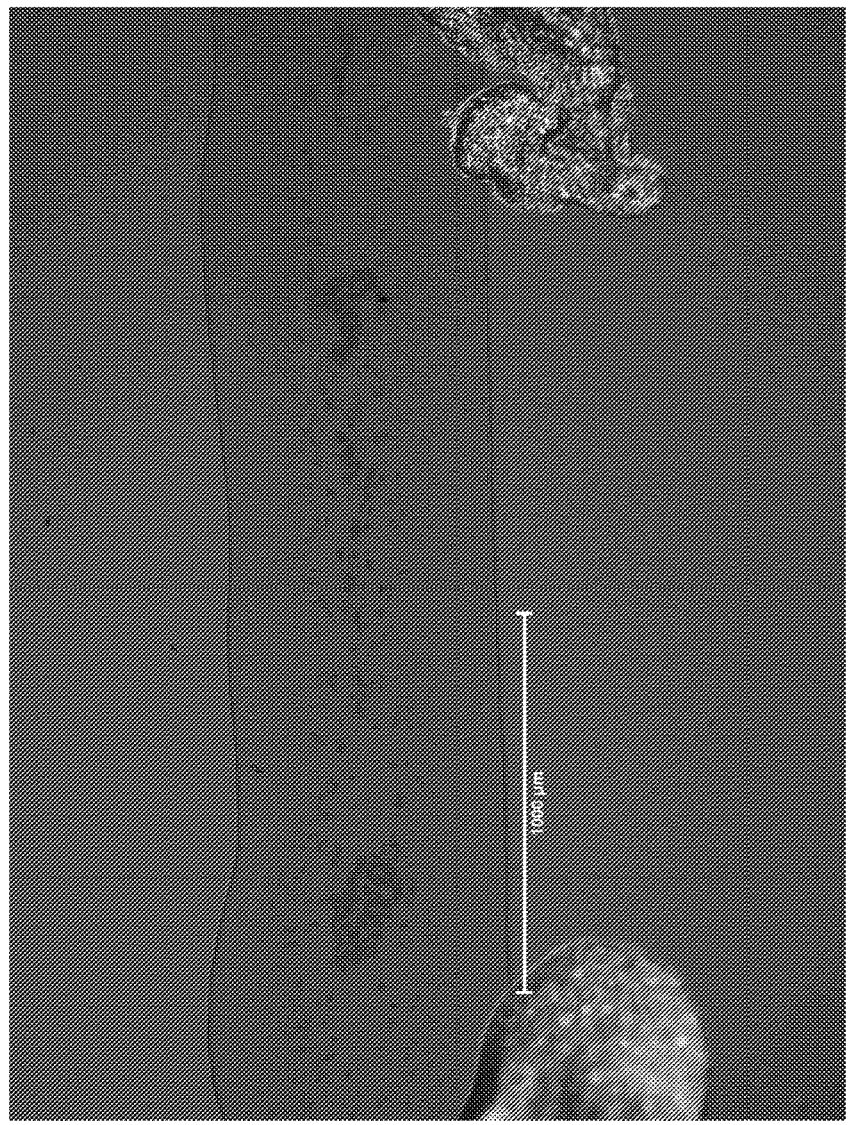
FIG. 7 shows an optical image of the printed conductive line formed using the graphene ink formulation prepared in Example 1 herein, after 50 passes and annealing at 300° C. under Ar for 1 hour, the coffee ring was contacted to silver ink contacts, giving a sheet resistivity of 94.79 kΩ/□.

The printed coffee ring, was analyzed and imaged using atomic force microscopy (AFM), the image and output for which is shown in FIGS. 5 and 6. The AFM image shows the coffee ring associated with the printed line as having a width of 17 μm and a height of 20 nm. The printed line (coffee ring) was contacted with silver ink contacts (FIG. 7) and electrical measurements were determined, in which the following properties were determined:
  Resistance=40 MΩ
  Conductance=2.5×10$^{-8}$ S
  Electrical resistivity=2.37 mΩ/m
  Electrical conductivity=422 S m$^{-1}$
  Cross-sectional area=1.25×10$^{-13}$ m²
  Sheet resistivity=94.79 kΩ/□

Figure 8:
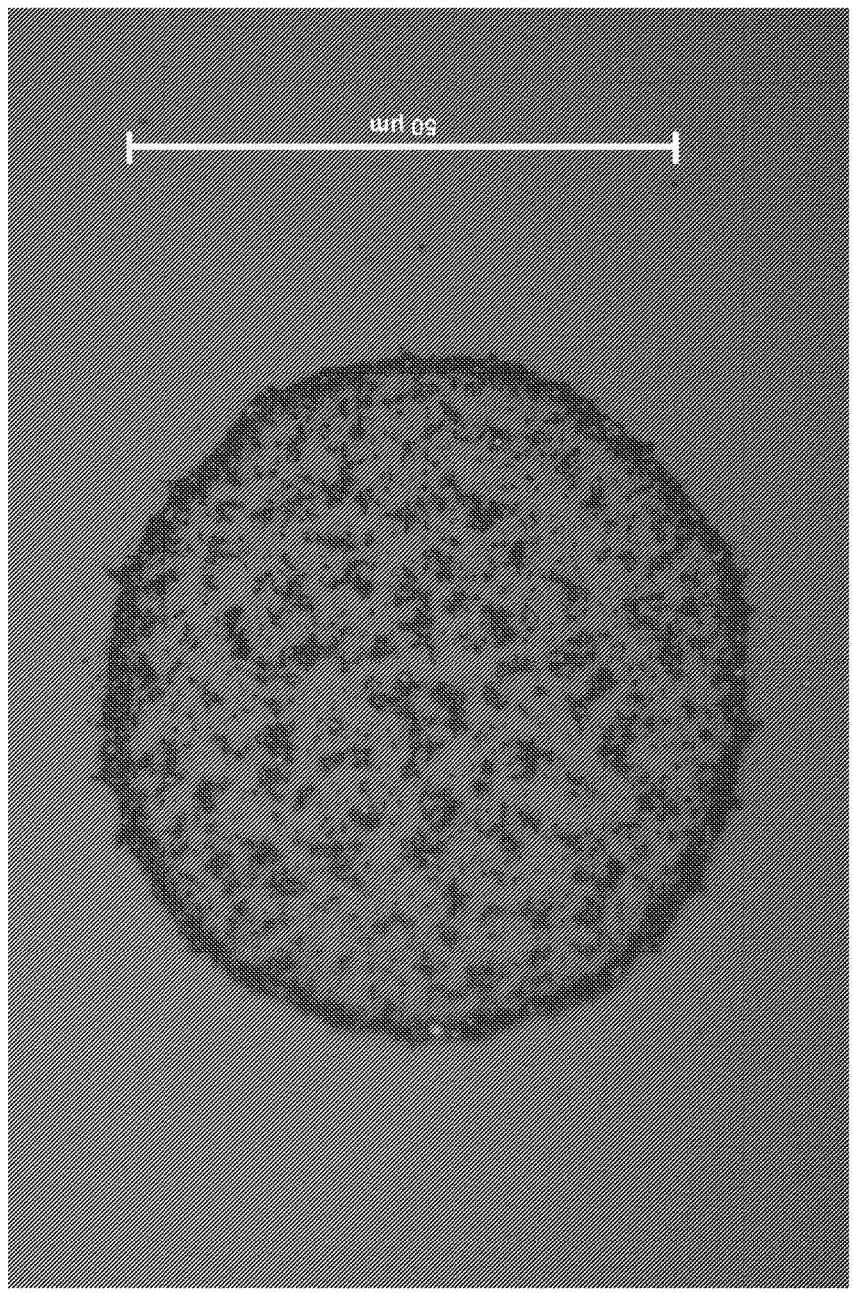
FIG. 8 is a digital photograph showing a printed dot formed by the inkjet printing of the ink formulation prepared in Example 1 herein before being diluted to 0.6 mg/mL and printed onto a 40° C. $SiO_2$ substrate.
Figure 9:
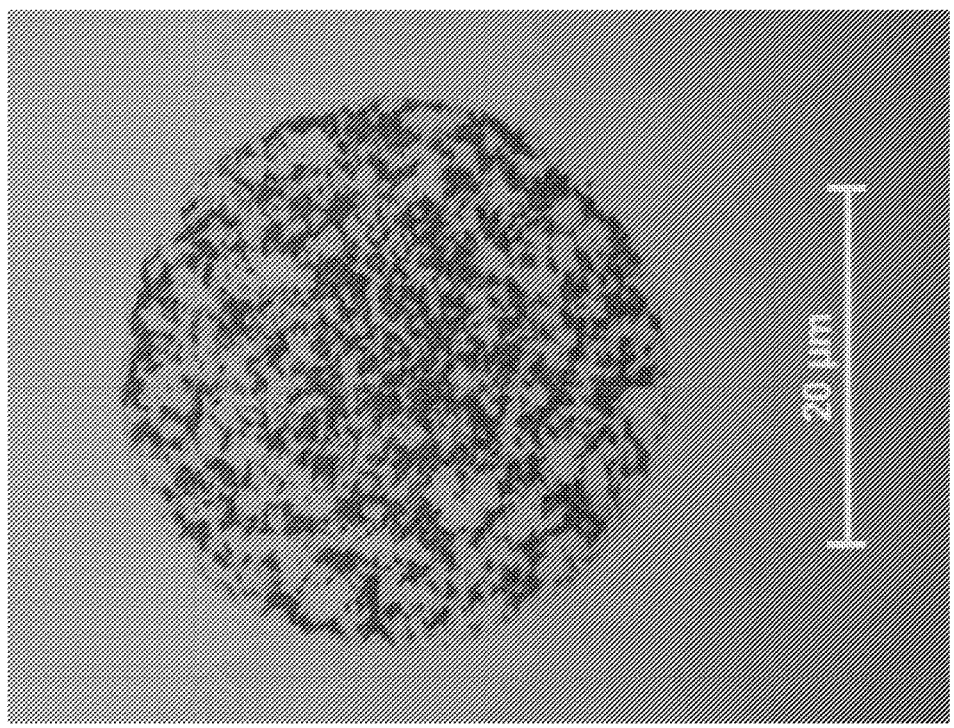
FIG. 9 is a digital photograph showing a printed dot formed by the inkjet printing of the ink formulation prepared in Example 1 herein onto a 50° C. $SiO_2$ substrate.
Figure 10:
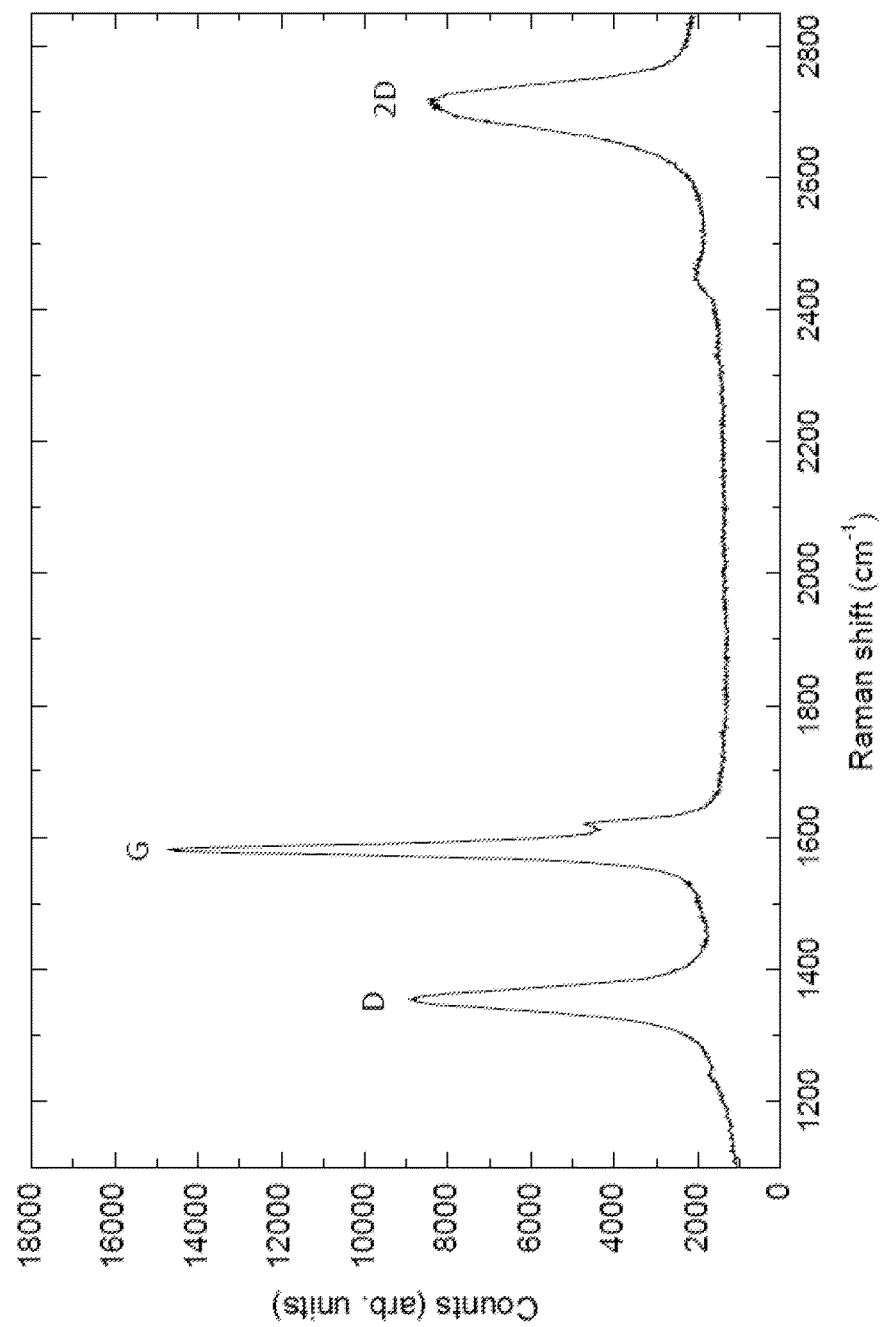
FIG. 10 shows the Raman spectrum of printed graphene on $Si/SiO_2$ obtained at 514 nm using a Renishaw inVia confocal Raman microscope. (100× zoom, 0.8 NA, 0.6 mW)

FIGS. 8 and 9 show printed dots of the graphene ink formulation of Example 1 on SiO$_2$ at 40° C. and 50° C. respectively.

Sets of Lines Printed with Increasing Number of Layers

A Dimatix DMP-2800 printer was used to print the ink on PEL™ paper to form lines from 40 to 1 passes in increments of 5. No annealing was performed. Using measured values for thickness, and line dimensions, various electrical parameters could be calculated.

Figure 11:
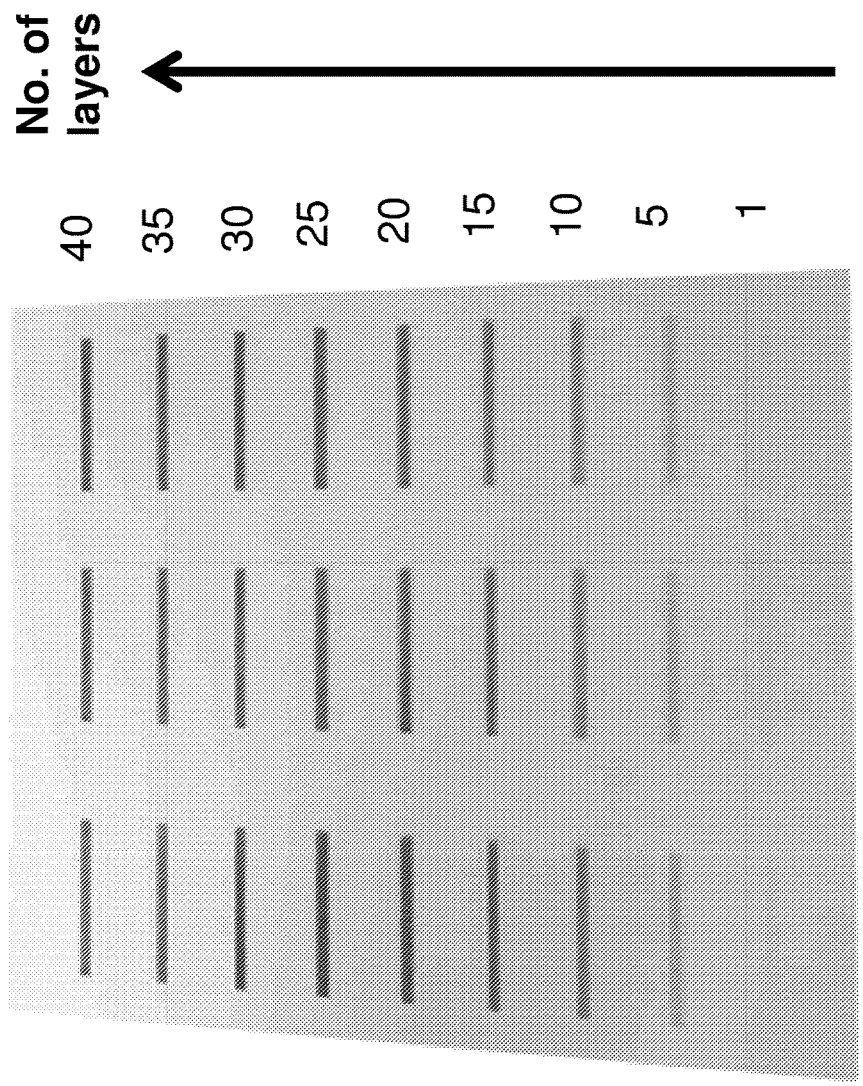
FIG. 11 is a digital photograph showing a series of lines formed by the inkjet printing of the formulation prepared in Example 1 herein, onto PEL paper after 1, 5, 10, 15, 20, 25, 30, 35 and 40 passes (layers) as shown by the numbers next to the lines in the Figure.
Figure 12:
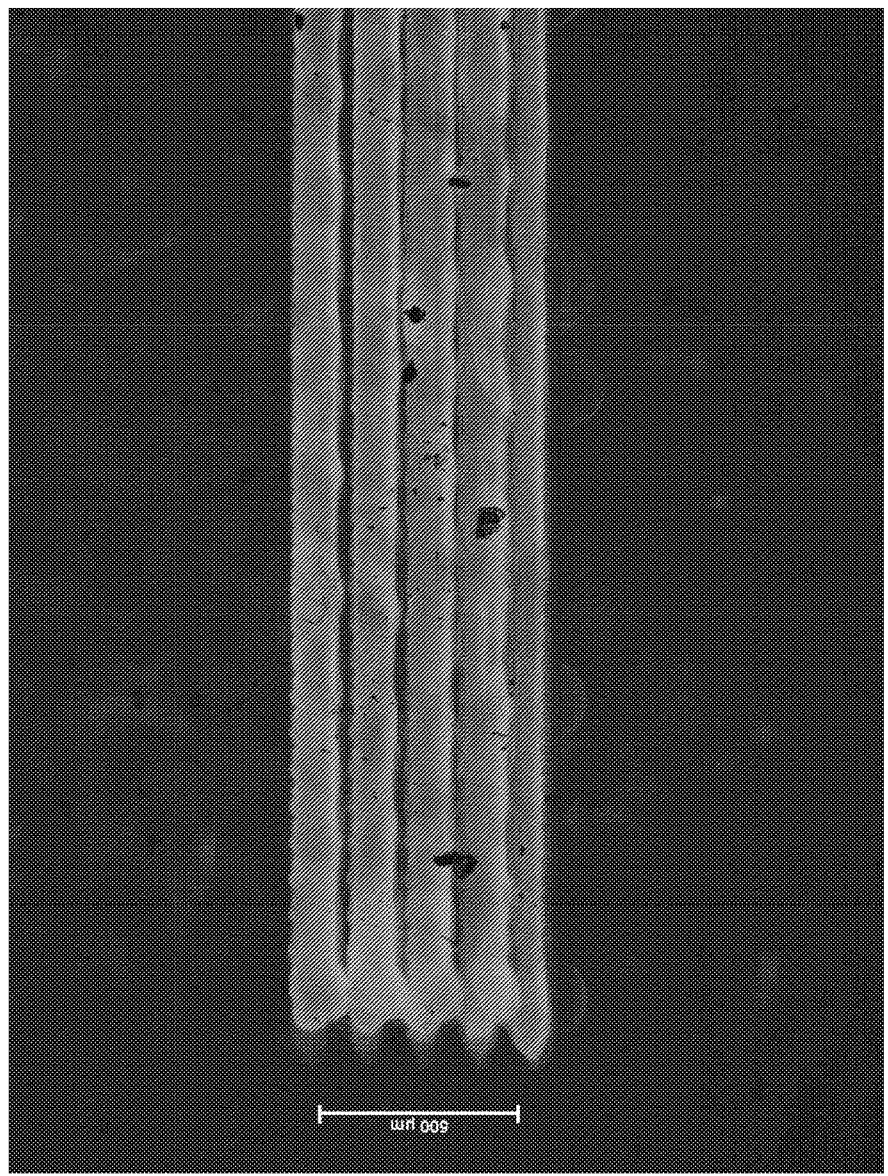
FIG. 12 shows an optical image of a series of lines formed by the inkjet printing of the formulation prepared in Example 1 herein, onto PEL paper after 40 passes (layers).

A digital photograph of the conductive lines printed on PEL™ paper with various number of passes (layers) are shown in FIG. 11. Optical images of the printed conductive lines are shown in FIGS. 12 to 18.

Figure 19:
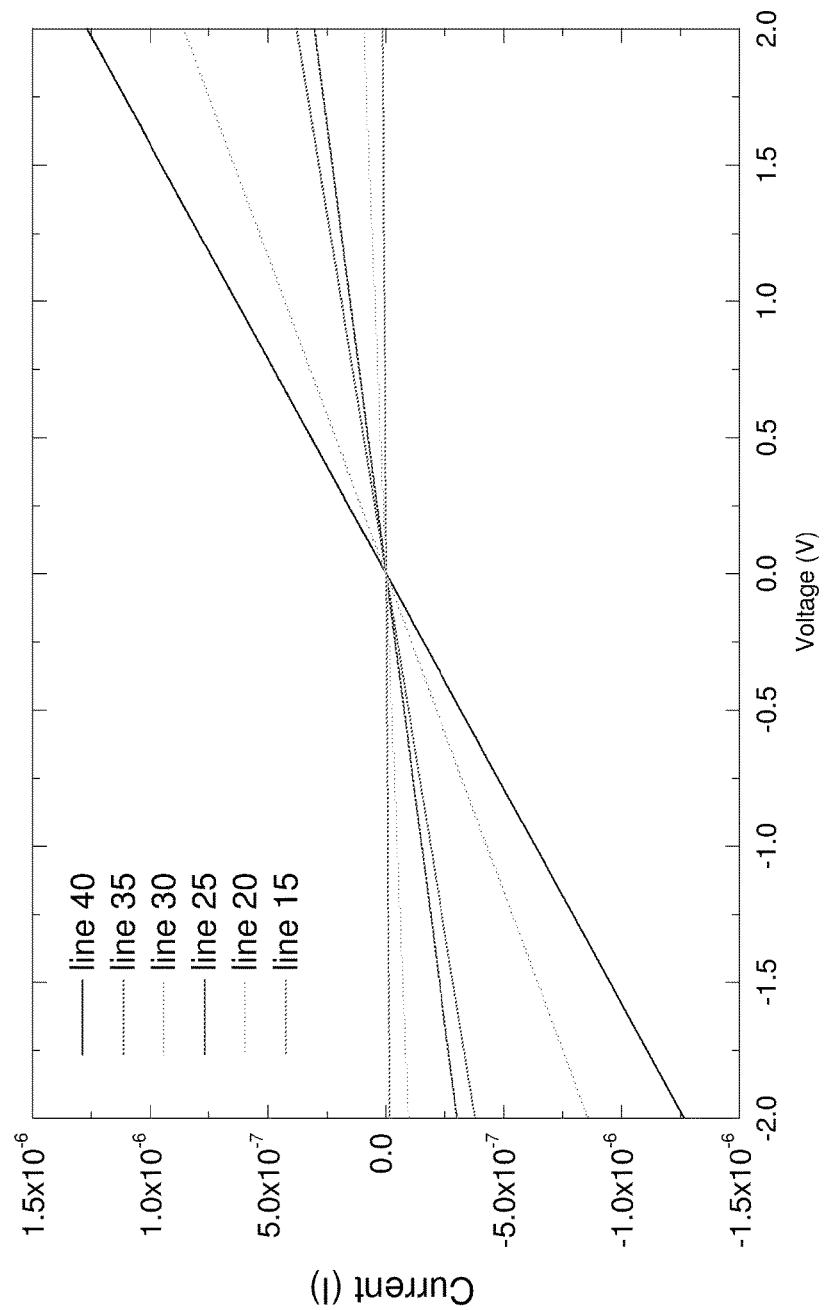
FIG. 19 shows a current v. voltage plot for the conductive lines printed on PEL paper after 15, 20, 25, 30, 35 and 40 passes (layers).
Figure 23:
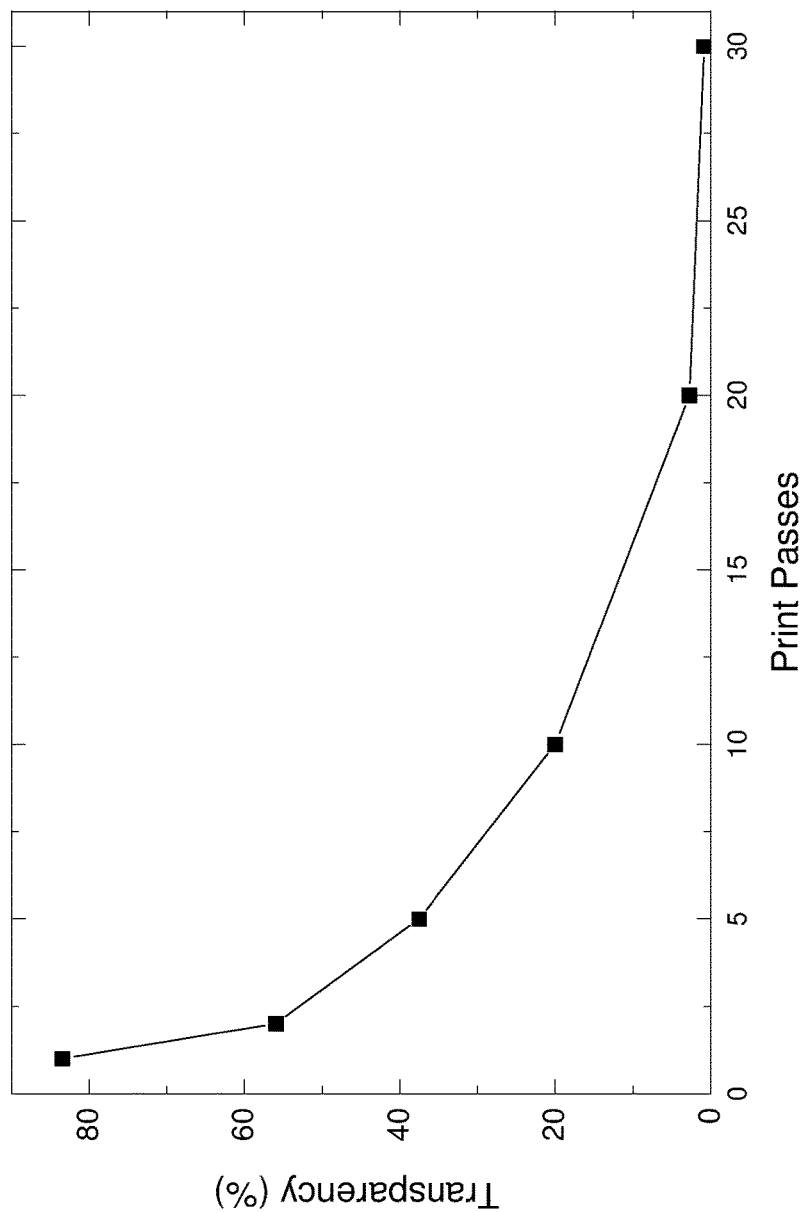
FIG. 23 shows the transparency v. number of printing passes for the conductive lines printed on PET plastic after 1, 2, 5, 10, 20 and 30 passes (layers).

Sheet resistance and conductivity of some of the printed lines was determined using a Keithley 2400 sourcemeter using silver ink contacts of set dimensions to connect two wires across the printed lines to measure voltage as a function of current. FIGS. 19 and 23 show the current v. voltage plot and the sheet resistance v. number of printing passes plot respectively.

The electrical properties for the printed conductive lines, determined using a Keithley 2400 sourcemeter, are summarised in Table 3.

TABLE 3 the electrical properties calculated for a series of lines formed by the inkjet printing of the formulation prepared in Example 1 herein.

| Number of passes for printed line | Conductance (S) | Resistance (MΩ) | Conductivity (S/m) | Sheet Resistance (kΩ/sq) |
|---|---|---|---|---|
| 15 | 7.42 × 10$^{-9}$ | 134.71 | 13 | 14970 |
| 20 | 4.70 × 10$^{-8}$ | 21.26 | 85 | 2360 |
| 25 | 1.52 10$^{-7}$ | 6.58 | 243 | 823 |
| 30 | 4.29 × 10$^{-7}$ | 2.33 | 686 | 291 |
| 35 | 1.90 × 10$^{-7}$ | 5.28 | 265 | 754 |
| 40 | 6.34 × 10$^{-7}$ | 1.58 | 760 | 263 |

Figure 13:
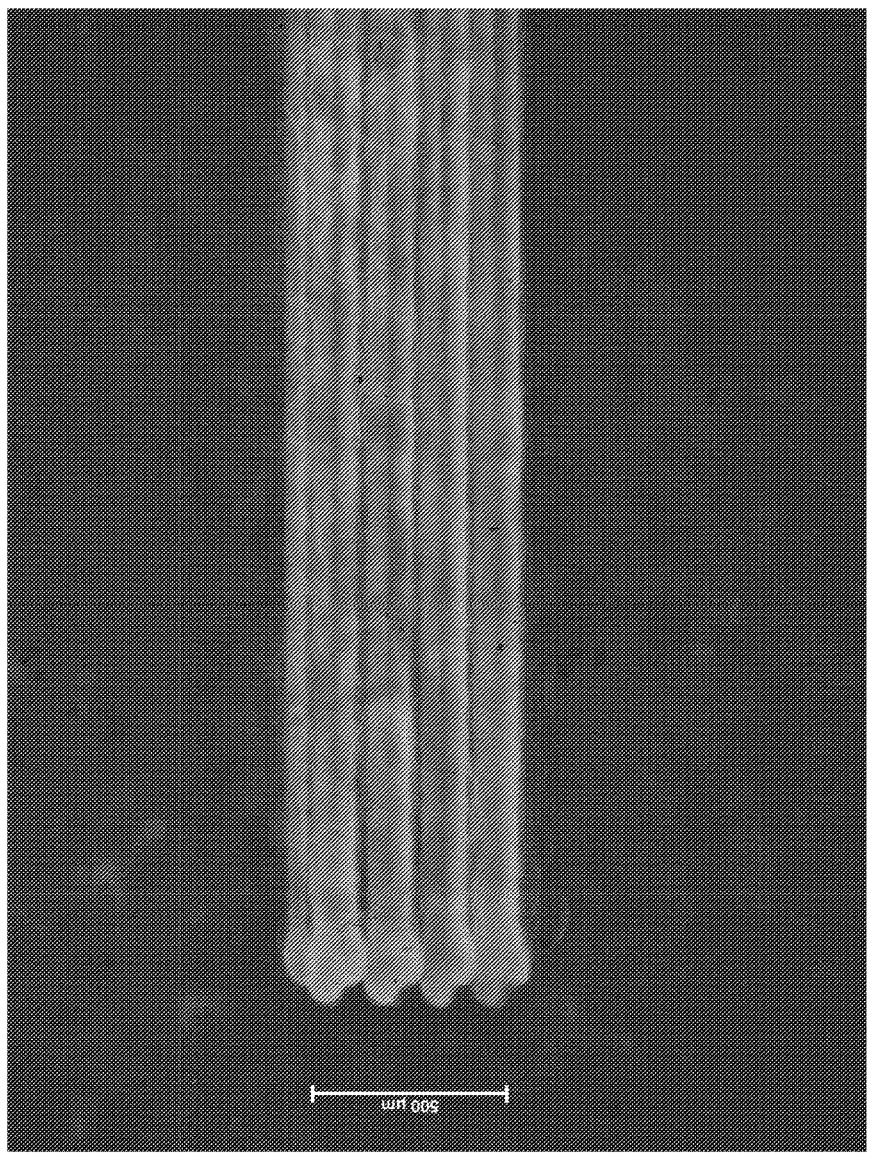
FIG. 13 shows an optical image of a series of lines formed by the inkjet printing of the formulation prepared in Example 1 herein, onto PEL paper after 35 passes (layers).
Figure 14:
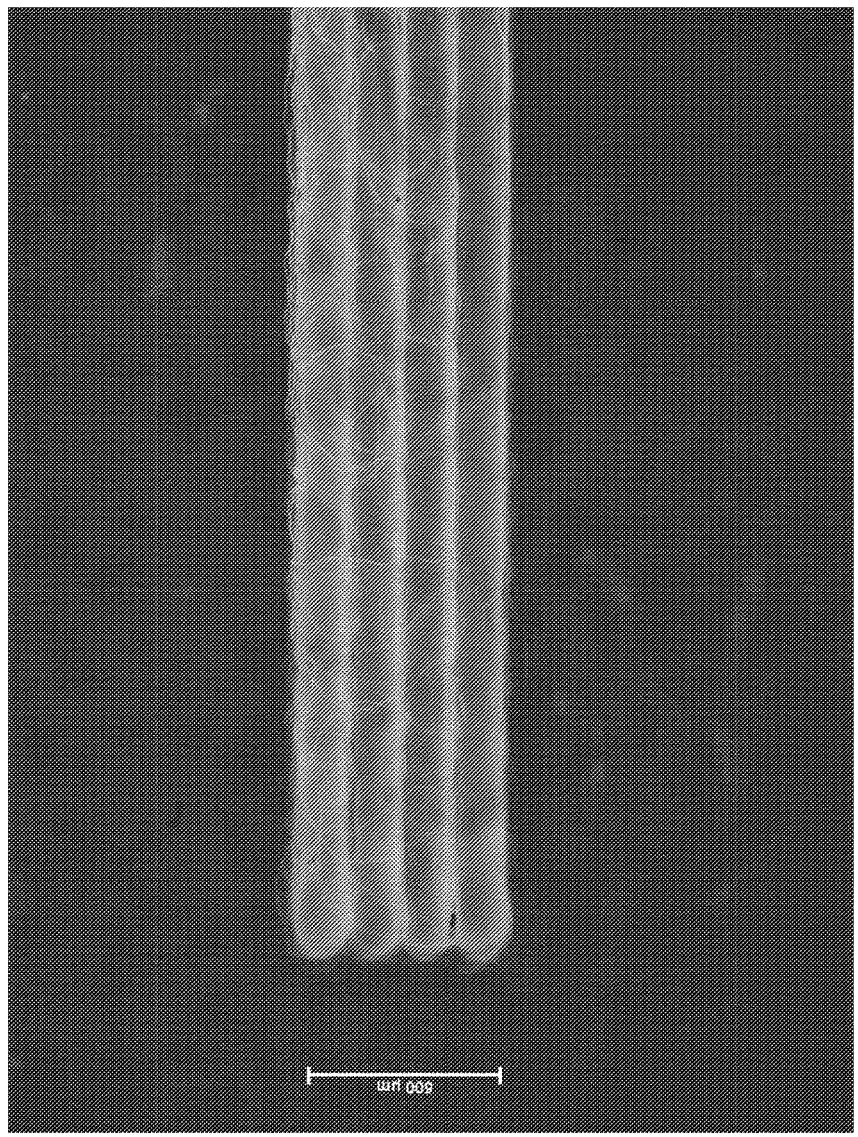
FIG. 14 shows an optical image of a series of lines formed by the inkjet printing of the formulation prepared in Example 1 herein, onto PEL paper after 30 passes (layers).
Figure 15:
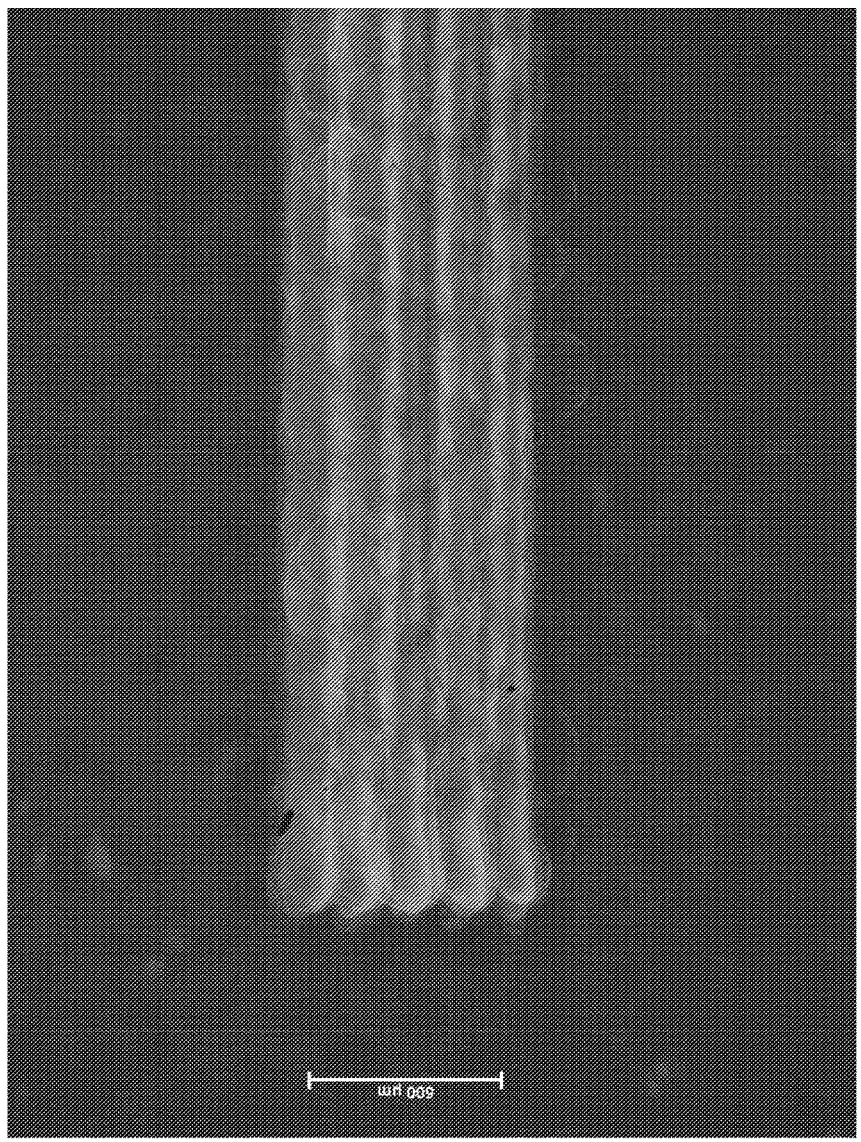
FIG. 15 shows an optical image of a series of lines formed by the inkjet printing of the formulation prepared in Example 1 herein, onto PEL paper after 25 passes (layers).
Figure 16:
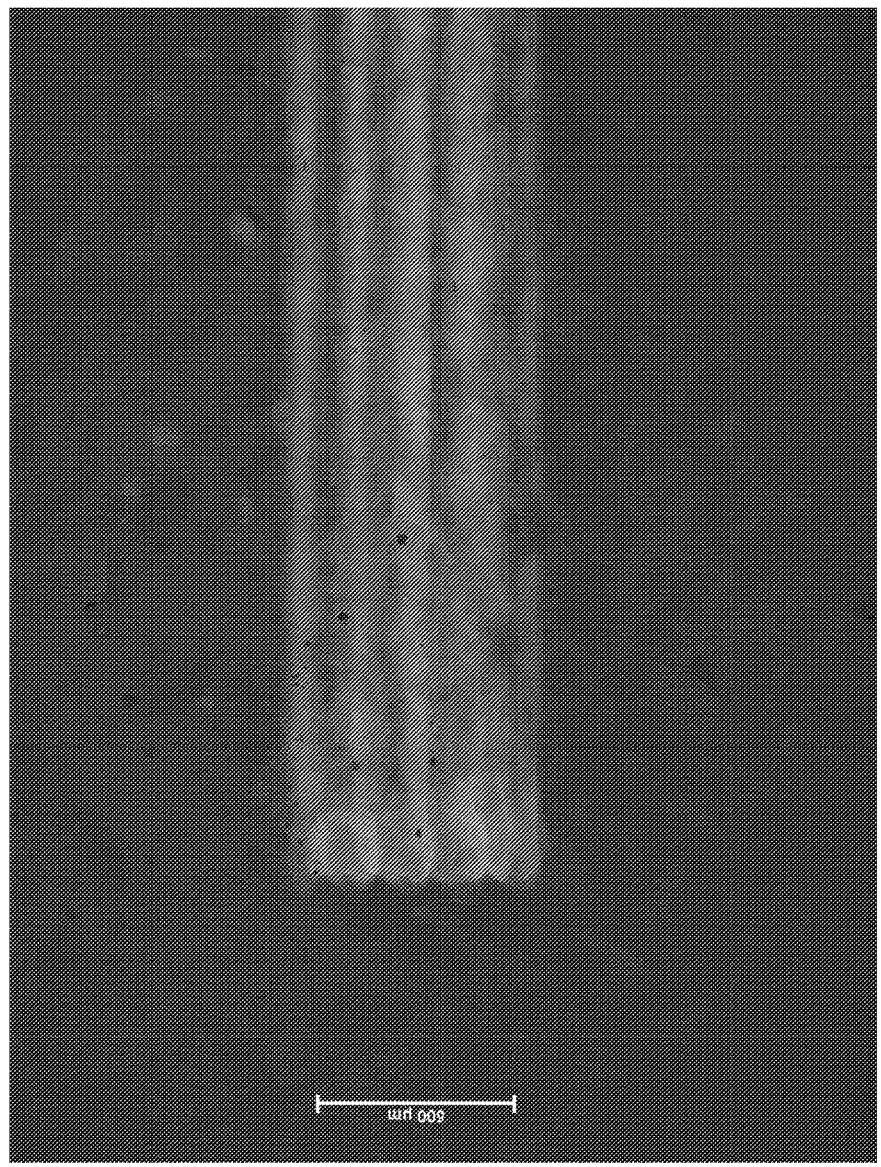
FIG. 16 shows an optical image of a series of lines formed by the inkjet printing of the formulation prepared in Example 1 herein, onto PEL paper after 20 passes (layers).
Figure 17:
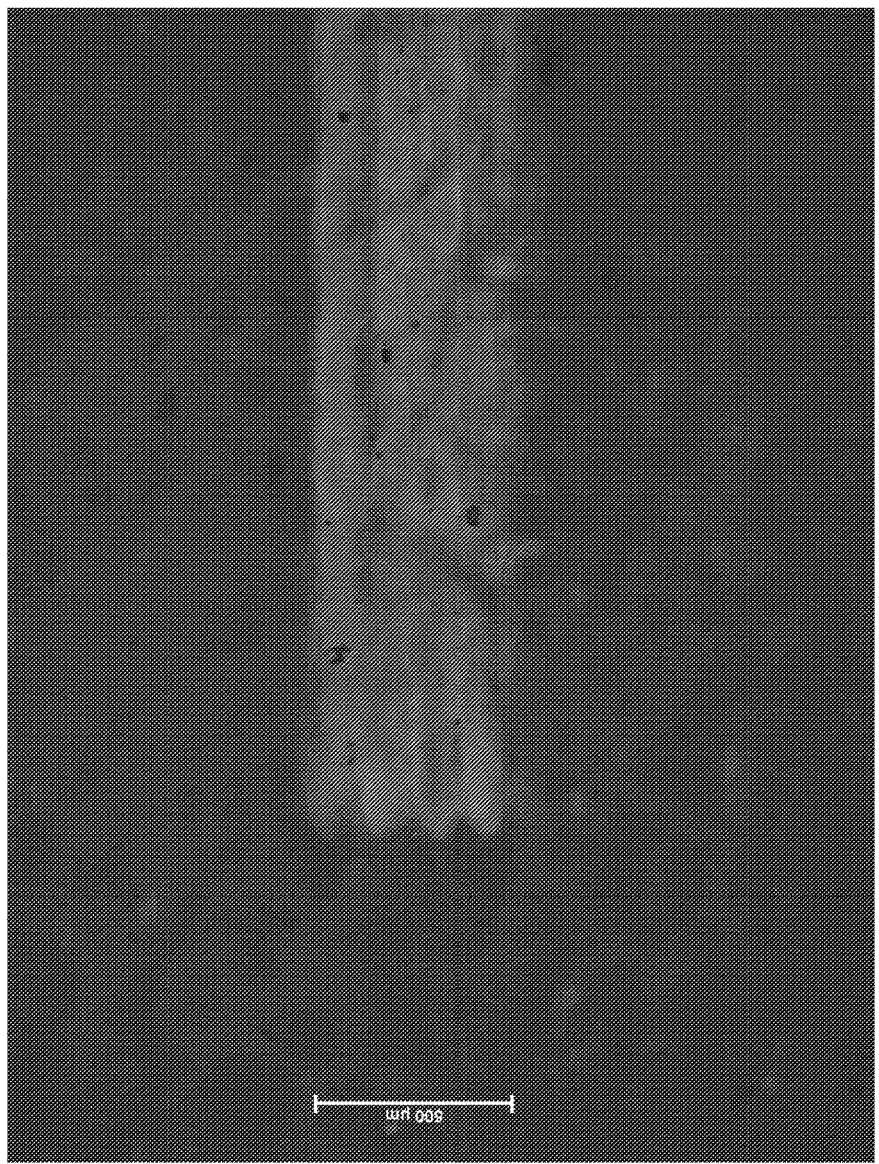
FIG. 17 shows an optical image of a series of lines formed by the inkjet printing of the formulation prepared in Example 1 herein, onto PEL paper after 15 passes (layers).
Figure 18:
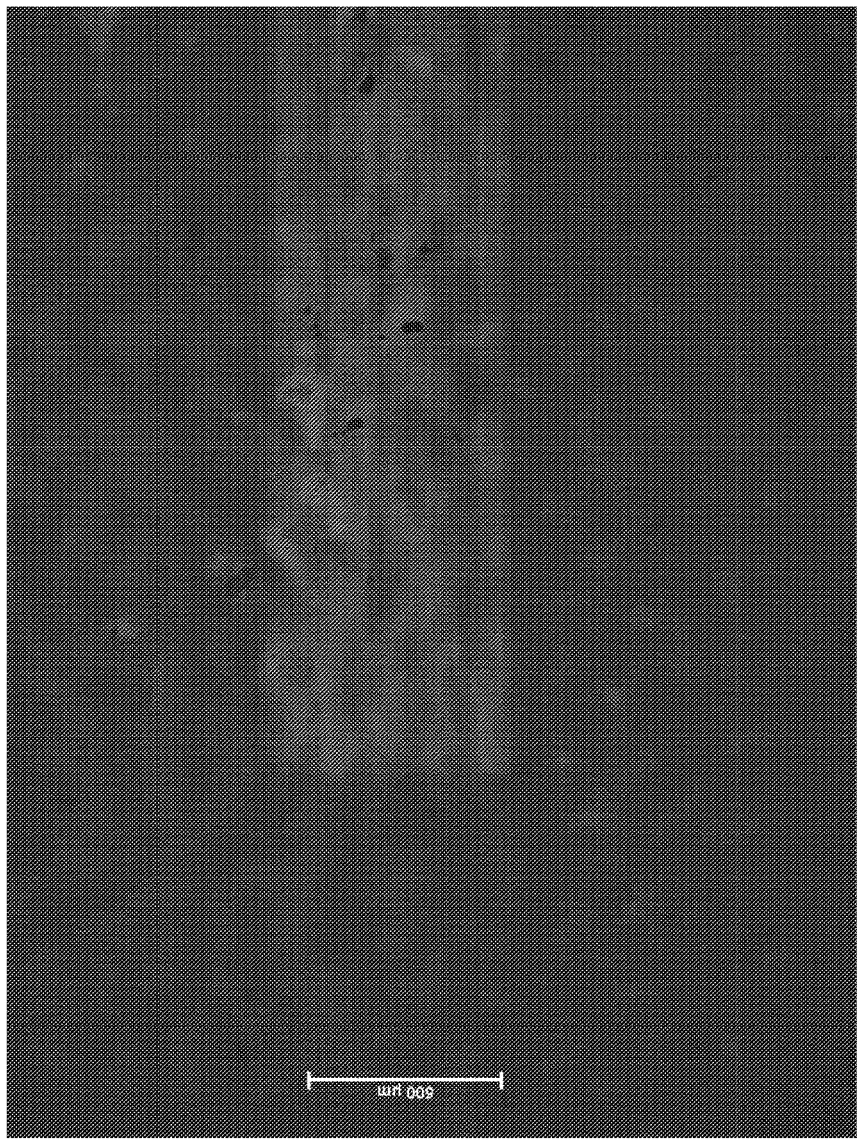
FIG. 18 shows an optical image of a series of lines formed by the inkjet printing of the formulation prepared in Example 1 herein, onto PEL paper after 10 passes (layers).

The increase in sheet resistance from 30 passes to 35 passes was due to nozzle misalignment causing an uneven distribution of droplets on the PEL paper (FIG. 13). Optimising the printing parameters should give lines with lower sheet resistance values with the same number of printing passes.

A Dimatix DMP-2800 printer was used to print the ink on PET plastic to form lines with 1, 2, 5, 10, 20 and 30 printing passes. No annealing was performed. Using measured values for thickness, and line dimensions, various electrical parameters could be calculated.

Figure 20:
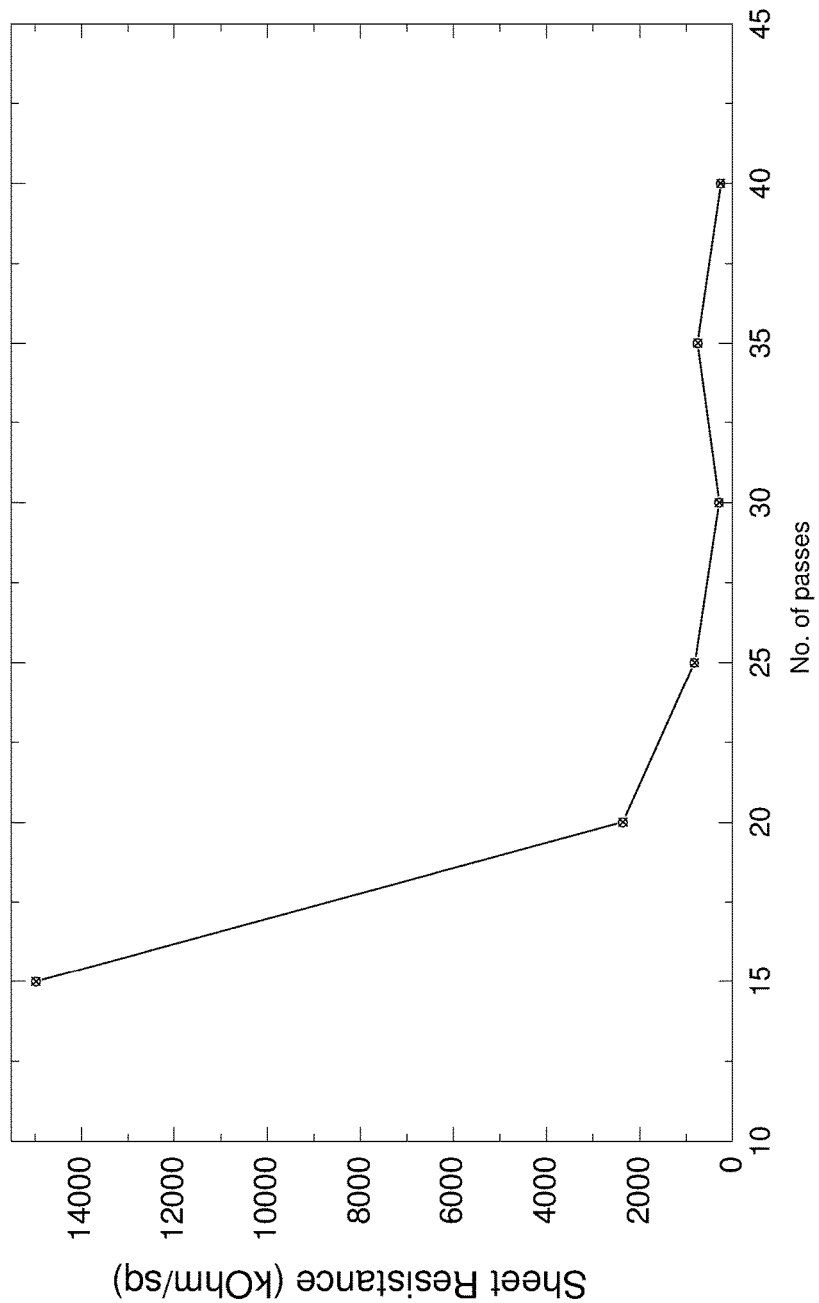
FIG. 20 shows the sheet resistance v. number of printing passes for the conductive lines printed on PEL paper after 15, 20, 25, 30, 35 and 40 passes (layers).
Figure 21:
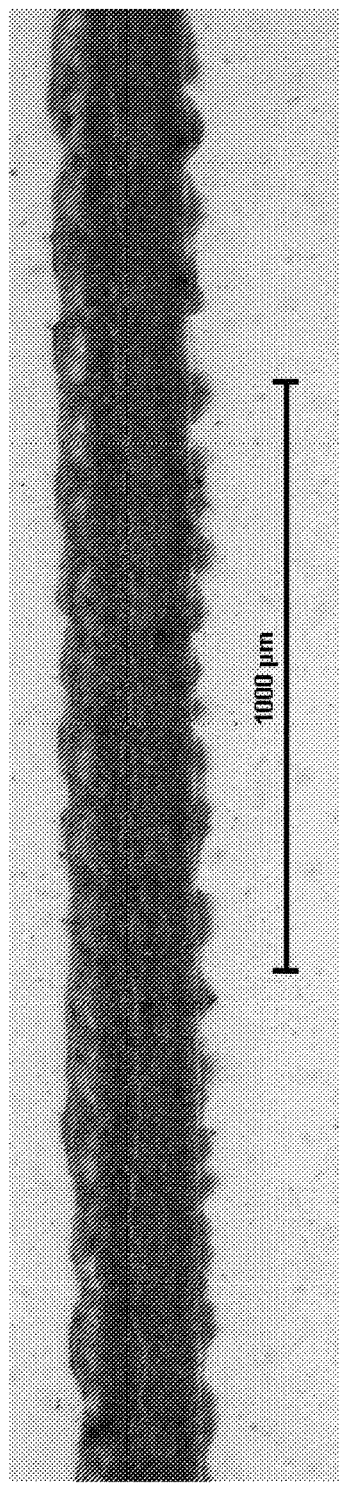
FIG. 21 shows a line formed by the inkjet printing of the formulation prepared in Example 1 herein, onto PET plastic after 30 passes (layers).
Figure 22:
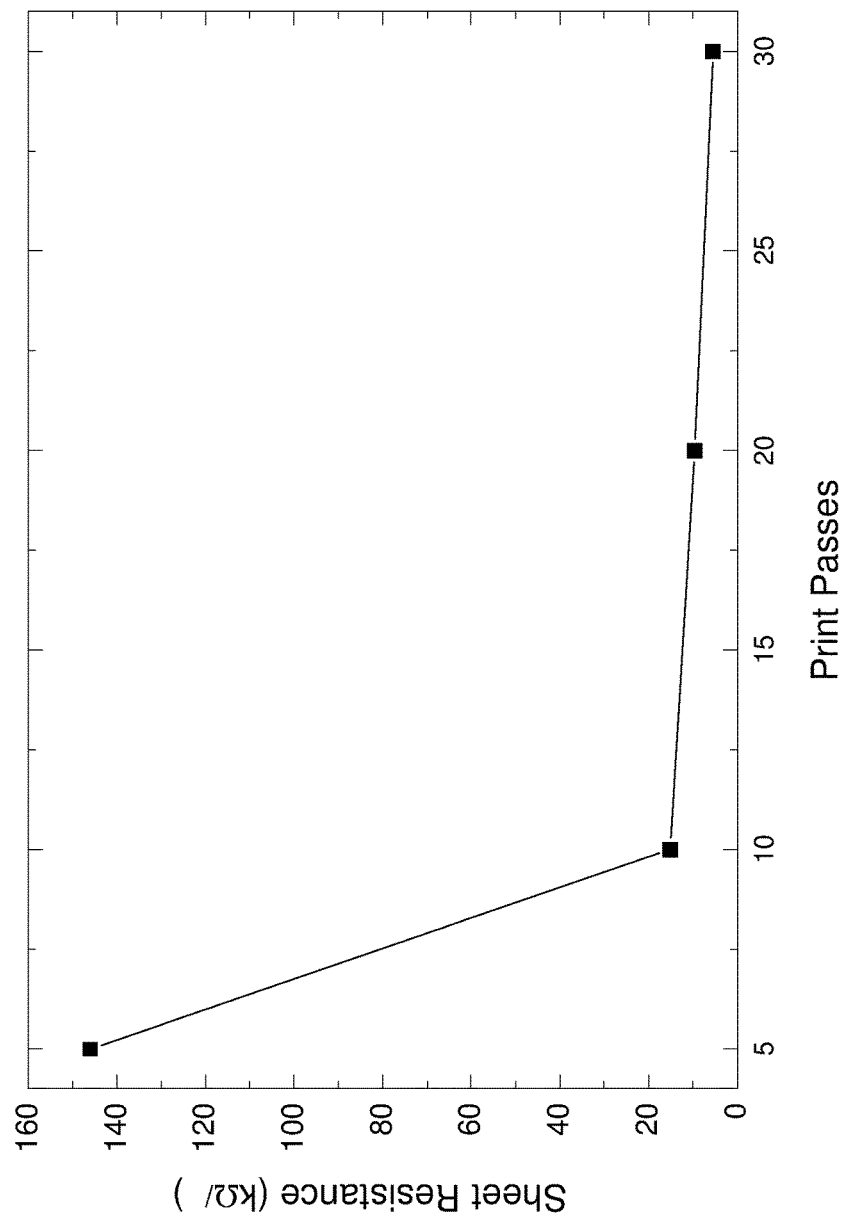
FIG. 22 shows the sheet resistance v. number of printing passes for the conductive lines printed on PET plastic after 5, 10, 20 and 30 passes (layers).

Sheet resistance and conductivity of some of the printed lines was determined using a Keithley 2400 sourcemeter using silver ink contacts of set dimensions to connect two wires across the printed lines to measure voltage as a function of current. FIG. 20 shows the sheet resistance as a function of number of printing passes.

Transparency of the lines was measured using a WiTEC Alpha 300 confocal microscope illuminating the sample with a 514.5 nm laser with ~1 μm spot size. A Thorlabs PM100D powermeter was used to collect power measurements as the laser was mapped across the substrate.

While specific embodiments of the invention have been described herein for the purpose of reference and illustration, various modifications will be apparent to a person skilled in the art without departing from the scope of the invention as defined by the appended claims.

Example 2—h-BN Dispersions

The following quantities of reagents were added to a glass vial:

$H_2O$—9.0 g;
Propylene glycol—1.0 g;
Triton-x100—0.6 mg;
h-BN powder (~1 μm)—30 mg
1-pyrenesulfonic acid sodium salt—10 mg.

The inkjet formulation was prepared using the quantities of reagents detailed above, by means of the following steps:
1) The glass vial was then stoppered and placed into a 600 W bath sonicator for 48 hours.
2) The solution was then centrifuged at 3500 rpm (903 g) for 20 mins and the top ⅔ collected.
3) The collected solution was then centrifuged at 15000 rpm (16602 g) for 20 mins and the supernatant collected and combined before UV-Vis was conducted using a Cary 5000 UV-Vis-Near IR spectrometer to determine the concentration of PS1 in the supernatant.
4) The sediment was gently re-dispersed via shaking in a solvent comprising of $H_2O$ (90% by weight), propylene glycol (10% by weight) and Triton-x100 ($6\times10^{-3}$% by weight).
5) Steps 3) and 4) were repeated until less than 0.05 mg/mL PS1 was present in the supernatant. When the supernatant was recovered which contained less than 0.05 mg/mL PS1, the sediment was re-dispersed as in step 4) with a minimal quantity of solvent and collected.
6) UV/Vis was then conducted from 800-200 nm using a Cary 5000 UV-Vis-Near IR spectrometer with the absorption coefficient $\alpha_{550}=1000$ L $g^{-1}$ $m^{-1}$ to determine h-BN concentration.

Figure 24:
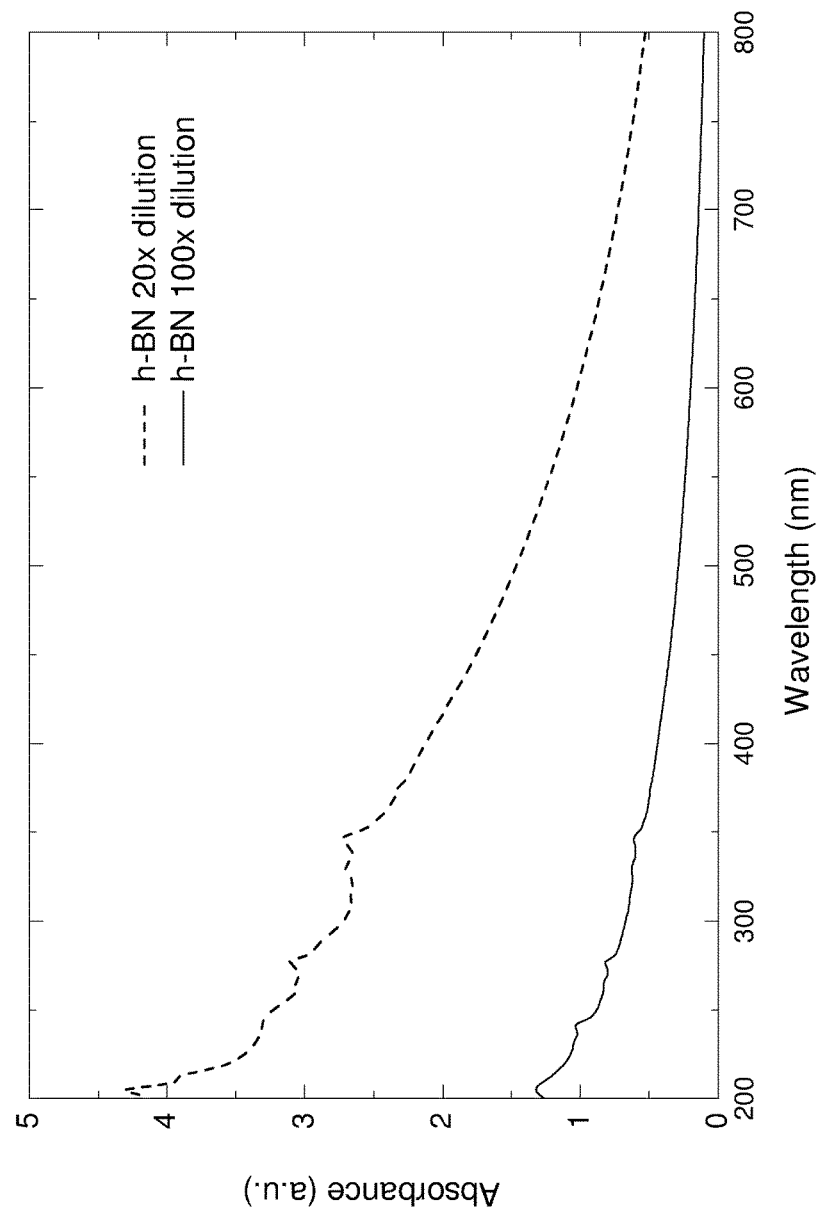
FIG. 24 shows the UV-Vis spectra of a 2.4 mg/mL h-BN dispersion diluted 20× and 100×.

Using this technique, a formulation containing 2.4 mg/mL of h-BN nanoparticles was prepared (FIG. 24).

The surface tension of the formulation was measured to be <40 mN/m using a KRUSS DSA-100 recording the pendant drop profile.

The combined supernatant collected in step 3 was reused to generate more ink formulations with same quantities of regents as detailed above used (albeit PS1). The mass of PS1 required to obtain the initial dispersion concentration was added before the new dispersion with re-used PS1 was used in step 1 above.

Example 3—MoS₂ Dispersions

The following quantities of reagents were added to a glass vial:

$H_2O$—9.0 g;
Propylene glycol—1.0 g;
Triton-x100—0.6 mg;
$MoS_2$ powder (<2 μm, 99%)—30 mg;
1-pyrenesulfonic acid sodium salt—10 mg.

The inkjet formulation was prepared using the quantities of reagents detailed above, by means of the following steps:
1) The glass vial was then stoppered and placed into a 600 W bath sonicator for 48 hours.
2) The solution was then centrifuged at 3500 rpm (903 g) for 20 mins and the top ⅔ collected.
3) The collected solution was then centrifuged at 15000 rpm (16602 g) for 20 mins and the supernatant collected and combined before UV-Vis was conducted using a Cary 5000 UV-Vis-Near IR spectrometer to determine the concentration of 1-pyrenesulfonic acid sodium salt (PS1) in the supernatant.
4) The sediment was gently re-dispersed via shaking in a solvent comprising of $H_2O$ (90% by weight), propylene glycol (10% by weight) and Triton-x100 ($6\times10^{-3}$% by weight).
5) Steps 2) and 3) were repeated until less than 0.05 mg/mL PS1 was present in the supernatant. When the supernatant was recovered which contained less than 0.05 mg/mL PS1, the sediment was re-dispersed as in step 4) with a minimal quantity of solvent and collected.
6) UV/Vis was then conducted from 800-200 nm using a Cary 5000 UV-Vis-Near IR spectrometer with the absorption coefficient $\alpha_{672}=3400$ L $g^{-1}$ $m^{-1}$ to determine $MoS_2$ concentration.

Figure 27:
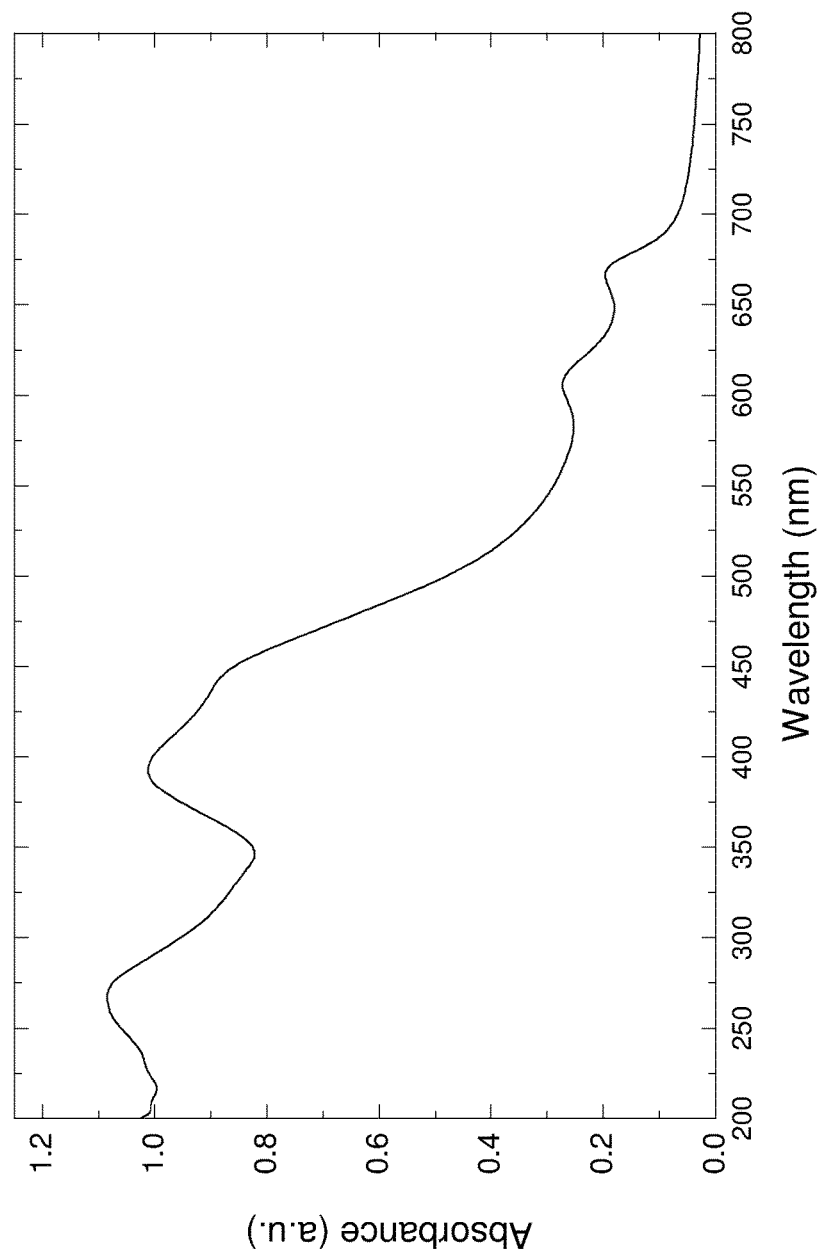
FIG. 27 shows the UV-Vis spectra of a $MoS_2$ dispersion diluted 150× after removal of excess PS1. Concentration is 0.83 g/L.

Using this technique, a formulation containing 0.83 mg/mL of $MoS_2$ nanoparticles was prepared (FIG. 27).

The surface tension of the formulation was measured to be <40 mN/m using a KRUSS DSA-100 recording the pendant drop profile.

Figure 25:
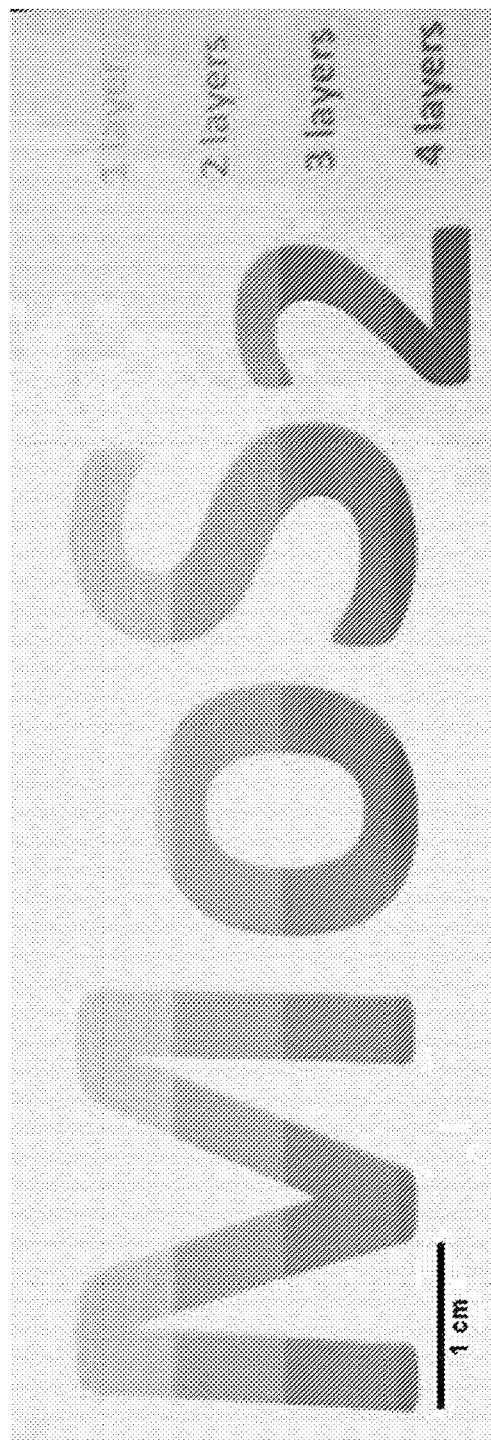
FIG. 25 is a digital photograph of 0.83 g/L $MoS_2$ ink printed onto PEL™ paper with 1-4 layers.

A Fujifilm Dimatix DMP-2800 printer was used to print the ink onto PEL paper, forming a pattern with the number of layers increasing from 1 to 4. (FIG. 25).

Figure 26:
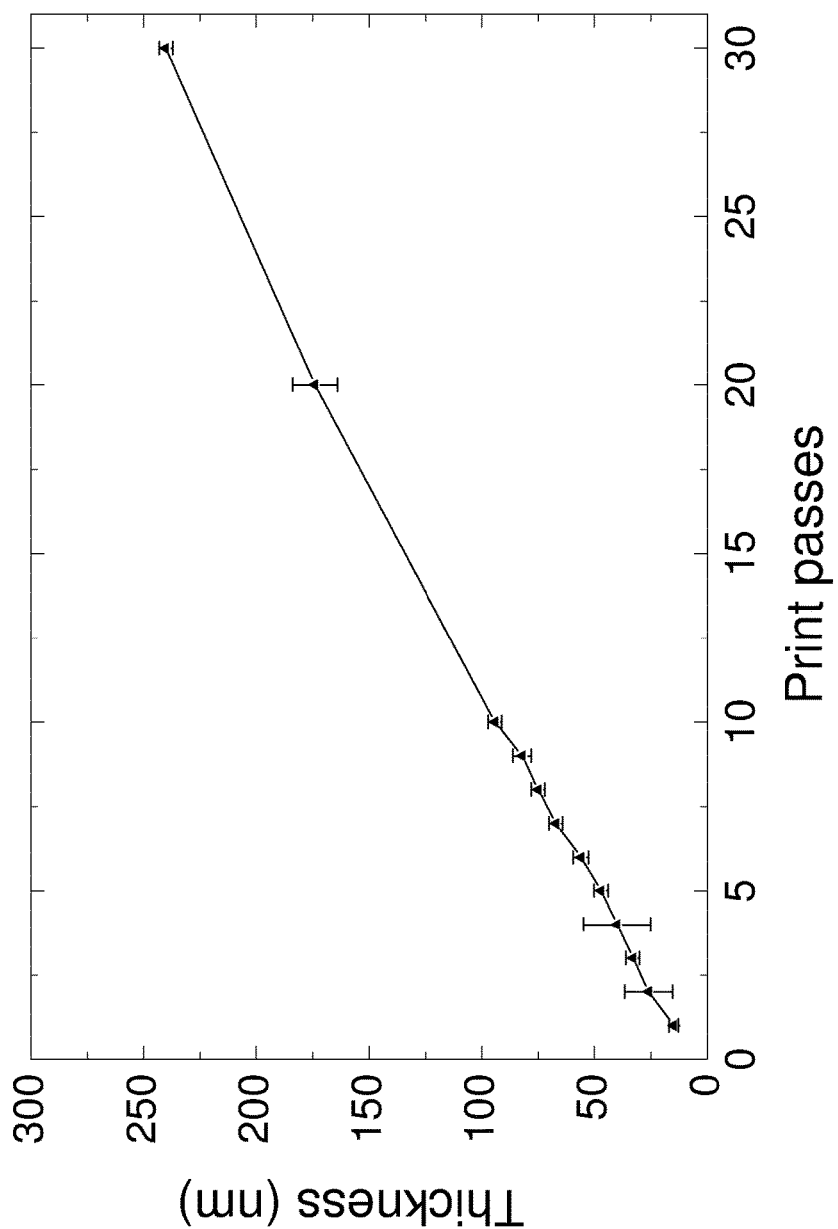
FIG. 26 shows thickness in nm v. number of printing passes for a 0.83 g/L $MoS_2$ ink printed onto $SiO_2$. Thickness measurements were obtained using a Veeco Dektak 8 stylus profiler.

A Fujifilm Dimatix DMP-2800 printer was used to print the ink onto $SiO_2$ forming lines 1 drop wide with 1, 2, 3, 4, 5, 6, 7, 8, 9, 10, 20 and 30 passes. A Veeco Dektak 8 was used to measure the profile of the lines with the line height as a function of number of passes shown in FIG. 26.

The combined supernatant collected in step 3 was reused to generate more ink formulations with same quantities of regents as detailed above used (albeit PS1). The mass of PS1 required to obtain the initial dispersion concentration was added before the new dispersion with re-used PS1 was used in step 1 above.

Example 4—Printed In-Plane Photodetector

Figure 28:
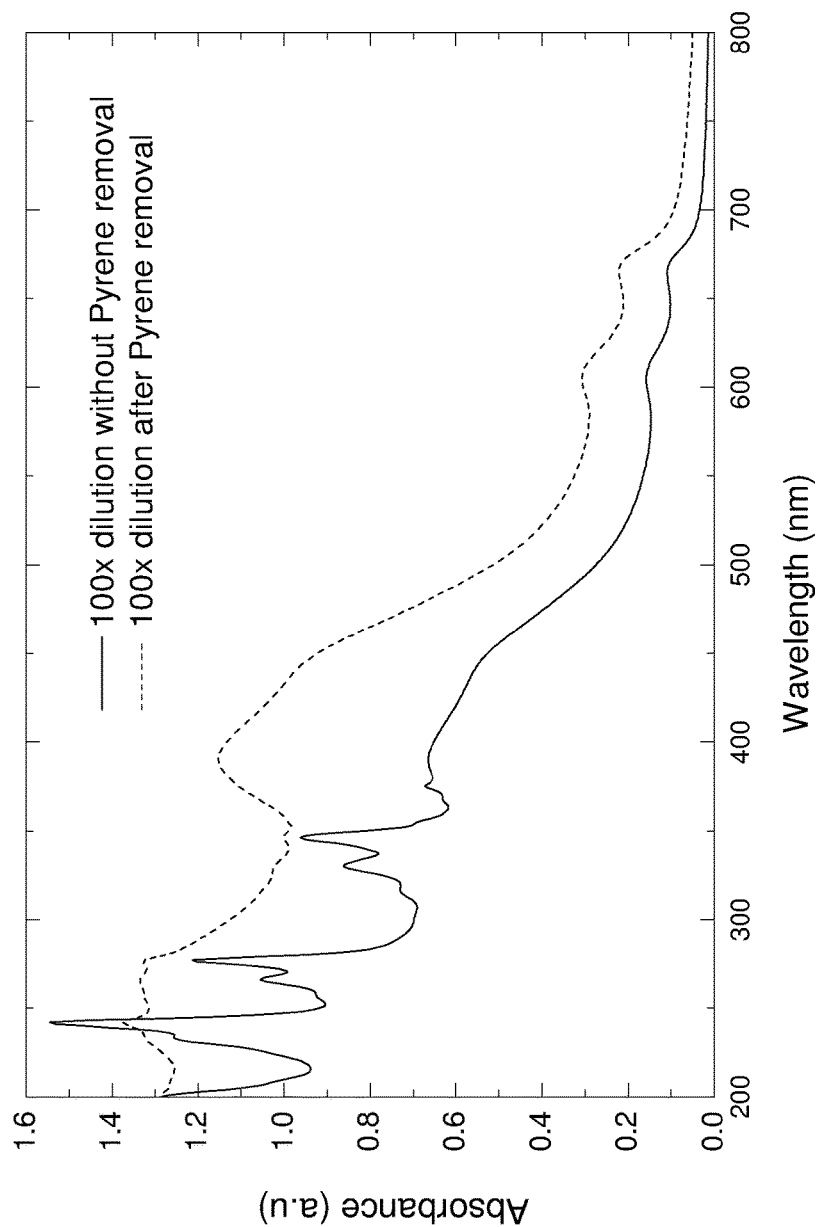
FIG. 28 shows UV-Vis spectra of $MoS_2$ dispersion diluted 100× before and after removal of residual PS1. Concentration of $MoS_2$ nanoplatelets is 0.29 g/L before PS1 removal and 0.6 g/L after PS1 removal.

A $MoS_2$ ink with concentration of 0.6 mg/mL was formulated using the method described in Example 3. The UV-Vis spectra of the $MoS_2$ ink before and after PS1 removal are shown in FIG. 28.

The $MoS_2$ ink was printed onto PEL paper using a Dimatix DMP-2800 inkjet printer to form a rectangle of dimensions 1×1.25 mm with 25 μm drop spacing and 30 print passes.

Figure 29:
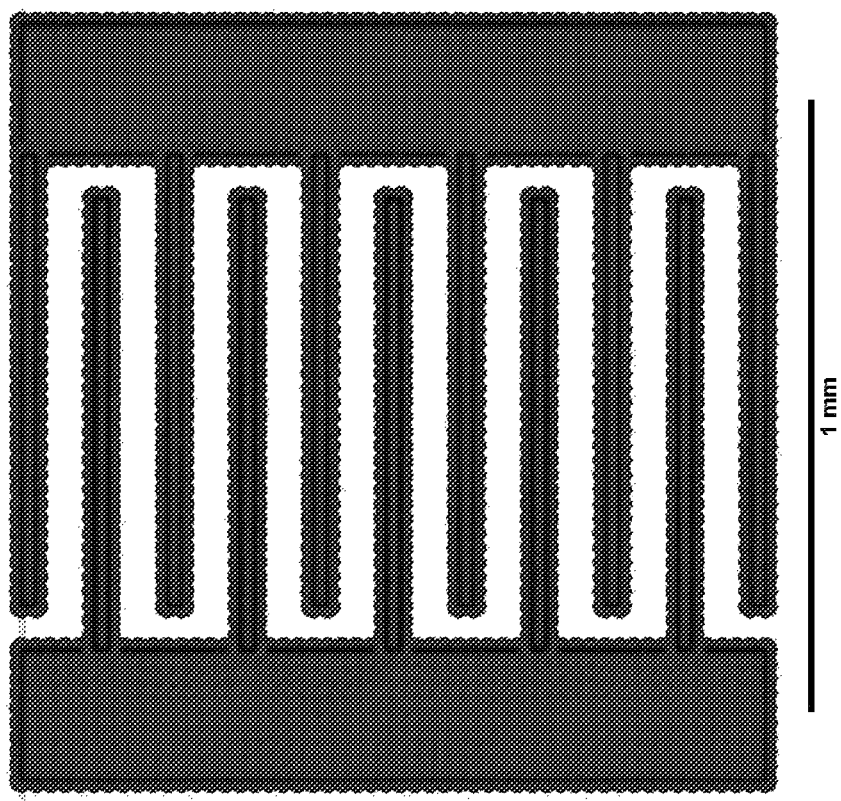
FIG. 29 shows the printing patter used to print 'comb' graphene electrodes. Drops are depicted as 45 µm.

A graphene ink with concentration of 0.6 mg/mL was made using the method described in Example 1 and used to print 'comb like' electrodes (FIG. 29) over the $MoS_2$ rectangle using 40 print passes and 25 μm drop spacing.

The resulting device was imaged using an optical microscope and found to have a small electrode spacing<50 μm. (FIG. 38)

The two graphene electrodes were connected to a Keithley 2400 Sourcemeter and a bias voltage of 60V placed across the device.

A laser with λ=514.5 nm and power density=0.2 mW/μm² was used to illuminate the device.

A photocurrent map of the highlighted area (FIG. 38) was collected using a WiTEC Alpha 300 confocal microscope connected to a Keithley 2182A voltmeter showing the device functioning as a photodetector.

Example 5—Further Studies and Inkjet Printed Heterostructures

Ink Preparation

The following quantities of reagents were added to a glass vial:
$H_2O$—9.0 g;
Propylene glycol—1.0 g;
Triton-x100—0.6 mg;
h-BN powder (~1 μm)—30 mg
1-pyrenesulfonic acid sodium salt—10 mg.
1) The glass vial was then stoppered and placed into a 600 W bath sonicator for 48 hours.
2) The solution was then centrifuged at 3500 rpm (903 g) for 20 mins and the top ⅔ collected.
3) The collected solution was then centrifuged at 15000 rpm (16602 g) for 20 mins and the supernatant collected and combined before UV-Vis was conducted using a Cary 5000 UV-Vis-Near IR spectrometer to determine the concentration of PS1 in the supernatant.
4) The sediment was gently re-dispersed via shaking in a solvent comprising of $H_2O$ (90% by weight), propylene glycol (10% by weight), Triton-x100 (6×10⁻³% by weight) and Xanthan gum (1×10⁻²% by weight).
Steps 3) and 4) were repeated until less than 0.05 mg/mL PS1 was present in the supernatant. When the supernatant was recovered which contained less than 0.05 mg/mL PS1, the sediment was re-dispersed as in step 4) with a minimal quantity of solvent and collected.

Characterisation of Inks

Figure 30:
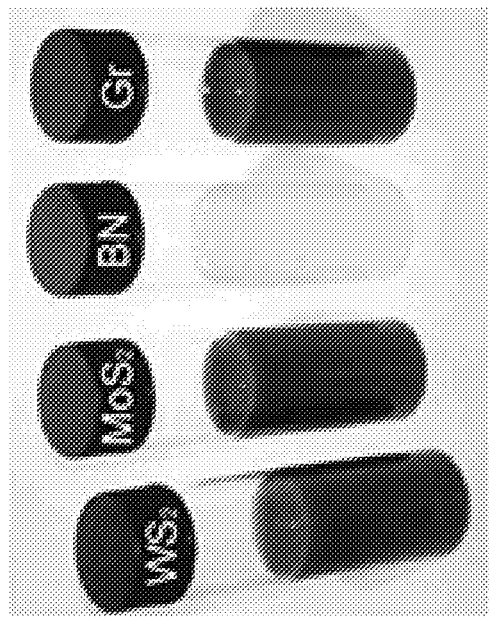
FIG. 30 shows an optical image of water-based and printable 2D-crystal inks.

FIG. 30 shows the optical picture of the various inks prepared according to the invention.

UV-Vis spectroscopy was performed in the 800-200 nm energy range using a carry 5000 UV-vis Near IR spectrometer. Concentrations were extracted using the following absorption coefficients: $\alpha_{660}$=2460 L g⁻¹ m⁻¹ for graphene, $\alpha_{629}$=2756 L g⁻¹ m⁻¹ for $WS_2$, $\alpha_{672}$=3400 L g⁻¹ m⁻¹ for $MoS_2$ and $\alpha_{550}$=1000 L g⁻¹ m⁻¹ for h-BN.

Dynamic viscosity (η), density (ρ) and surface tension (γ) were measured for all inks before printing. Contact angles (θ) were measured for all inks on a range of substrates such as $SiO_2$, polyimide, polyethylene terephthalate (PET) and quartz. The concentration of 2D material used in this work was shown to have a negligible effect on the ink rheology. Depending on the co-solvent used, the ink has surface tension between 37 and 41 mJ/m² and viscosity between 1.38 and 1.27 mPa·s, with density of ≈1 g/mL. This gives rise to Z values between 20 and 22.

FIG. 31 shows contact angle measurements of a graphene ink deposited on Silicon covered with a thin oxide layer (a), quartz (b) and PI film (c). The contact angle has been found to be ≈54°, ≈30° and ≈62° respectively.

Surface tensions and contact angles were measured with an Attension Theta Lite optical tensiometer using the Young-Laplace equation fitted to optical images as shown in FIG. 31. For the surface tension, a pendant drop was imaged and the following equation solved iteratively:

$$\gamma = \Delta\rho g \frac{R_0^2}{\beta}$$

Where Δρ is the difference in densities between the air and liquid, g is the acceleration due to gravity, $R_0$ is the radius of the drop curvature at the apex and β is a shape factor defined using the Young-Laplace equation. Dynamic viscosity was determined with a Brookfield DV-II+ Pro viscometer with spindle 3 at 100 rpm over a range of temperatures.

Figure 32:
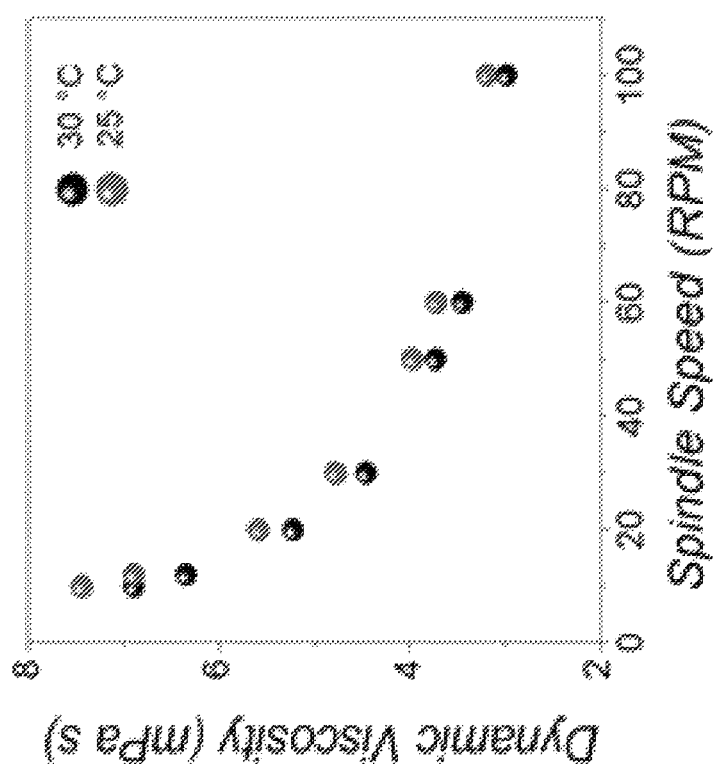
FIG. 32 shows the change in dynamic viscosity (q) observed for graphene ink containing 0.1 mg/mL XG at 25° C. and 30° C.

It is seen that the addition of xanthan gum has a negligible effect on the surface tension and contact angle for all inks. The resultant increase in viscosity decreases Z; however the shear rate of the piezoelectric ejection mechanism of the ink cartridge can be >50,000 s⁻¹. The shear-thinning effect of Xanthan gum makes it difficult to determine the ink viscosity on ejection, which makes it difficult to calculate Z for inks containing Xanthan gum, FIG. 32.

Figure 33:
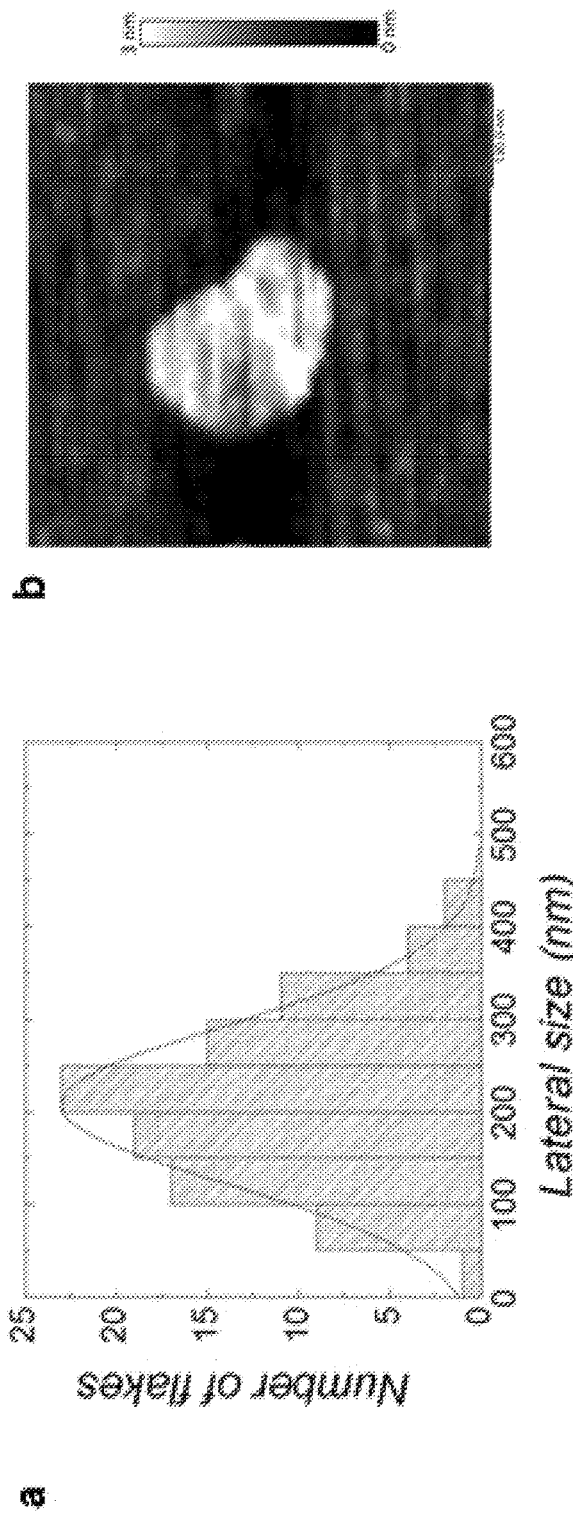
FIG. 33 shows AFM analysis of the nanosheets. a) Size distribution in lateral size obtained by measuring 100 flakes. b) AFM height image of one of the flakes.

The lateral size of the nanosheets is very important in inkjet printing. For small spheres in water, the settling velocity (w) is given by Stokes' law:

$$w = \frac{2(\rho_p - \rho_f)gr^2}{9\eta}$$

where $\rho_p$ is the particle density, $\rho_f$ is the fluid density, g is the acceleration due to gravity, r is the particle radius and η is the fluid viscosity. Although the nanosheets will not have a constant radius when settling, averaging all possible orientations would give a radius of gyration which will reduce as the sheets become smaller. As the settling velocity scales with r², nanosheets which have a smaller radius of gyration will help prolong the ink lifetime and reduce nozzle blockages. The sheets should be less than 1/20 the diameter of the nozzle to avoid any nozzle blockages or stray drops during printing, with 1/50 or less the nozzle diameter preferred. For the particular printer used in this experiment, this gives an optimum maximum flake diameter of ≈400 nm or less for the Dimatix DMP-2800 using a 10 pL cartridge. Detailed analysis of the lateral size of the dispersed flakes was performed by atomic force microscopy (Bruker Dimension V in tapping mode), FIG. 33.

X-ray photoelectron spectroscopy was conducted on membranes formed using the inks to determine the weight percent PS1 non-covalently bound to the flakes. FIGS. 46, 47, 48 and 53 show the XPS spectra for graphene, $MoS_2$, $WS_2$ and h-BN inks respectively. The sulphur peak for PS1~168 eV was used to calculate the PS1 concentration. The highest weight percent PS1 was observed for graphene ink (9.13 WT %), decreasing for $MoS_2$ (8.37 WT %), $WS_2$ (3.14 WT %) and h-BN (2.34 WT %).

Printing

In order for conductive lines to be printed, droplets must coalesce on the substrate surface to form uniform lines. Therefore the droplet spacing, parameter that affects the continuity, width and thickness of printed features, needs to be carefully optimized. The maximum droplet spacing required for coalescence ($p_{max}$) can be calculated using the equation:

$$p_{max} = \frac{2\pi d_0}{3\beta_{eqm}^2 \left( \frac{\theta_{eqm}}{\sin^2\theta_{eqm}} - \frac{\cos\theta_{eqm}}{\sin\theta_{eqm}} \right)}$$

where $d_0$ is the initial droplet diameter, $\beta_{eqm}$ is the diameter of the spherical cap of a droplet on the substrate and $\theta_{eqm}$ is the equilibrium droplet contact angle.

If the drop spacing is too small, bulges in the contact line and non-uniform distribution of material occurs. If the drop spacing is too large, no coalescence will occur. For our inks, the optimal drop spacing on silicon was found to be 40 μm, with no substrate or cartridge heating required. On glass and Polyethylene terephthalate (PET), the drop spacing was increased to 45 μm as a result of the decrease in contact angle from ≈54° for SiO$_2$ to ≈30° and 34° for glass and PET respectively. The high stability of the ink allows for precise printing to be conducted over large areas with multiple printing passes.

Figure 34:
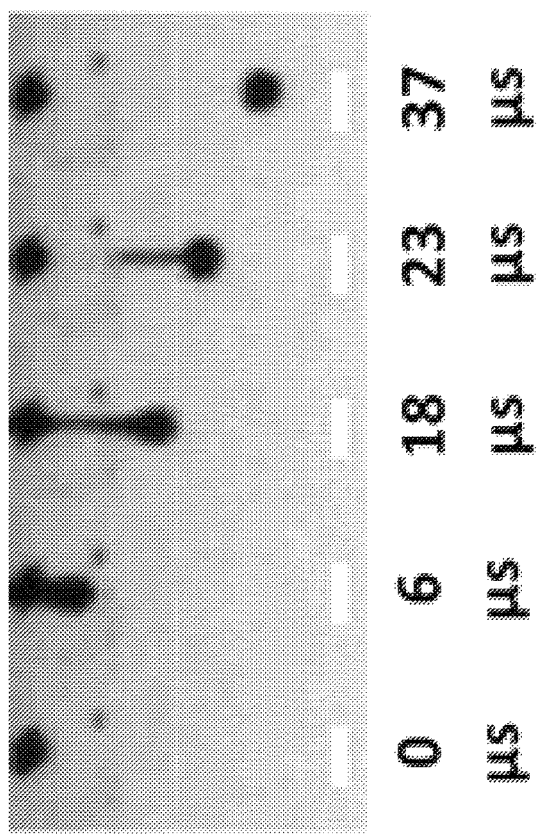
FIG. 34 shows the optical image of the graphene droplet formation with XG added as binder showing filament tail formation and retracting into the main droplet. Scale bars are 50 µm.

It is noted that any modification in the inks chemistry affects the stability and printability of the ink: for these formulations, a binder (xanthan gum, XG) was added to produce inks suitable for multiple-stack fabrication. XG gives rise to a small tail on ejection of the ink from the nozzle which re-joins with the main drop without forming a satellite drop, so the ink is still printable (FIG. 34).

Using a Dimatix DMP-2800 inkjet printer (Fujifilm Dimatix, Inc., Santa Clara, USA), it was possible to create and define patterns over an area of about 200×300 mm and handle substrates up to 25 mm thick being adjustable in the Z direction. The nozzle plate consists of a single row of 16 nozzles of 21 μm diameter spaced 254 μm apart with typical drop volume of 10 pL. FIG. 35 shows a variety of patterns printed using inks of the present invention. No pre-treatment of the substrates was performed, and all printing was performed under ambient conditions. FIG. 36 shows sheet resistance data for graphene inks printed on silicon and paper. It is seen that the sheet resistance $R_s$ decreases rapidly until the percolation threshold is reached, at which point the graphene behaves like a bulk material, with only small changes in sheet resistance resulting from each subsequent printing pass. $R_s$ values range between ~10 MΩ/☐ and ~1 kΩ/☐, which are comparable with literature results obtained for other types of printable graphene inks.

Raman spectroscopy was performed with a Renishaw inVia equipped with excitation line of 514 nm. FIG. 37 shows the Raman spectra measured on the printed films with increasing thickness (measured in number of printing passes). No changes were observed in the 2D peak shape for increasing thickness, in contrast to results obtained for NMP-based graphene. This could be due to lack of coffee ring and higher concentration of our inks, which make one pass printed line already uniform. The 2D peak shape is clearly different from thick graphitic flakes (>10 layers) confirming the efficiency of our exfoliation method.

Devices

This work focused on photo-detectors to demonstrate that the present inks can be used for both in-plane and vertical devices. Here, graphene is used as electrode and a transition metal dichalcogenide is used as photo-active material. Both MoS$_2$ and WS$_2$ have been tested.

In-Plane Device

A MoS$_2$/Gr in-plane photodetector was printed on PEL P60. The printed photodetector consists of a printed interdigitated electrodes separated array made of graphene with a printed MoS$_2$ channel of 40 μm, FIG. 38a. FIG. 38b shows the photocurrent map measured by scanning an area of ≈200 μm×200 μm with a 514.5 nm laser and a power density of 0.2 mW/μm$^2$. A current of ≈1 nA has been generated using a bias voltage ($V_b$) of 10 V and a laser power of 40 mW/cm$^2$ at 488 nm, FIG. 38c. FIG. 38c also shows the photocurrent measured by switching on and off the laser light every second for 20 seconds, confirming that the signal is stable. Note that no thermal annealing was used to fabricate the device.

I-V curves (FIG. 39) show non-linear behaviour due to the high contact resistance of MoS$_2$ and the insulating substrate which results in a build-up of charge at the electrodes. Note that the electrode spacing was ≈40 μm—no smaller gap could be achieved using the printing equipment as the electrode spacing became equivalent to one drop in width.

The use of a xanthan gum binder facilitated the preparation of a printed heterostructure, i.e. a multi-stack layer. Xanthan gum is particularly suited because it is soluble in water and provides the dual benefits of acting as a binder and requiring a low concentration to increase the viscosity (the binder must be used in low concentration in order to retain the inks electrical performance). The addition of the binder produces inks with non-Newtonian viscosity, i.e. an ink with shear-thinning properties, which helps forming uniform lines as the viscosity increases substantially after the droplets are deposited on the surface. A major advantage of xanthan gum over other binders is its biocompatibility Vertical Devices A heterostructure-based photodetector was fabricated onto Si/SiO$_2$ by printing a first graphene line of ≈50 nm thickness at 50° C. with a drop spacing of 40 μm. This acts as bottom graphene electrode (Gr$_B$). A WS$_2$ square with ~100 nm thickness, acting as photo-active element, was then printed across the graphene line and finally a second graphene line (~50 nm thickness) was printed perpendicularly to the first, acting as top graphene electrode (Gr$_T$). The schematic of the Gr$_B$/WS$_2$/Gr$_T$ heterostructure is shown in FIG. 40a. FIG. 40b (left panel) shows an optical picture of an array of 16 heterostructures on an area of 1 cm×1 cm on silicon. FIG. 40b (right panel) shows a high magnification optical picture of one of the heterostructures. FIG. 43b shows the same heterostructure array printed on plastic. Raman mapping at 488 nm excitation wavelength was performed on the dotted red square (≈500 μm×500 μm) in FIG. 40b (right panel). FIGS. 40c and d show the Raman maps of the intensity of the 2D peak of graphene and the A$_{1g}$ peak of WS$_2$, respectively. This figure shows that the material has been deposited uniformly.

After printing was completed, the sample was annealed under N$_2$ atmosphere at 300° C. for 1 hour to remove residual moisture. The non-linear I-V curve, FIG. 40e, confirms that multi-stacking layers were formed, with no bias voltages required for photocurrent response. Photocurrent mapping, inset FIG. 40f, shows uniform photocurrent response in the overlap region between the two graphene electrodes and the WS$_2$ square. The quantum efficiency of the printed devices is comparable with other heterostructures fabricated from inks using non-scalable methods. FIG. 40f also shows that the photocurrent linearly increases with power, saturating for laser powers above ~0.5 mW. It was found that 12 over a total of 16 heterostructures generate similar photocurrent, giving a yield of ~75%.

FIG. 41 shows the I-V curve of a Gr$_B$/WS$_2$/Gr$_T$ heterostructure printed onto SiO$_2$ (FIG. 40b). As expected the curve shows non-ohmic behaviour, showing two different regimes depending on the bias voltage V: a low voltage (between −1 V and 1 V) a non-linear characteristic is observed, while at high voltage the I-V curve is linear. This is in contrast to the ohmic nature of Gr$_B$ and Gr$_T$ when measured across the device, FIG. 41c, indicating no mixing of layers is occurring when the next layer is printed. The generation of photocurrent when $V_b$=0 also indicates the formation of a multi-stack device. A photocurrent of ≈0.7 nA was observed when a 488 nm laser was used to repeatedly illuminate the sample over 30 s (FIG. 41b). FIGS. 45d and e show photocurrent maps obtained at $V_b$=50 mV and 25 mV, respectively. The generation of photocurrent is only observed in the approximate overlap region (denoted by dotted white lines). The apparent change in the region in which photocurrent is observed (FIGS. 41d and e) is due to the photocurrent produced in the outer regions getting closer to 0 nA when $V_b$ is reduced. However, there is still a small amount of photocurrent produced; with the region outside the dotted lines the only to show no photocurrent generation. This is a further confirmation that re-dispersion does not occur with inks of the invention.

The roughness of the interface was determined using AFM (Bruker Dimension V in tapping mode with a Pointprobe-Plus Silicon-SPM-Sensor tip). Three 10×10 μm scans were conducted on separate device areas giving an average roughness ($R_a$) of 20±0.7 nm and a root mean squared roughness ($R_{RMS}$) of 26±0.7 nm (FIG. 42) using Bruker Nanoscope Analysis.

In order to establish whether the Xanthan gum binder was phase-separating out during ink drying and forming a dielectric layer between $Gr_B$ and $Gr_T$, the same $Gr_B/WS_2/Gr_T$ device was printed without the $WS_2$ photoactive layer. All conditions were kept the same; including delaying the printing of the $Gr_T$ layer for the same length of time it would take to print the $WS_2$ layer. I-V measurements were conducted across all lines and were found to exhibit ohmic behaviour, FIG. 44.

It is remarked that that heterostructures are based on physical principles that are completely different from in-plane devices: they allow for more flexibility, lower contact resistance and a higher degree of functionality, compared with traditional printed devices. As inkjet printing is extremely attractive for fabrication on flexible substrates, an array of 20 $Gr_B/WS_2/Gr_T$ heterostructures were printed onto PET film on an area of 2 cm×2 cm, Inset in FIG. 43b. The I-V curves in FIG. 43a shows non ohmic behaviour, as with the device made on silicon (FIG. 43b). FIG. 43b shows that photo-current saturation was not reached up to ~3 mW. Bending test shows that photocurrent is stable at least up to ≈2.25% strain (FIG. 43c), in agreement with previous results reported for heterostructures made by inks and micro-mechanically exfoliated flakes.

A transparency map was conducted on a 180 μm² area of a $Gr_B/WS_2/Gr_T$ heterostructure printed onto polyimide (PI) using a WiTEC Alpha 300 confocal Raman spectrometer equipped with 488 nm excitation wavelength. FIG. 45 a shows the optical picture of the heterostructure and the red square indicates the area where the absorption was measured. The transparency map showed strongest (~67%) absorbance in the overlapped area between all three printed layers, with transparency decreasing as the number of printed layers decreases. PI absorbance was taken as the reference for 0%.

Arrays of $Gr_B$-$WS_2$-$Gr_T$ heterostructure photodetector devices were printed onto a glass substrate before being connected in both parallel and series configurations without any annealing step. Using a white light source with power density 395 mW/cm², the device arrays were illuminated whilst wired in series and parallel configurations. When wired in parallel, an increase in short circuit current ($I_{SC}$) (FIG. 50) and responsivity (FIG. 52) was observed with increasing number of photodetectors. When wired in series, an increase in open circuit voltage ($V_{OC}$) (FIG. 51) was observed for increasing numbers of photodetectors. FIG. 53 highlights an example IV curve with the inset showing $V_{OC}$ and $I_{SC}$ generated by illumination.

Toxicity

Materials and Methods

Cell Culture.

Epithelial lung carcinoma cells (A549, ATCC, CCL-185) were maintained and passaged in Nutrient Mix F12 Ham media (Sigma-Aldrich, UK) supplemented with 10% FBS (Thermo Scientific, UK), 50 μg/mL Penicillin, 50 μg/mL Streptomycin (Sigma-Aldrich, UK) at 37° C. in 5% $CO_2$. Cells were passaged twice a week using Trypsin-EDTA 0.05% (Sigma-Aldrich, UK) when reached 80% confluence. Activity of trypsin was stopped using 10% FBS. Human keratinocyte cells (HaCaT) were generously provided by Dr Suzanne Pilkington (Dermatological Sciences, Institute of Inflammation and Repair, University of Manchester) and were maintained in DMEM media (Sigma-Aldrich, UK) supplemented with 10% FBS, 50 μg/mL Penicillin, 50 μg/mL Streptomycin at 37° C. in 5% $CO_2$. Cells were passaged twice a week using Trypsin-EDTA 0.05% at 80% confluence. Activity of trypsin was stopped using 10% FBS.

Cell Culture Treatment.

Depending on the experiment, cells were seeded in 96 (LDH assay) or 12 (FACS analysis) well plates (Costar, Sigma) and treated when reached 70-80% confluence. All treatments were performed in the cell culture medium in the absence of FBS, 10% FBS was added to each well 4 h after the treatment. h-BN (1.6 mg/mL), Graphene (5.84 mg/mL), $MoS_2$ (1.44 mg/mL) and $WS_2$ (0.5 mg/mL) were vortexed shortly before making final dilutions for the treatment in the corresponding cell culture media. Cells were exposed to 12.5-25-50-100 μg/mL h-BN, Graphene, $MoS_2$ or $WS_2$ material for 24 h. Solvent (containing 0.06 mg/mL Triton x-100) used to stabilize the inks was also tested for its toxicity using the following concentrations: 0.012-0.006-0.003-0.0015 mg/ml Triton x-100 corresponding to the 100-50-25-12.5 μg/mL $WS_2$ inks.

Annexin V-Alexa Fluor®488 Conjugate/PI Assay.

After 24 h of treatment at indicated concentrations, supernatants were collected and cells were gently washed 3 times with PBS $Ca^{2+}/Mg^{2+}$ (Sigma-Aldrich, UK). Annexin-V staining was performed according to the instructions of the manufacturer (Thermo Fisher Scientific, UK). In brief, cells were trypsinized and merged with corresponding supernatants, centrifuged at 1500 rpm for 5 min, then re-suspended in 100 μL Annexin binding buffer (Thermo Fisher Scientific, UK) and stained with 2 μL Annexin V-Alexa Fluor®488 conjugate for 20 min at 15-25° C. Propidium Iodide (1 mg/mL, Sigma) was added shortly before the analysis to the final concentration of 1.5 μg/mL. 10 000 cells were analysed on a BD FACSVerse™ flow cytometer using 488 nm excitation and 515 nm and 615 nm band pass filters for Annexin V and PI detection, respectively. Electronic compensation of the instrument was performed to exclude overlapping of the two emission spectra. Material alone was run in order to set up the gates including the cell population for the analysis. Percentage of unstained, cells stained with Annexin V, PI or both was calculated.

Modified LDH Assay.

LDH assay was modified to avoid any interference coming from the interactions of the material with assay. Briefly, the LDH content was assessed in intact cells that survived the treatment, instead of detecting the amount of LDH released in the media upon treatment. Media was aspirated and cells were lysed with 100 μL of lysis buffer for 45 min at 37° C. to obtain cell lysate, which was then centrifuged at 4,000 rpm for 20 min in order to pellet down the material.

50 µL of the supernatant of the cell lysate was mixed with 50 µL of LDH substrate mix (Promega, UK) in a new 96-well plate and incubated for 15 min at room temperature, after which 50 µL stop solution was added.

$$\text{Cell Survival \%} = (\alpha_{490\,nm} \text{ of treated cells}/\alpha_{490\,nm} \text{ of untreated cells}) \times 100$$

The absorbance was read at 490 nm using a plate reader. The amount of LDH detected represented the number of cells that survived the treatment. The percentage cell survival was calculated using the equation above.

Results and Discussion

The potential adoption of those 2D-crystal inks in displays, smart packaging and textiles, printed biological, chemical, environmental sensors as well as energy devices, to give some examples, requires early determination of risk associated with exposure of living organisms. Furthermore, graphene is a remarkable material for biomedical applications. To offer an initial indication of the biocompatibility profile of these water-based inks, a series of cytotoxicity studies were conducted. The study focused on the response to dose-escalated ink exposure using cell culture models representative of the human tissues that consist primary physiological barriers in non-occupational (e.g. skin exposure of consumers) and occupational (e.g. pulmonary exposure of workers production lines of such materials) scenarios. The viability of human lung (human alveolar epithelial cells; A549) and skin (human keratinocytes; HaCaT) cells was assessed using two assays: the modified LDH assay—a colorimetric assay used to evaluate cellular membrane damage induced by the material; and PI/Annexin V staining used to distinguish cell viability by flow cytometry (FACS).

The modified LDH assay was developed to avoid potential interferences that are often reported as a result of interfering interactions between nanomaterials and reagents in colorimetric assays 41. No differences in cell survival after 24 hr of treatment with increased doses of the 2D inks were observed compared to untreated cells (FIG. 54a). The LDH assay data was validated using FACS (FIGS. 54b and c) by staining with cellular markers of apoptosis (Annexin V) and necrosis (Propidium Iodide). Cells exhibiting different responses to 2D ink exposure were gated according to: healthy (unlabeled) cells (P2), early apoptotic (P3), late apoptotic and/or necrotic (P4) and necrotic cells (P5). Even at the highest dose of 100 µg/mL, cells appeared unstained, indicating the presence of predominantly alive cells (more than 90% of counted cells appeared in this region; FIG. 55). Overall, no significant cytotoxic responses compared to untreated cells were observed for all doses (FIG. 55). Optical microscopy of the 2D ink-treated cell cultures (50 µg/mL for 24 h, FIGS. 54 b and c) indicated strong interactions between the material and the cells that can lead to binding and internalization, to be further investigated in future studies. In the present work, no significant morphological changes indicative of cell death, such as decreased cellular confluence compared to the untreated cells; loss of cell/cell contact between neighbouring cells; contracted nuclei or multinucleated giant cells, were observed after treatment. Overall, the modified LDH, FACS and microscopy data all corroborated to indicate that the 2D material used did not induce any significant cytotoxic responses in the two cell lines and the dose-escalation regime studied here.

While specific embodiments of the invention have been described herein for the purpose of reference and illustration, various modifications will be apparent to a person skilled in the art without departing from the scope of the invention as defined by the appended claims.

The invention claimed is:

1. An ink formulation suitable for inkjet printing, the ink formulation comprising a plurality of nanosheets of an inorganic material in an aqueous vehicle, and wherein:
   (i) the inorganic material is selected from graphene, hexagonal boron nitride, bismuth strontium calcium copper oxide (BSCCO), transition metal dichalcogenides (TMDCs), $Sb_2Te_3$ $Bi_2Te_3$ and $MnO_2$;
   (ii) the nanosheets are associated with a stabilizer that renders the nanosheets dispersible within the aqueous vehicle;
   (iii) concentration of the nanosheets of inorganic material in the aqueous vehicle is within a range of 0.01 to 10 mg/ml; and
   (iv) the aqueous vehicle further comprises at least one surface tension modifier which comprises a water-soluble surfactant and at least one viscosity modifier which is a water miscible co-solvent;
   and wherein the ink formulation has a mass ratio of the inorganic material to the stabilizer that is greater than 5:1.

2. The ink formulation of claim 1, wherein the mass ratio of the inorganic material to the stabilizer is greater than 10:1.

3. The ink formulation of claim 1, wherein the formulation has a viscosity of 1 to 30 cPs.

4. The ink formulation of claim 3, wherein the formulation has a viscosity of 10 to 12 cPs.

5. The ink formulation of claim 1, wherein the formulation has a surface tension of 20 to 50 mN/m.

6. The ink formulation of claim 5, wherein the formulation has a surface tension of 28 to 45 mN/m.

7. The ink formulation of claim 1, wherein greater than 60% of the nanosheets comprise less than ten layers of the inorganic material.

8. The ink formulation of claim 7, wherein greater than 80% of the nanosheets comprise less than ten layers of the inorganic material.

9. The ink formulation of claim 1, wherein the nanosheets have length and width dimensions of 10 nm to 2 microns.

10. The ink formulation of claim 9, wherein the length and width dimensions of the nanosheets are 10 nm to 1 micron.

11. The ink formulation of claim 1, wherein greater than 75% of the nanosheets have a thickness of from 1 to 8 molecular layers.

12. The ink formulation of claim 1, wherein the nanosheets are present in the aqueous vehicle at a concentration of 1 to 10 mg/ml.

13. The ink formulation of claim 1, wherein water content of the formulation is from greater than or equal to 50 wt. % to less than or equal to 99.9 wt. % relative to total weight of the formulation.

14. The ink formulation of claim 1, wherein the stabilizer comprises a water soluble polycyclic aromatic compound.

15. The ink formulation of claim 14, wherein the polycyclic aromatic compound has a ring system comprising from 2 to 10 fused aromatic benzene rings, the ring system being substituted with from 1 to 6, from 1 to 4, from 2 to 8, or from 3 to 6 independently selected hydrophilic groups, each hydrophilic group consisting of less than 20 atoms.

16. The ink formulation of claim 14, wherein the polycyclic aromatic compound has a ring system which comprises from 2 to 8 or from 3 to 6 fused benzene rings, the ring system being substituted with from 1 to 4 independently selected hydrophilic groups, each hydrophilic group consisting of $SO_3H$, $SO_2H$, $B(OH)_2$, $CO_2H$, OH or $PO_3H$.

17. The ink formulation of claim 14, wherein the polycyclic aromatic compound is selected from the group consisting of:

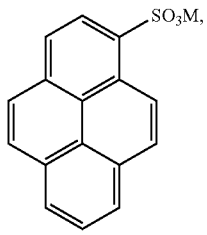
(PS1)

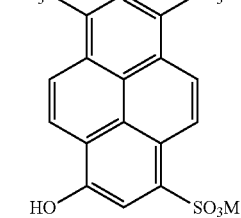
(PS2)

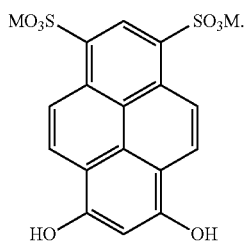
(PS3)

18. The ink formulation of claim 14, wherein the water soluble polyaromatic compound is present in an amount of from 0.05 to 2.0 g/L.

19. The ink formulation of claim 1, wherein the viscosity modifier is selected from the group consisting of ethylene glycol methyl ether, ethylene glycol, propylene glycol, 1-propanol, ethyl lactate, methyl ethyl ketone (MEK) and sulfolane.

20. The ink formulation of claim 19, wherein the viscosity modifier is ethylene glycol methyl ether, ethylene glycol or propylene glycol.

21. The ink formulation of claim 1, wherein the viscosity modifier is present in an amount of from 0.1 to 50 wt. %.

22. The ink formulation of claim 1, wherein the water-soluble surfactant is a non-ionic surfactant.

23. The ink formulation of claim 1, wherein the surface tension modifier is present in an amount of from 0.04 to 0.2 g/L.

24. The ink formulation of claim 1, wherein the inorganic material is selected from graphene, hexagonal boron nitride, and transition metal dichalcogenides (TMDCs).

25. The ink formulation of claim 1, wherein the inorganic material is graphene.

26. The ink formulation of claim 1, wherein the formulation comprises a binder.

27. The ink formulation of claim 26, wherein the binder is selected from a polysaccharide, polyvinylpyrrolidone and polyethylene glycol, or wherein the binder is xanthan gum.

28. A process for the preparation of an ink formulation suitable for inkjet printing, the ink formulation comprising a plurality of nanosheets of an inorganic material in an aqueous vehicle, wherein the nanosheets are associated with a stabilizer that renders the nanosheets dispersible within the aqueous vehicle and the aqueous vehicle further comprises at least one surface tension modifier and at least one viscosity modifier, and wherein the ink formulation has a mass ratio of the inorganic material to the stabilizer that is greater than 5:1, the process comprising:
  a) providing a source of an inorganic material in a first aqueous medium comprising a stabilizer;
  b) subjecting the source of the inorganic material in the first aqueous medium of a) to energy to break up or exfoliate the source of the inorganic material, thereby to obtain an aqueous dispersion of nanosheets of the inorganic material in the first aqueous medium;
  c) if the aqueous dispersion of nanosheets obtained in step b) above comprises residual source inorganic material that has not been converted into dispersed nanosheets, separating said residual source inorganic material from the aqueous dispersion;
  d) separating the dispersed nanosheets from the first aqueous medium following step b) or step c) and then redispersing the nanosheets in a second aqueous medium;
  e) separating the dispersed nanosheets from the second aqueous medium following step d) and then redispersing the nanosheets in a further aqueous medium one or more times;
  f) separating the nanosheets from the further aqueous medium subsequent to step (e) to obtain collected nanosheets; and
  g) re-dispersing the collected nanosheets of step (f) in an aqueous vehicle comprising at least one surface tension modifier and at least one viscosity modifier, thereby to form the ink formulation.

29. The process of claim 28, wherein step (g) comprises re-dispersing the collected nanosheets of step (f) in an aqueous vehicle comprising said at least one surface tension modifier, said at least one viscosity modifier, and further comprising at least one binder, thereby to form the ink formulation.

30. The process of claim 29, wherein the aqueous vehicle comprising said at least one surface tension modifier, said at least one viscosity modifier, and said at least one binder is prepared by dissolving the at least one stabilizer, the at least one viscosity modifier, the at least one surface tension modifier, and the at least one binder in water.

31. The process of claim 28, wherein the energy to which the source of the inorganic material in the first aqueous medium is subjected in step b) is ultrasonic energy.

32. The process of claim 28, wherein one or more of said steps d), e), and f) of separating the dispersed nanosheets from, respectively, the first, second, and further aqueous medium, comprises centrifugation of the dispersed nanosheets.

33. The process of claim 32, wherein the centrifugation is at a speed that is between 500 to 6000 rpm.

34. The process of claim 28 which further comprises subsequent to step (f) a step of redispersing the nanosheets in the further aqueous medium, one or more times, and separating said nanosheets from the further aqueous medium by centrifugation.

35. The process of claim 34, wherein the centrifugation is at a speed that is between 10000 to 20000 rpm.

36. An inkjet printing method, comprising transferring, depositing or jetting from an inkjet printer the ink formulation of claim 1 onto a substrate without physical contact between the inkjet printer and the substrate, to produce a film or track comprising the nanosheets of inorganic material.

37. The method of claim 36 wherein the substrate comprises a printed electronic device.

38. The method of claim 36 wherein the substrate comprises a printed biological device, biological media, a biological environment, or a substrate in contact with a human or animal body.

39. A film or track produced by the method of claim 36.

40. An electronic device or component comprising the film or track of claim 39.

41. An electronic system comprising one or more electronic devices or components of claim 40, wherein said electronic devices or components are connected together either in series or in parallel.

* * * * *